US009601415B2

(12) United States Patent
Makino

(10) Patent No.: US 9,601,415 B2
(45) Date of Patent: Mar. 21, 2017

(54) METHOD OF MANUFACTURING SEMICONDUCTOR DEVICE AND SEMICONDUCTOR DEVICE

(71) Applicant: Renesas Electronics Corporation, Kanagawa (JP)

(72) Inventor: Yasutomo Makino, Gunma (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 81 days.

(21) Appl. No.: 14/423,865

(22) PCT Filed: Mar. 27, 2014

(86) PCT No.: PCT/JP2014/058815
§ 371 (c)(1),
(2) Date: Feb. 25, 2015

(87) PCT Pub. No.: WO2015/145651
PCT Pub. Date: Oct. 1, 2015

(65) Prior Publication Data

US 2016/0254214 A1 Sep. 1, 2016

(51) Int. Cl.
*H01L 23/495* (2006.01)
*H01L 21/44* (2006.01)
(Continued)

(52) U.S. Cl.
CPC .... *H01L 23/49541* (2013.01); *H01L 21/2885* (2013.01); *H01L 21/4835* (2013.01);
(Continued)

(58) Field of Classification Search
CPC ............. H01L 21/2885; H01L 21/4835; H01L 23/49541; H01L 23/49575;
(Continued)

(56) References Cited

U.S. PATENT DOCUMENTS

| | | | | |
|---|---|---|---|---|
| 6,608,366 | B1 | 8/2003 | Fogelson et al. | |
| 6,713,849 | B2 * | 3/2004 | Hasebe ............... | H01L 23/3107 257/667 |

(Continued)

FOREIGN PATENT DOCUMENTS

| | | |
|---|---|---|
| JP | 2000294719 | 10/2000 |
| JP | 2005019240 | 1/2005 |

(Continued)

OTHER PUBLICATIONS

International Search Report in PCT/JP2014/058815, dated Jun. 24, 2014.

*Primary Examiner* — Nitin Parekh
(74) *Attorney, Agent, or Firm* — Mattingly & Malur, PC

(57) ABSTRACT

In a method of manufacturing a semiconductor device according to an embodiment, a lead frame is provided, the lead frame having a trench part formed thereon so as to communicate bottom surfaces of a first lead and a second lead, which are coupled to each other between device regions adjacent to each other. Then, after a part of a coupling part between the first and second leads is cut by using a first blade, metal wastes formed inside the trench part are removed. Then, after the metal wastes are removed, a metal film is formed on exposed surfaces of the first and second leads by a plating method, and then, a remaining part of the coupling part between the first and second leads is cut by using a second blade. At this time, the cutting is performed so that the second blade does not contact the trench part.

20 Claims, 36 Drawing Sheets

(51) Int. Cl.

| | |
|---|---|
| ***H01L 23/00*** | (2006.01) |
| ***H01L 23/28*** | (2006.01) |
| ***H01L 23/50*** | (2006.01) |
| ***H01L 21/50*** | (2006.01) |
| ***H01L 21/56*** | (2006.01) |
| ***H01L 21/288*** | (2006.01) |
| ***H01L 23/31*** | (2006.01) |
| ***H01L 25/065*** | (2006.01) |
| *H01L 21/48* | (2006.01) |

(52) U.S. Cl.

CPC .......... *H01L 21/4842* (2013.01); *H01L 21/50* (2013.01); *H01L 21/561* (2013.01); *H01L 23/28* (2013.01); *H01L 23/3107* (2013.01); *H01L 23/49503* (2013.01); *H01L 23/49551* (2013.01); *H01L 23/49575* (2013.01); *H01L 23/49582* (2013.01); *H01L 23/50* (2013.01); *H01L 24/32* (2013.01); *H01L 24/49* (2013.01); *H01L 24/73* (2013.01); *H01L 24/83* (2013.01); *H01L 24/97* (2013.01); *H01L 25/0655* (2013.01); *H01L 21/4821* (2013.01); *H01L 23/49513* (2013.01); *H01L 2224/05124* (2013.01); *H01L 2224/05554* (2013.01); *H01L 2224/2919* (2013.01); *H01L 2224/29339* (2013.01); *H01L 2224/32245* (2013.01); *H01L 2224/45144* (2013.01); *H01L 2224/45147* (2013.01); *H01L 2224/48091* (2013.01); *H01L 2224/48106* (2013.01); *H01L 2224/48247* (2013.01); *H01L 2224/49171* (2013.01); *H01L 2224/73265* (2013.01); *H01L 2224/78301* (2013.01); *H01L 2224/92247* (2013.01); *H01L 2224/97* (2013.01); *H01L 2924/014* (2013.01); *H01L 2924/0105* (2013.01); *H01L 2924/01028* (2013.01); *H01L 2924/01029* (2013.01); *H01L 2924/01047* (2013.01); *H01L 2924/01079* (2013.01); *H01L 2924/01083* (2013.01); *H01L 2924/10253* (2013.01); *H01L 2924/10271* (2013.01); *H01L 2924/17701* (2013.01); *H01L 2924/17747* (2013.01); *H01L 2924/181* (2013.01)

(58) Field of Classification Search

CPC ........... H01L 23/49582; H01L 23/3107; H01L 24/32; H01L 24/49; H01L 25/0655

USPC .................................. 438/123; 257/666, 676

See application file for complete search history.

(56) References Cited

U.S. PATENT DOCUMENTS

| | | | | | |
|---|---|---|---|---|---|
| 6,773,961 | B1 * | 8/2004 | Lee | H01L 21/4828 | 257/E23.124 |
| 7,060,535 | B1 * | 6/2006 | Sirinorakul | H01L 21/4832 | 257/702 |
| 2006/0138615 | A1 * | 6/2006 | Sato | H01L 23/49548 | 257/666 |
| 2007/0126092 | A1 * | 6/2007 | San Antonio | H01L 21/561 | 257/674 |
| 2011/0097854 | A1 * | 4/2011 | Fujishima | H01L 21/4835 | 438/123 |
| 2011/0244629 | A1 * | 10/2011 | Gong | H01L 21/4828 | 438/112 |
| 2012/0009737 | A1 * | 1/2012 | Kuratomi | H01L 21/561 | 438/112 |
| 2012/0126378 | A1 * | 5/2012 | San Antonio | H01L 21/561 | 257/659 |
| 2014/0151865 | A1 * | 6/2014 | Koschmieder | H01L 21/565 | 257/676 |
| 2014/0151883 | A1 * | 6/2014 | Celaya | H01L 21/561 | 257/741 |
| 2015/0001698 | A1 * | 1/2015 | Jaurigue | H01L 24/96 | 257/676 |
| 2015/0076675 | A1 * | 3/2015 | Real | H01L 24/97 | 257/676 |

FOREIGN PATENT DOCUMENTS

| | | |
|---|---|---|
| JP | 2005093559 | 4/2005 |
| JP | 2006179760 | 7/2006 |
| JP | 2008112961 | 5/2008 |
| JP | 2011091194 | 5/2011 |
| JP | 2014007287 | 1/2014 |

* cited by examiner

METHOD OF MANUFACTURING SEMICONDUCTOR DEVICE AND SEMICONDUCTOR DEVICE

TECHNICAL FIELD

The present invention relates to a semiconductor device of such a type that, for example, each of a plurality of leads serving as external terminals is exposed from a sealing body on a mounting surface side of a package and to a method of manufacturing the semiconductor device.

BACKGROUND ART

U.S. Pat. No. 6,608,366 (Patent Document 1) describes a semiconductor device of such a type that each of a plurality of leads is exposed on a mounting surface side of a package. Also, each of the plurality of leads described in Patent Document 1 has a recess formed at a peripheral part of the mounting surface.

Also, Japanese Patent Application Laid-Open Publication No. 2000-294719 (Patent Document 2) describes a semiconductor device in which concave parts are formed on terminal connecting surfaces of a plurality of leads and in which solder is buried in the concave parts.

Further, Japanese Patent Application Laid-Open Publication No. 2005-19240 (Patent Document 3) describes a semiconductor device in which concave parts are formed on a peripheral part side of leads formed on a back surface side of a resin sealing body and in which a plating layer is formed on inner wall surfaces of the concave parts.

Still further, Japanese Patent Application Laid-Open Publication No. 2008-112961 (Patent Document 4) describes a method of manufacturing a semiconductor device which forms a trench in a frame part of a lead frame along a dicing line by using a dicing saw, and then, forms a plating layer in the trench, and then, penetrates through and removes the frame part and a sealing resin by using a dicing saw having a narrower width than that of the trench.

Still further, Japanese Patent Application Laid-Open Publication No. 2005-93559 (Patent Document 5) describes a method of manufacturing a semiconductor package which forms a via hole that is a long hole at an outer peripheral part of each lead, and the via hole is cut by a cutting line that cuts it by half after a lead frame is sealed with resin. Patent Document 5 also describes that a fillet-promoting corner part is formed at an outer peripheral part of a bottom end surface of the semiconductor package.

PRIOR ART DOCUMENTS

Patent Documents

Patent Document 1: U.S. Pat. No. 6,608,366

Patent Document 2: Japanese Patent Application Laid-Open Publication No. 2000-294719

Patent Document 3: Japanese Patent Application Laid-Open Publication No. 2005-19240

Patent Document 4: Japanese Patent Application Laid-Open Publication No. 2008-112961

Patent Document 5: Japanese Patent Application Laid-Open Publication No. 2005-93559

SUMMARY OF THE INVENTION

Problems to be Solved by the Invention

As a semiconductor device of a type that each of a plurality of leads serving as external terminals is exposed from a sealing body on the mounting surface side of the package, for example, a semiconductor device called QFN (Quad Flat Non-Leaded package) is cited. Compared with a semiconductor device as such a QFP (Quad Flat Package) that a plurality of leads protrude from side surfaces of a sealing body, the QFN is advantageous in a point that amounting area of the semiconductor device can be reduced.

However, if the QFN is mounted on the mounting board, there is a problem that it is difficult to visually check the connection state of each lead after the mounting. As a countermeasure against this problem, a method of forming a concave part in a peripheral part of the bottom surface of each of the plurality of leads is cited. In this case, solder which is a bonding material is extended to the outer side of the side surface of the lead from the concave part so that it is easy to form a fillet shape, and therefore, the visual check capability of the connection state of each lead is improved.

As a technique that improves the manufacturing efficiency of the QFN, a manufacturing technique is cited, the technique of dividing the plurality of device regions by forming a sealing body so as to collectively cover a plurality of device regions, and then, cutting and processing them with a rotating blade called a dicing blade. This method is called a collective sealing (Block Molding) method or a MAP (Mold Array Process) method, in which the manufacturing efficiency can be improved by increasing the number of products which can be obtained from one lead frame.

However, when the inventor of the present application has studied the method of manufacturing the QFN having the concave part formed in the peripheral part of each of the plurality of leads by the collective sealing method, it has been found out that metal wastes generated in the cutting and processing easily get stuck in the concave part.

Other problems and novel characteristics will be apparent from the description of the present specification and accompanying drawings thereof.

Means for Solving the Problems

In a method of manufacturing a semiconductor device according to an embodiment, a lead frame is provided, the lead frame having a trench part so as to communicate bottom surfaces of a first lead and a second lead with each other which are coupled to each other between device regions adjacent to each other. Then, after a part of the coupling part between the first and second leads is cut by using a first blade, metal wastes formed in the trench part are removed. Then, after the metal wastes are removed, a metal film is formed by performing a plating method onto exposed surfaces of the first and second leads, and then, a residual part of the coupling part between the first and second leads is cut by using a second blade. At this time, the residual part is cut so that the second blade does not contact the trench part.

Effects of the Invention

According to the above-described embodiment, reliability of the semiconductor device can be improved.

BRIEF DESCRIPTIONS OF THE DRAWINGS

DESCRIPTIONS OF THE PREFERRED EMBODIMENTS

Figure 1:
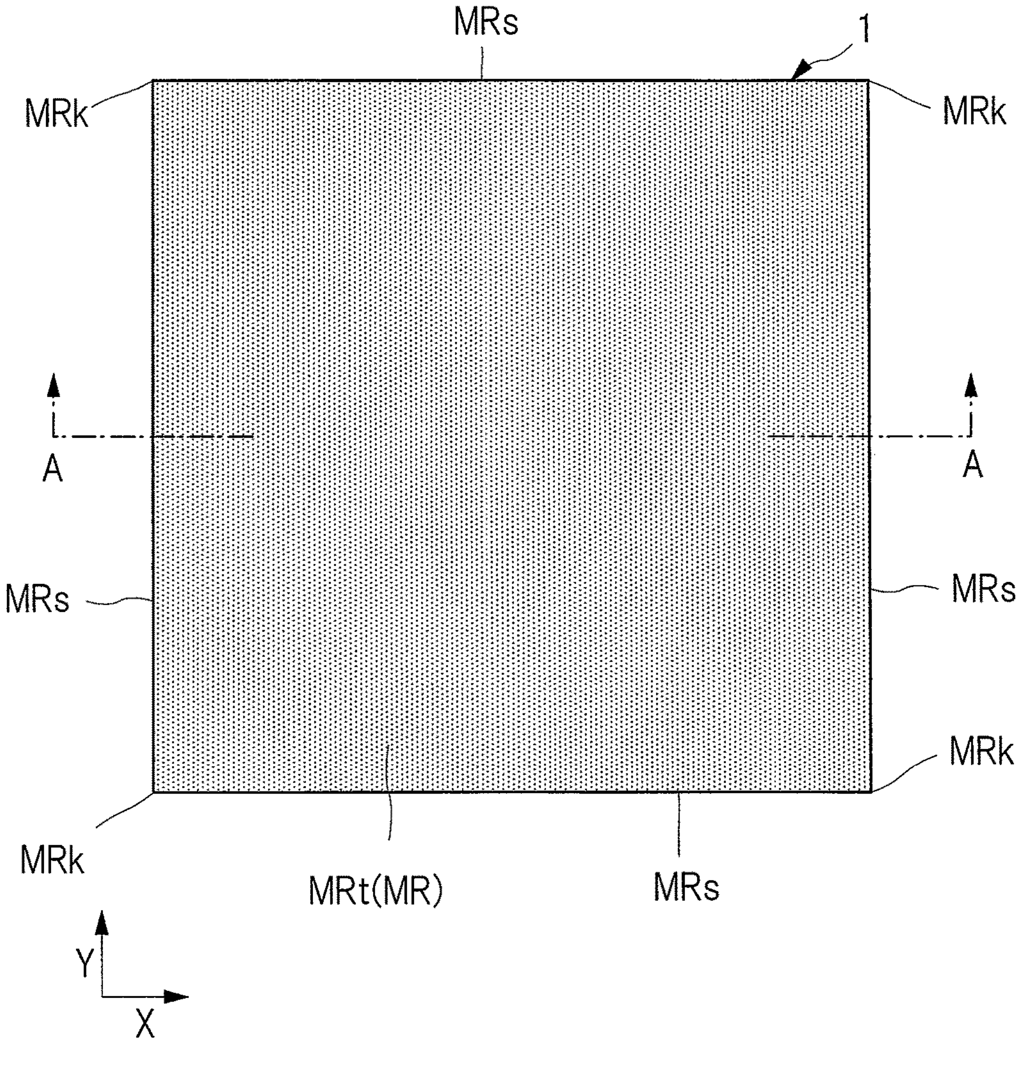
FIG. 1 is a top view of a semiconductor device according to an embodiment.

Explanation of Description Form, Basic Word and Method in Present Application In the present application, the embodiments will be described in a plurality of sections or others when required as a matter of convenience. However, these sections or others are not independently different from each other unless otherwise stated, and the one of each part of a single example is a detailed part of the other, or a part or the entire of the modification example or others, regardless of before and after the description. Also, in principle, the repetitive description of the same part is omitted. Further, each component in the embodiment is not indispensable unless otherwise described not to be particularly so, logically limited to the number, and described to be clearly so from the contexts.

Similarly, when "X made of A" or others is described for materials, compositions, and others in the description of the embodiment and others, a material containing other components than A is not eliminated unless otherwise specified not to be so and clearly to be so from the contexts. For example, the component means "X containing A as a main component" or others. For example, it is needless to say that a "silicon material" and others includes not only pure silicon but also SiGe (silicon germanium) or other multicomponent alloy containing silicon as a main component, or a member containing other additives or others. Also, gold plating, a Cu layer, nickel plating, and others include not only pure material but also members containing gold, Cu, nickel, and others as a main component, respectively, unless otherwise specified not to be so or particularly specified to be so.

Further, even when a specific numerical value and numerical amount are mentioned, they may be numerical values that excess the specific numerical values or smaller than the specific numerical values unless otherwise specified not to be so, logically limited to the number, and clearly described not to be so from the contents.

Still further, in each drawing of the embodiment, the same or similar parts are denoted by the same or similar symbol or reference number, and the description thereof is not repeated.

Still further, in the present application, words such as a top surface and a bottom surface are used in some cases. However, after the semiconductor package is mounted, for example, the top surface is arranged to be lower than the bottom surface in some cases since there are various aspects as the mounting aspect of the semiconductor package. In the present application, a plane surface of the semiconductor chip on the device forming surface side is referred to as a front surface, and a surface opposite to the front surface is referred to as a back surface. And, a plane surface of the wiring substrate on the chip mounting surface side is referred to as the top surface or the front surface, and a surface positioned on an opposite side of the top surface is referred to as the bottom surface.

Also, in the attached drawings, hatching or others is omitted in some cases even in a cross-sectional view in a conversely complicated case or a case in which a space is clearly distinguished therefrom. In respect to this, in a case in which it is clear from the description or others, a profile of the background is omitted even in a hole which is closed when seen in a plan view. Further, hatching or a dot pattern is added to the drawings even in the cross-sectional view in order to explicitly illustrate the part so as not to be the space or explicitly illustrate a boundary between regions.

In the embodiment described below, an aspect of application of the semiconductor device of the QFN type will be cited for explanation as an example of a semiconductor device in which a plurality of leads serving as external terminals are exposed from a sealing body at a bottom surface (mounting surface) of the sealing body.

<Semiconductor Device>

Figure 2A:
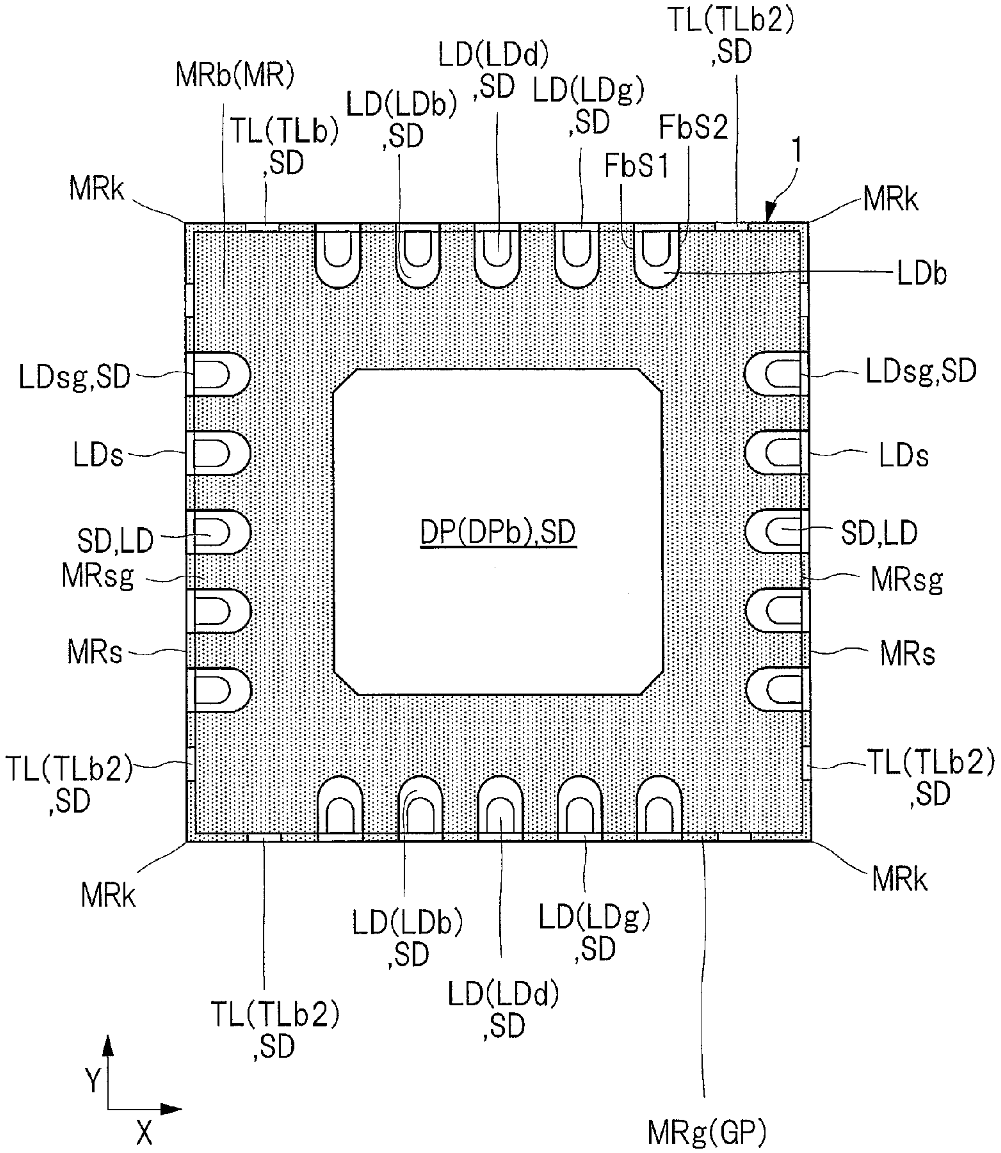
FIG. 2A is a bottom view of the semiconductor device shown in FIG. 1.
Figure 2B:
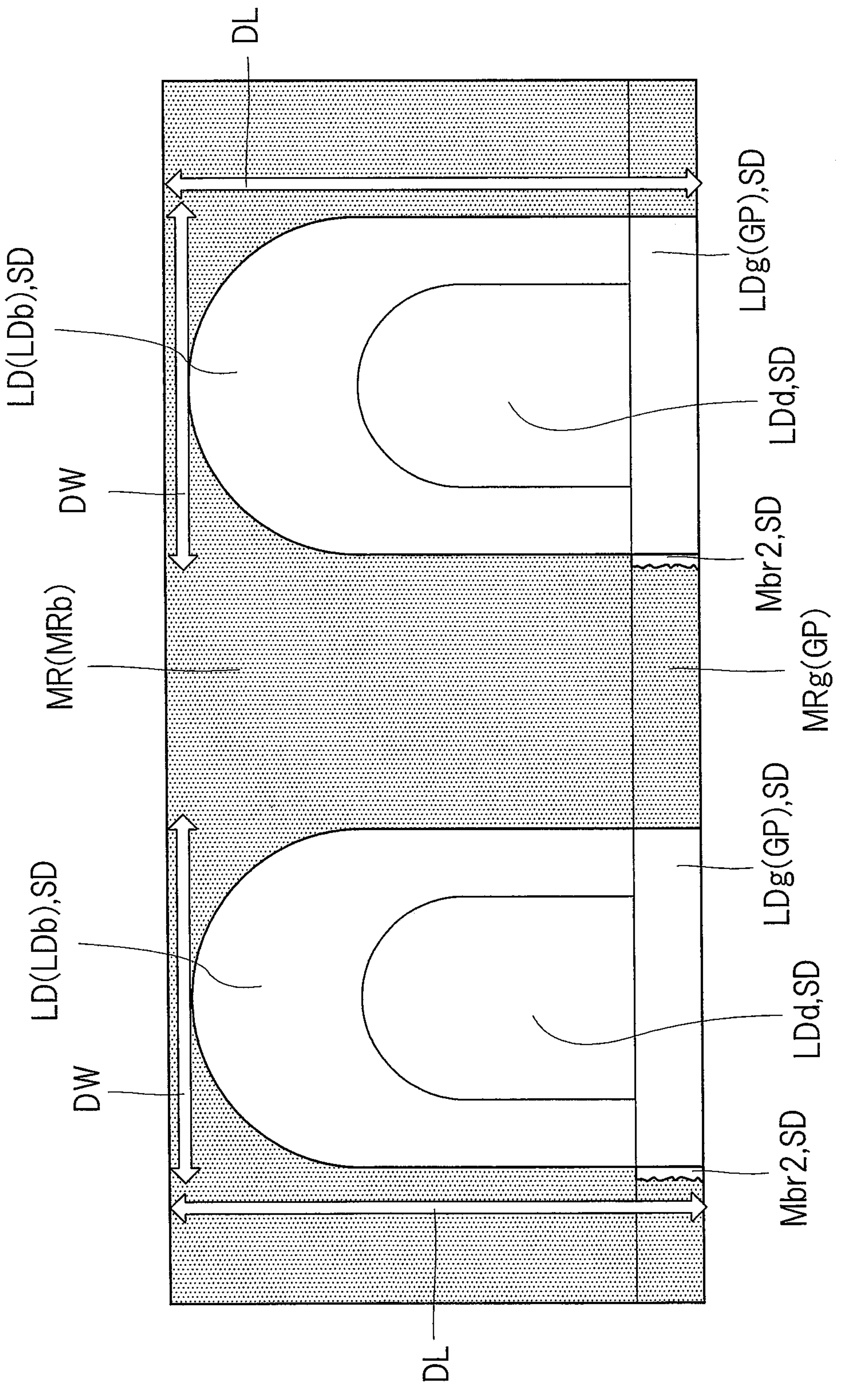
FIG. 2B is an enlarged plan view partially enlarging some of the plurality of leads shown in FIG. 1.
Figure 3:
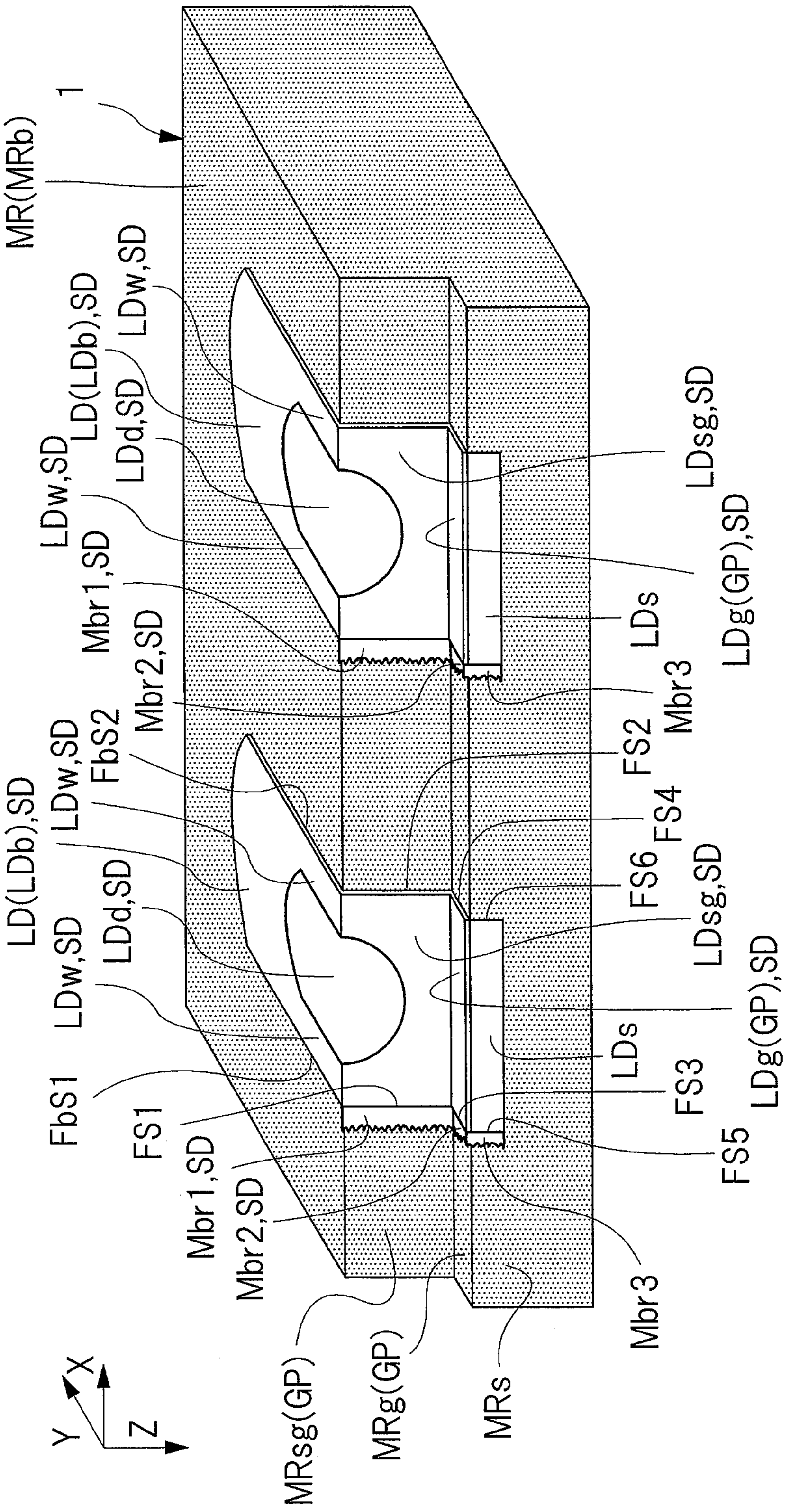
FIG. 3 is an enlarged perspective view in periphery of the leads shown in FIG. 2A.
Figure 4:
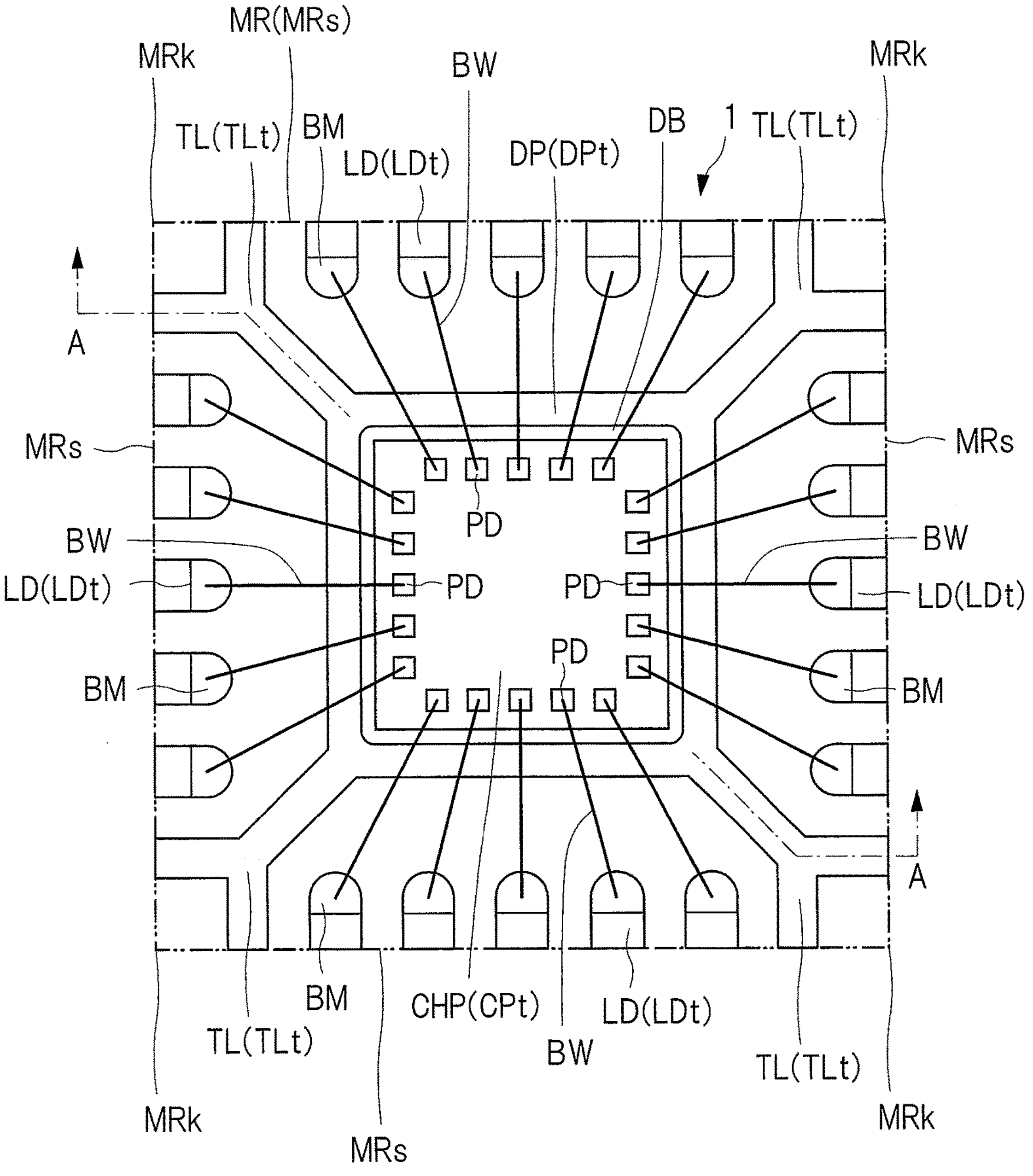
FIG. 4 is a plan view showing an internal structure of the semiconductor device from which a sealing body shown in FIG. 1 is removed.
Figure 5:
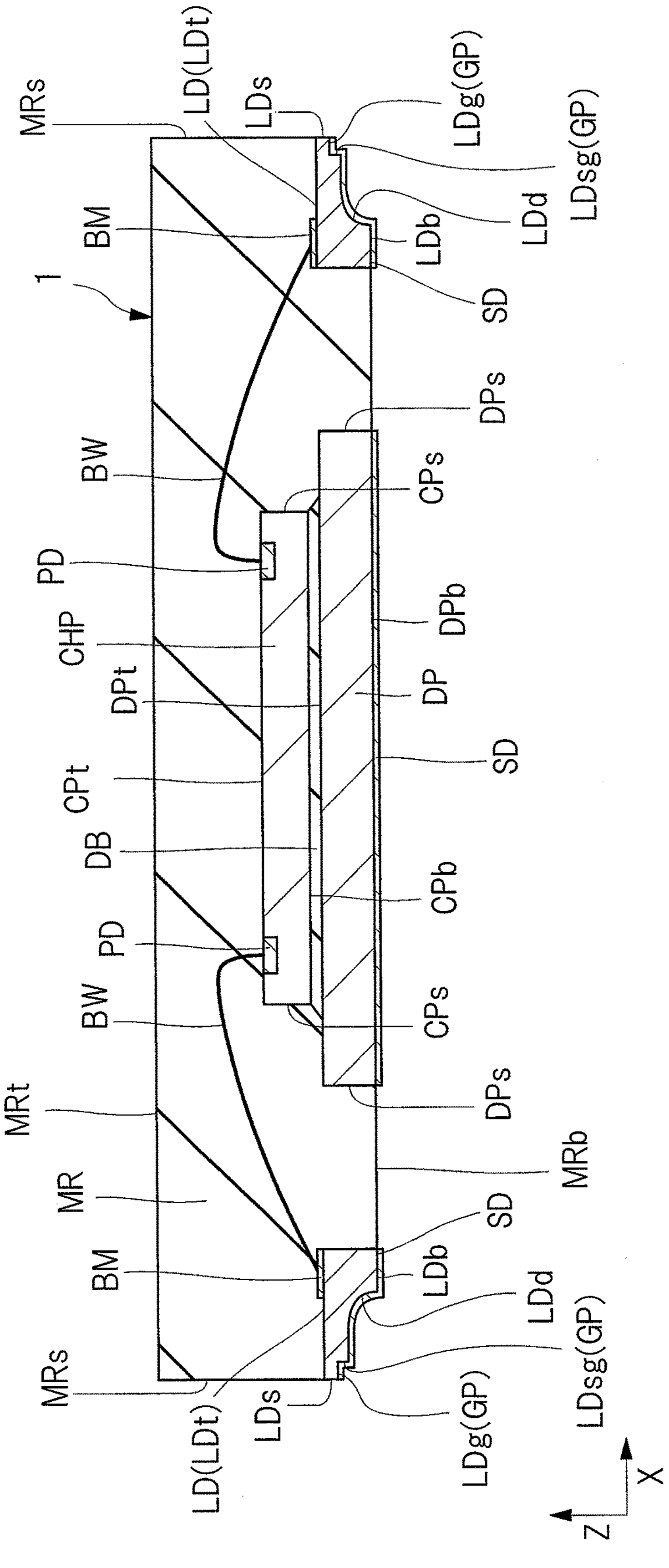
FIG. 5 is a cross-sectional view taken along a line A-A of FIG. 1.
Figure 6:
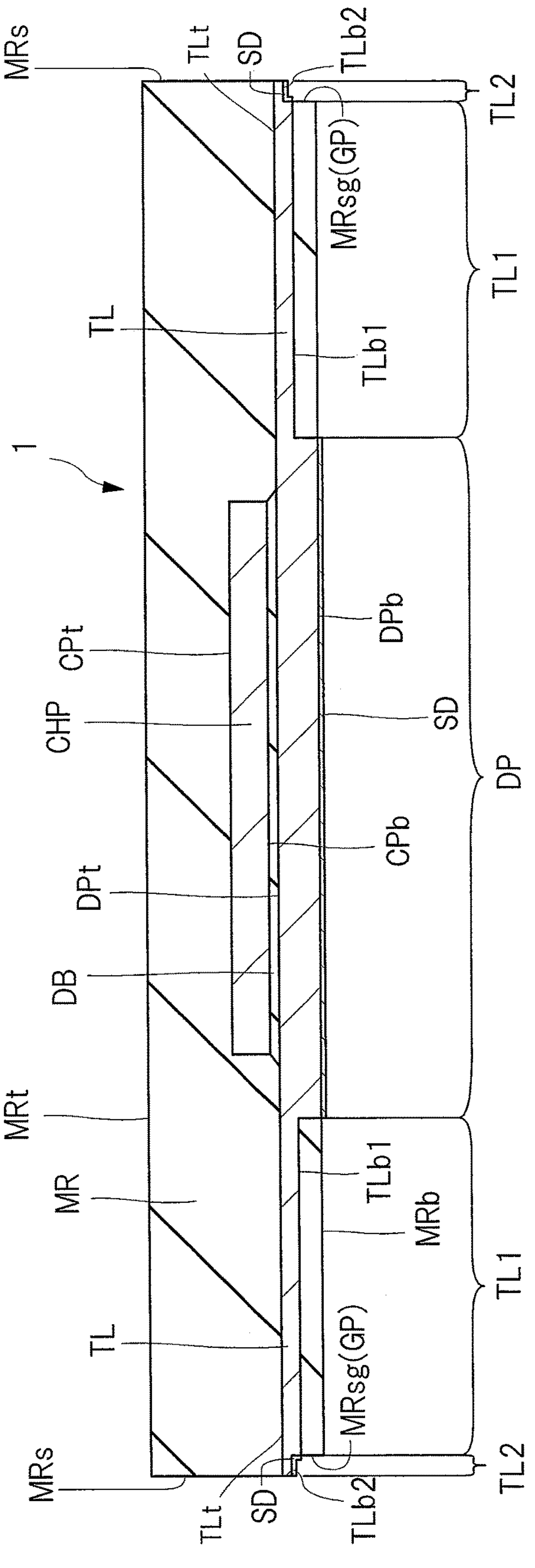
FIG. 6 is a cross-sectional view taken along a line A-A of FIG. 4.

First, outlines of a configuration of a semiconductor device 1 of the present embodiment will be explained by using FIG. 1 to FIG. 6. FIG. 1 is a top view of the semiconductor device of the present embodiment, and FIG. 2A is a bottom view of the semiconductor device shown in FIG. 1. And, FIG. 2B is an enlarged plan view enlarging some of a plurality of leads shown in FIG. 2A. Also, FIG. 3 is an enlarged perspective view in periphery of the leads shown in FIG. 2A. Further, FIG. 4 is a plan view showing an internal structure of the semiconductor device from which the sealing body shown in FIG. 1 has been removed. Still further, FIG. 5 is a cross-sectional view taken along a line A-A of FIG. 1. Still further, FIG. 6 is a cross-sectional view taken along a line A-A of FIG. 4.

The semiconductor device 1 of the present embodiment is provided with: a die pad (chip mounting part, tab) DP (see FIG. 2A, FIG. 4, and FIG. 5); and a semiconductor chip CHP (see FIG. 4 and FIG. 5) mounted on the die pad DP via a die-bond material DB (see FIG. 4 and FIG. 5). Also, the semiconductor device 1 has: the plurality of leads (terminals, external terminals) LD arranged in periphery of the semiconductor chip CHP (die pad DP); and a plurality of wires (electrically-conductive members) BW (see FIG. 4 and FIG. 5) which electrically connect the plurality of leads LD and a plurality of pads (electrodes, bonding pads) PD (see FIG. 4 and FIG. 5) of the semiconductor chip CHP to each other. Also, a plurality of suspension leads TL are coupled (connected) to the die pad DP. Moreover, the semiconductor device 1 is provided with a sealing body (resin body) MR which seals the semiconductor chip CHP, the plurality of wires BW, and a part of the plurality of leads LD.

<Appearance Structure>

First, an appearance structure of the semiconductor device 1 will be explained. The planar shape of the sealing body (resin body) MR shown in FIG. 1 is formed of a quadrangle. The sealing body MR has a top surface (sealing-body top surface) MRt, a bottom surface (back surface, mounting surface, sealing-body bottom surface) MRb (see FIG. 2A) on an opposite side to the top surface MRt, and side surfaces (sealing-body side surfaces) MRs positioned between the top surface MRt and the bottom surface MRb. In the example shown in FIG. 5, the side surfaces MRs are orthogonal to the top surface MRt and the bottom surface MRb.

Moreover, as shown in FIG. 2A, a step part GP is formed at the bottom surface (mounting surface) of the semiconductor device 1, in other words, at a peripheral part of the bottom surface MRb of the sealing body MR. The step part GP is continuously formed in the entire periphery of the peripheral part of the bottom surface MRb of the sealing body MR. The structure of the step part GP can be expressed as follows. That is, the sealing body MR has a bottom surface (step surface, intermediate surface) MRg, which is continued to the side surfaces MRs and is positioned between the bottom surface MRb and the top surface MRt (see FIG. 1) (specifically, at a height therebetween). Moreover, inside the side surface MRs, a side surface MRsg (see FIG. 3) continued to the bottom surface MRb and the bottom surface MRg is provided. Although details will be described later, the step part GP is a part of a cut trench formed by cutting and processing by using a rotating blade in a manufacturing process of the semiconductor device 1. Therefore, a planar area of the bottom surface MRb of the sealing body MR shown in FIG. 2A is smaller than a planar area of the top surface MRt shown in FIG. 1.

Although details will be described later, the semiconductor device 1 of the present embodiment is a semiconductor package of the collective sealing method in which a plurality of device regions are singulated by using a rotating blade after forming the sealing body MR so as to collectively cover the plurality of device regions. Such a semiconductor package is referred to as a semiconductor device of a MAP (Multi Array Package) type. In the case of the MAP-type semiconductor device, each of the plurality of side surfaces MRs of the sealing body MR is a cut surface and is orthogonal to the top surface MRt. A total of the planar area of the bottom surface MRb shown in FIG. 2A, the planar area of the bottom surface MRg, and the planar area of bottom surface LDg of the lead LD is equal to the planar area of the top surface MRt of the sealing body MR shown in FIG. 1. Note that the above-described "equal planar area" means that the planar areas are almost the same as each other, and does not exclude a case in which the areas are slight different from each other due to the influence of processing accuracy, etc.

As shown in FIG. 2A, in the semiconductor device 1, each of the plurality of leads LD is arranged along each side (side surface MRs) of the sealing body MR. Each of the plurality of leads LD is made of a metal material, and is made of, for example, a metal containing copper (Cu) as a main component in the present embodiment.

Each of the plurality of leads LD has a top surface (lead top surface) LDt (see FIG. 5) covered with the sealing body MR and a bottom surface (lead bottom surface) LDb which is a surface on an opposite side of the top surface LDt and is exposed from the sealing body MR at the bottom surface MRb of the sealing body MR.

In the planar view viewed from the bottom surface LDb side shown in FIG. 2B, each of the plurality of leads LD has a width direction DW which is the same direction as the arrangement direction in which the plurality of leads LD are arranged, and an extending direction DL which is orthogonal to the width direction DW. In the case in which each of the plurality of leads LD is arranged along each side (side surface MRs) of the sealing body MR as shown in FIG. 2A, note that the extending direction DL and the width direction DW are different from each other in accordance with the side on which the leads LD are arranged. In the example shown in FIG. 2B, the length of the bottom surface LDb in the extending direction DL of the lead LD is longer than the length of the bottom surface LDb in the width direction DW of the lead LD. For example, the length of the bottom surface LDb in the extending direction DL is 0.35 mm. On the other hand, the length of the bottom surface LDb in the width direction DW is 0.25 mm.

As shown in FIG. 3, the bottom surface (step surface, intermediate surface, lead bottom surface) LDg, which configures a part of the step part GP, is formed on each of the plurality of leads LD. In the example shown in FIG. 3, each of the plurality of leads LD has the bottom surface LDg which is continued to a side surface (lead side surface) LDs, which is closest to the peripheral part side and is positioned between the bottom surface LDb and the top surface LDt (see FIG. 5) in the thickness direction. In the example shown in FIG. 3, the bottom surface LDg is formed so as to be directed toward the same direction (Z direction) as that of the bottom surface LDb. In the example shown in FIG. 3, the side surface LDs is formed so as to be directed toward the direction (Y direction in FIG. 3) orthogonal to the direction in which the bottom surface LDb is directed. As shown in FIG. 3, the side surface LDs of the lead LD is not covered with a metal film SD, and a metal on a base is exposed therefrom.

Each of the plurality of leads LD has a side surface (lead side surface) LDsg continued to the bottom surface LDb and the bottom surface LDg inside the side surface LDs. In other words, when viewed from the bottom surface LDb side of the lead LD, the side surface LDs is positioned in the outer side of the side surface LDsg. In the example shown in FIG. 3, the side surface LDsg is formed so as to be directed toward the same direction (in FIG. 3, the Y direction) as that of the side surface LDs, in other words, the direction (in FIG. 3, the Y direction) orthogonal to the direction in which the bottom surface LDb is directed.

As described above, the step part GP is a part of a cut trench, which is formed by performing a cutting process by using the rotating blade. Therefore, the bottom surface LDg of the lead LD is exposed from the bottom surface MRg of the sealing body MR, and is the same plane as the bottom surface MRg. The side surface LDsg of the lead LD is exposed from the bottom surface MRg of the sealing body MR, and is the same plane as the bottom surface MRg. Although details will be described later, the side surface LDs of the lead LD and the side surface MRs of the sealing body MR are the surfaces which are collectively formed when the semiconductor device 1 is singulated by performing the cutting process by using the rotating blade in the manufacturing process of the semiconductor device 1. Therefore, the side surface LDs of the lead LD and the side surface MRs of the sealing body MR are the same plane as each other.

Note that "the same plane" described above means that the surfaces are flat without any level difference between the two surfaces. However, depending on how a force in the cutting process by using the rotating blade is applied, an unintentional level difference is generated between the two surfaces in some cases. Therefore, "the same plane" described above means the surfaces are flat without the intentionally-formed level difference between the two surfaces. On the surfaces of the plurality of leads LD shown in FIG. 3 which are exposed from the sealing body MR, the metal film SD is formed on each of the surfaces except for the side surface LDs. Therefore, strictly speaking, a minute level difference in accordance with the film thickness of the metal film SD is provided between the exposed surface of the lead LD and the surface of the sealing body. The "same plane" described above also includes a meaning in a case of formation of a level difference in accordance with the film thickness of the metal film SD between the two surfaces.

As shown in FIG. 2B and FIG. 3, each of the plurality of leads LD has a concave part (recess, dimple, hollow part) LDd formed on the bottom surface LDb side. When viewed from the bottom surface LDb side of the lead LD, the width of the concave part LDd (opening length of the lead LD in the width direction DW shown in FIG. 2B) is narrower than the width of each of the plurality of leads LD. The concave part LDd is formed at a center part of the lead LD in the width direction DW (see FIG. 2B). In other words, when viewed from the bottom surface LDb side, the bottom surface LDb is extended along the extending direction DL of the lead LD (see FIG. 2B) and has a side FbS1 and a side FbS2 opposed to each other, and the concave part LDd is formed between the side FbS1 and the side FbS2. Therefore, in the width direction DW of the lead LD (see FIG. 2B), wall parts LDw having inner surfaces of the concave part LDd are formed on both sides of the concave part LDd.

As shown in FIG. 3, the concave part LDd is formed to be closer to the peripheral part side, in other words, the side surface LDs side than the center part of the lead LD in the extending direction DL (see FIG. 2B). The part of the side surface LDsg which is overlapped with the concave part LDd is opened. In other words, when viewed from the bottom surface LDb side of the lead LD, one end of the concave part LDd (an end of the sealing body MR on the peripheral part side) reaches the side surface LDsg configuring the step part GP. The other end of the concave part LDd (an end of the sealing body MR on a side distant from the peripheral part) is terminated inside the bottom surface LDb of the lead LD.

Although details will be described later, by forming such a concave part LDd as partially opening the side surface LDsg in the peripheral part of the mounting surface of the lead LD, it can be easily checked whether the opening is filled with solder or not after the semiconductor device is mounted on the mounting board, and therefore, inspection efficiency after the mounting can be improved. Moreover, by forming the concave part LDd in the peripheral part of the mounting surface of the lead LD, the surface area of the soldered mounting surface of the lead LD is increased, and therefore, the connection strength between the lead LD and a terminal on the mounting surface side can be improved. Moreover, by terminating the end of the concave part LDd which is on the opposite side of the peripheral part inside the bottom surface LDb of the lead LD, inflow of a resin which is a raw material of the sealing body MR into the concave part LDd during manufacturing processes can be suppressed.

In the example shown in FIG. 2B, the length of the concave part LDd in the extending direction DL of the lead LD is longer than the length of the concave part LDd in the width direction DW of the lead LD. For example, the length of the concave part LDd in the extending direction DL is 0.20 mm. On the other hand, the length of the concave part LDd in the width direction DW is 0.15 mm.

Some of the plurality of surfaces of each of the plurality of leads LD are surfaces exposed from the sealing body MR as described above. The metal film (plating layer, solder material, solder film, plating solder film) SD is formed on the bottom surface LDb, the inner surface of the concave part LDd, the side surface LDsg of the step part GP, and the bottom surface LDg of the step part GP among the exposed surfaces. On the other hand, the metal film SD is not formed on the side surface LDs among the exposed surfaces from the sealing body MR of the lead LD. Such a structure is formed depending on the method of manufacturing the semiconductor device 1. That is, it is defined whether the metal film SD is formed or not depending on an process sequence of the process of forming the metal film SD and the process of forming each exposed surface.

The metal film SD is, for example, a plating film formed by a plating method, more specifically, an electrolytic plating film formed by an electrolytic plating method of example, the metal film SD is made of, for example, a solder material, and functions as a bonding material when the lead LD is bonded with a terminal on the mounting board side described later. More specifically, the metal film SD is made of so-called lead-free solder which does not practically contain lead (Pb), and is a metal material containing tin as a main component, such as only tin (Sn), tin-bismuth (Sn—Bi), or tin-copper-silver (Sn—Cu—Ag). Here, the lead-free solder means the one having a content of lead (Pb) of 0.1 wt % or less, and this content is determined as a standard of RoHS (Restriction of Hazardous Substances) directive. Hereinafter, when a solder material or a solder component is described in the present embodiment, it means lead-free solder unless otherwise particularly clearly stated.

Among the above-described surfaces of the lead LD exposed from the sealing body MR, each of the surfaces (the bottom surface LDb, the inner surface of the concave part LDd, the side surface LDsg of the step part GP, and the bottom surface LDg of the step part GP) except for the side surface LDs is a surface formed before the metal film SD serving as the plating film is formed. Therefore, the metal film SD is formed on the bottom surface LDb, the inner surface of the concave part LDd, the side surface LDsg of the step part GP, and the bottom surface LDg of the step part GP. On the other hand, the side surface LDs is a surface formed by the cutting process by using the rotating blade after the metal film SD serving as the plating film is formed. Therefore, the plating film is not formed on the side surface LDs. As described above, when the manufacturing is performed by a method of cutting a part of the metal member after the plating film is formed, the electrolytic plating method can be employed as a method of manufacturing the plating film.

As shown in FIG. 3, in each of the plurality of leads LD, a metal burr Mbr1, a metal burr Mbr2, and a metal burr Mbr3 are formed along the side surface MRsg of the sealing body MR, along the bottom surface MRg, and along the side surface MRs, respectively. The metal burr Mbr1 is formed so as to be extended from one side among the plurality of sides configuring an outer edge of the side surface LDsg of the lead LD.

More specifically, the side surface LDsg of the lead LD has a side FS1 and a side FS2 opposed to each other along the arrangement direction of the plurality of leads LD (the X direction in the example of FIG. 3). The metal burr Mbr1 extending along the X direction is formed on the side FS1 of the side surface LDsg, and the metal burr Mbr1 is not formed on the side FS2. This metal burr Mbr1 is generated when the cutting process by using the rotating blade in the formation of the step part GP is performed. When metal is cut by the rotating blade, a part of the cut metal cut in the moving direction of the rotating blade is dragged so as to form the metal burr Mbr1. In the example shown in FIG. 3, it can be understood that the rotating blade has rotated from the side FS2 of the side surface LDsg toward the direction of the side FS1. The metal burr Mbr1 is formed when mainly the metal configuring the wall part LDw on the side FS1 side is dragged.

On the other hand, when the rotating blade is rotated from the side FS2 toward the side FS1, the metal of the wall part LDw on the side FS2 side is dragged to become the metal waste, and the metal waste remains inside the concave part LDd. Although details will be described later, the metal film SD is formed after the metal waste remaining in the concave part LDd is removed in the present embodiment. Therefore, such a semiconductor device 1 as shown in FIG. 3 is obtained, the semiconductor device not having the metal burr Mbr1 formed on the side FS2 side of the side surface LDsg of the lead LD and inside the concave part LDd of the completed semiconductor device 1.

The bottom surface LDg of the lead LD has a side FS3 and a side FS4 opposed to each other along the arrangement direction of the plurality of leads LD (the X direction in the example of FIG. 3). The metal burr Mbr2 extending along the X direction is formed on the side FS3 of the bottom surface LDg, and the metal burr Mbr2 is not formed on the side FS4. The metal burr Mbr2 is generated when the metal of the lead LD is dragged by the rotating blade in the formation of the step part GP as similar to the above-described metal burr Mbr1. Therefore, the extending direction of the metal burr Mbr2 and the extending direction of the metal burr Mbr1 are the same as each other.

The side surface LDs of the lead LD has a side FS5 and a side FS6 opposed to each other along the arrangement direction of the plurality of leads LD (the X direction in the example of FIG. 3). The metal burr Mbr3 extending along the X direction is formed on the side FS5 of the side surface LDs, and the metal burr Mbr3 is not formed on the side FS6. As different from the metal burr Mbr1 and the metal burr Mbr2 described above, the metal burr Mbr3 is generated when the cutting process is further performed by using a rotating blade having a cutting width narrower than a cutting width for forming the step part (for forming the cutting part) after the formation of the step part GP. In other words, the metal burr Mbr3 is formed when a part of the metal cut in a moving direction of the rotating blade for singulation used in a singulation process of dividing the plurality of device regions is dragged. Therefore, in the example shown in FIG. 3, the extending direction of the metal burr Mbr3 is the same as the extending directions of the metal burrs Mbr1 and Mbr2. However, as a modification example, the extending direction of the metal burr Mbr3 is the opposite direction of the extending directions of the metal burrs Mbr1 and Mbr2 in some cases.

Although details will be described later, in the present embodiment, the step part GP is formed, the metal film SD is formed so as to cover the step part, and then, the singulation process of exposing the side surface LDs is performed. Therefore, plating is formed on the metal burrs Mbr1 and Mbr2, and plating is not formed on the metal burr Mbr3.

FIG. 3 shows the large metal burrs Mbr1, Mbr2, and Mbr3 in order to understandably show the formation positions of the metal burrs Mbr1 and Mbr3 or others. However, most of the metal burrs Mbr1, Mbr2, and Mbr3 can be removed by performing the washing in the manufacturing process of the semiconductor device 1. Therefore, rather than the remaining case of the large metal burrs Mbr1, Mbr2, and Mbr3 as shown in FIG. 3, a remaining case of a part of the burrs Mbr1, Mbr2, and Mbr3 often occurs.

From the viewpoint of improving the mounting reliability of the semiconductor device 1, it is preferred that most of the exposed surfaces of the lead LD is covered with the metal film SD. For example, in the present embodiment, by decreasing the area of the side surface LDs not covered with the metal film SD, the thickness of the thickest part (the part not having the concave part LDd formed) of the side surface LDsg shown in FIG. 3 is thicker than the thickness of the side surface LDs. In the example shown in FIG. 3, the thickness of the thickest part of the side surface LDsg is formed to be equal to or larger than ¾ of a total thickness of the lead LD (the distance from the top surface LDt to the bottom surface LDb shown in FIG. 5). For example, if the total thickness of the lead LD is 0.2 mm, the thickness of the thickest part of the side surface LDsg is about 0.15 mm, and the thickness of the side surface LDs is about 0.05 mm.

Although details will be described later, in the present embodiment, by providing the step part GP shown in FIG. 3, the rotating blade is prevented from contacting the concave part LDd in the singulation process of exposing the side surface LDs, so that generation of metal waste inside the concave part LDd is prevented. Therefore, it is preferred that the step part GP be deeper than the concave part LDd. In the present embodiment, if the bottom surface LDb of the lead LD is regarded as a reference surface, a distance from the reference surface to the deepest part (base surface) of the concave part LDd is shorter than a distance from the reference surface to the bottom surface LDg. Therefore, the rotating blade can be prevented from contacting the concave part LDd in the singulation process of exposing the side surface LDs.

The relation between the step part GP and the concave part LDd described above can be expressed as follows. That is, as shown in FIG. 3, the concave part LDd is not formed on the bottom surface LDg and the side surface LDs. When the rotating blade can be prevented from contacting the concave part LDd in the singulation process of exposing the side surface LDs, the concave part LDd is not formed on the bottom surface LDg and the side surface LDs as shown in FIG. 3.

As shown in FIG. 2B, when viewed from the bottom surface LDb side, the bottom surface LDg of the lead LD in the extending direction DL is shorter than the bottom surface LDb of the lead LD in the extending direction DL. From the viewpoint of preventing the rotating blade from contacting the concave part LDd in the singulation process of exposing the side surface LDs, the length of the bottom surface LDg in the Y-direction may be short as long as the length is a length in consideration of the processing accuracy of the rotating blade. On the other hand, from the viewpoint of improving the mounting strength by increasing the exposed area of the mounting surface of the lead LD, it is preferred that the length of the concave part LDd is increased. Therefore, as shown in FIG. 2B, as long as the bottom surface LDg of the lead LD in the extending direction DL is shorter than the bottom surface LDb of the lead LD in the extending direction DL, the mounting strength can be improved, and the rotating blade can be prevented from contacting the concave part LDd.

As shown in FIG. 2B, when viewed from the bottom surface LDb side, the concave part LDd of the lead LD in the extending direction DL is longer than the part of the lead LD in the extending direction DL where the concave part LDd of the bottom surface LDb is not formed. As described above, the end on the side distant from the peripheral part of the concave part LDd is terminated inside the bottom surface LDb of the lead LD. In this manner, the inflow of the resin which is the raw material of the sealing body MR into the concave part LDd during the manufacturing processes can be suppressed. Although details will be described later, if the periphery of the concave part LDd is surrounded by the bottom surface LDb in a process of forming the sealing body MR, the inflow of the resin which is the raw material of the sealing body MR can be suppressed. Therefore, as shown in FIG. 2B, when the concave part LDd of the lead LD in the extending direction DL is longer than the part of the lead LD in the extending direction DL where the concave part LDd of the bottom surface LDb is not formed, the mounting strength can be improved, and the inflow of the resin which is the raw material of the sealing body MR can be suppressed.

Next, as shown in FIG. 2A, the bottom surface DPb of the die pad (chip mounting part, tab) DP is exposed from the sealing body MR at the bottom surface MRb of the sealing body MR. Thus, the semiconductor device 1 is a semiconductor device of a die-pad exposed type (tab exposed type). The die pad DP is made of a metal material having a higher thermal conductivity than that of the sealing body MR, and is made of, for example, a metal containing copper (Cu) as a main component in the present embodiment. As described above, by exposing the metal member (die pad DP) such as copper (Cu) having a higher thermal conductivity than that of the sealing body MR, the heat dissipation performance of the package can be improved in the semiconductor device of the die-pad exposed type compared with a semiconductor device without the exposed die pad DP. In the example shown in FIG. 2A, the metal film SD which functions as a bonding material in the mounting is formed on the bottom surface DPb of the die pad DP, and covers the bottom surface of the above-described base material. As described above, the metal film SD is a plating film (solder film, electrolytic plating film) formed by, for example, a plating method (specifically, an electrolytic plating method).

As shown in FIG. 2A, in the semiconductor device 1, a part of the suspension lead TL is exposed from the sealing body MR in the vicinities of corner parts MRk (intersection points of the side surfaces MRs) of the sealing body MR. More specifically, as shown in FIG. 4, one end of the suspension lead TL is connected to the die pad DP. On the other hand, the other end of the suspension lead TL is branched into two directions in the vicinity of the corner part MRk as shown in FIG. 4, and is exposed from the sealing body MR in the peripheral part of the sealing body MR as shown in FIG. 2A.

Since the suspension lead TL is integrally formed with the die pad DP, the suspension lead TL is made of the same metal material as that of the die pad DP. In the present embodiment, the suspension leads TL consist of, for example, a metal containing copper (Cu) as a main component. As shown in FIG. 2A, in the present embodiment, the step part GP is formed so as to surround the peripheral part of the sealing body MR on the bottom surface MRb side. Therefore, a part of bottom surfaces (suspension-lead bottom surfaces) TLb2 of exposed parts TL2 (see FIG. 6) of the suspension lead TL is exposed from the sealing body MR at the step part GP. As shown in FIG. 2A, the metal film SD is formed on the bottom surfaces TLb2 of the exposed parts of the suspension lead TL.

<Internal Structure>

Next, the internal structure of the semiconductor device 1 will be explained. As shown in FIG. 4, a planar shape of a top surface (chip mounting surface) DPt of the die pad DP is formed in a quadrangle (tetragon). In the present embodiment, the shape is, for example, square. In the example shown in FIG. 4, an outer-shape size (planar size) of the die pad DP is larger than an outer-shape size of the semiconductor chip CHP (planar size of a back surface CPb). In this manner, the heat dissipation performance can be improved by mounting the semiconductor chip CHP on the die pad DP which has a larger area than the outer-shape size of the semiconductor chip CHP, and exposing the bottom surface DPb of the die pad DP from the sealing body MR.

As shown in FIG. 4, the semiconductor chip CHP is mounted on the die pad DP. The semiconductor chip CHP is mounted at the center of the die pad DP. As shown in FIG. 5, the semiconductor chip CHP is mounted on the die pad DP via the die-bond material (adhesive material) DB in a state in which the back surface CPb is opposed to the top surface DPt of the die pad DP. In other words, the semiconductor chip is mounted by a so-called face-up mounting method of forming the opposite surface (back surface CPb) of the top surface (main surface) CPt on which the plurality of pads PD are formed so as to be opposed to the chip mounting surface (top surface DPt). The die-bond material DB is an adhesive material used when the semiconductor chip CHP is die-bonded. As the die-bond material DB, for example, a resin adhesive material, an electrically-conductive adhesive material containing metal particles made of silver (Ag) or others in a resin adhesive material, a solder material, or others can be used. When the solder material is used as the die-bond material DB, a solder material containing lead is used in some cases in order to increase a melting point thereof.

As shown in FIG. 4, the planar shape of the semiconductor chip CHP mounted on the die pad DP is a quadrangle. As shown in FIG. 5, the semiconductor chip CHP has the front surface (main surface, top surface) CPt, the back surface (main surface, bottom surface) CPb on the opposite side of the front surface CPt, and side surfaces CPs positioned between the front surface CPt and the back surface CPb. As shown in FIG. 4 and FIG. 5, the plurality of pads (bonding pads) PD are formed on the front surface CPt of the semiconductor chip CHP, and the plurality of pads PD are formed along each of the sides of the front surface CPt in the present embodiment. Although illustration is omitted, a plurality of semiconductor elements (circuit elements) are formed on the main surface of the semiconductor chip CHP (more specifically, a semiconductor-element formation region provided on the top surface of the base material (semiconductor substrate) of the semiconductor chip CHP). The plurality of pads PD are electrically connected to the semiconductor elements via wiring (illustration is omitted) formed in a wiring layer arranged inside the semiconductor chip CHP (more specifically, arranged between the top surface CPt and the not-shown semiconductor-element formation region).

The semiconductor chip CHP (more specifically, the base material of the semiconductor chip CHP) is made of, for example, silicon (Si). An insulating film which covers the base material and wiring of the semiconductor chip CHP is formed on the front surface CPt, and each surface of the plurality of pads PD is exposed from an opening formed in the insulating film. The pad PD is made of a metal, and is made of, for example, aluminum (Al) or an alloy layer mainly made of aluminum (Al) in the present embodiment.

As shown in FIG. 4, in periphery of the semiconductor chip CHP (more specifically, in periphery of the die pad DP), the plurality of leads LD each made of, for example, copper (Cu) as similar to the die pad DP are arranged. The plurality of pads (bonding pads) PD formed on the front surface CPt of the semiconductor chip CHP are electrically connected to the plurality of leads LD via the plurality of wires (electrically-conductive members) BW, respectively. The wire BW is made of, for example, gold (Au) or copper (Cu), one end of the wire BW is bonded with the pad PD, and the other end thereof is bonded with a bonding region of the top surface LDt of the lead LD. As shown in FIG. 4 and FIG. 5, a metal film (plating, plating film) BM is formed on the bonding region of the top surface LDt of the leads LD (on the part connected with the wire BW). The metal film BM is made of, for example, a metal containing silver (Ag) as a main component. As a modification example of the present embodiment, the wire BW can be directly bonded with the bonding region of the top surface LDt of the lead LD without forming the metal film BM shown in FIG. 5. By forming the metal film BM made of silver (Ag) on the surface of the bonding region (wire bonding region) of the lead LD (inner lead part) as similar to the present embodiment, the connection strength at the connected part between the wire BW and the lead LD can be improved.

As shown in FIG. 5, each of the leads LD has the top surface (wire-bonding surface, lead top surface) LDt which is sealed with the sealing body MR, and the bottom surface (mounting surface, lead bottom surface) LDb which is positioned on the opposite side of the top surface LDt and exposed from the sealing body MR at the bottom surface MRb of the sealing body MR. The lead LD has the side surface LDs on the outer peripheral side. As described above, the lead LD has the bottom surface (step surface, intermediate surface) LDg continued to the side surface LDs and positioned between the bottom surface LDb and the top surface LDt. The side surface LDs has the side surface LDsg therein continued to the bottom surface LDb and the bottom surface LDg.

As shown in FIG. 4, the plurality of suspension leads TL are connected (coupled) to the die pad DP. One end of each of the plurality of suspension leads TL is connected to the corner part (corner) of the die pad DP formed in the quadrangle when seen in a plan view. The other end of each of the plurality of suspension leads TL is extended toward the corner part MRk of the sealing body MR, and is branched into two directions in the vicinity of the corner part MRk.

As shown in FIG. 6, apart (sealed part TL1) of the suspension lead TL is subjected to a half etching process from the bottom surface side, and the bottom surface side is sealed with the sealing body MR. In other words, a thickness from a top surface TLt of the suspension lead TL to a bottom surface TLb1 thereof is larger than a thickness from the top surface LDt of the lead LD to the bottom surface LDb thereof shown in FIG. 5. Therefore, as shown in FIG. 2A, when viewed from the bottom surface MRb side of the sealing body MR, the suspension lead TL is not exposed from the bottom surface MRb of the sealing body MR. Thus, the suspension lead TL can be fixed to the sealing body MR by sealing the part (sealed part TL1) of the suspension lead TL with the sealing body MR, and therefore, the suspension lead TL can be prevented from falling from the sealing body MR.

However, as shown in FIG. 2A, the step part GP is formed over the entire periphery of the bottom surface MRb of the sealing body MR. Therefore, a part (the exposed part TL2 shown in FIG. 6) of the suspension lead TL also configures a part of the step part GP. In the exposed part TL2 of the suspension lead TL, the bottom surface side of the suspension lead TL is cut in the formation of the step part GP so that the bottom surface TLb2 of the suspension lead TL is exposed from the sealing body MR. The metal film SD is formed on the bottom surface TLb2 of the suspension lead TL.

Also, as described above, each of the suspension leads TL is formed by the half etching process from the bottom surface side. Therefore, as the height of the top surface TLt of the suspension lead TL shown in FIG. 6, the sealed part TL1 and the exposed part TL2 are the same as each other in the height. The height of the top surface TLt of the suspension lead TL is the same as the height of the top surface DPt of the die pad DP. The height of the top surface TLt of the suspension lead TL shown in FIG. 6 is the same as the height of the top surface LDt of the lead LD shown in FIG. 5.

<Method of Mounting Semiconductor Device>

Figure 7:
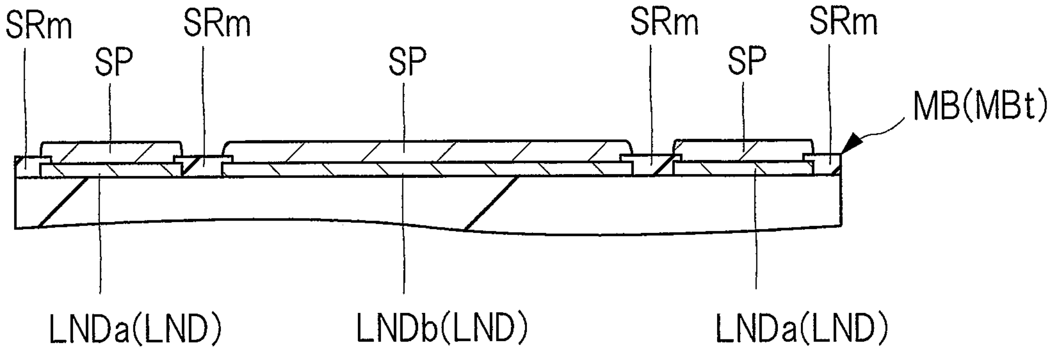
FIG. 7 is an enlarged cross-sectional view showing a state in which a bonding material is applied on a mounting surface of a mounting board on which the semiconductor device shown in FIG. 5 is mounted.
Figure 8:
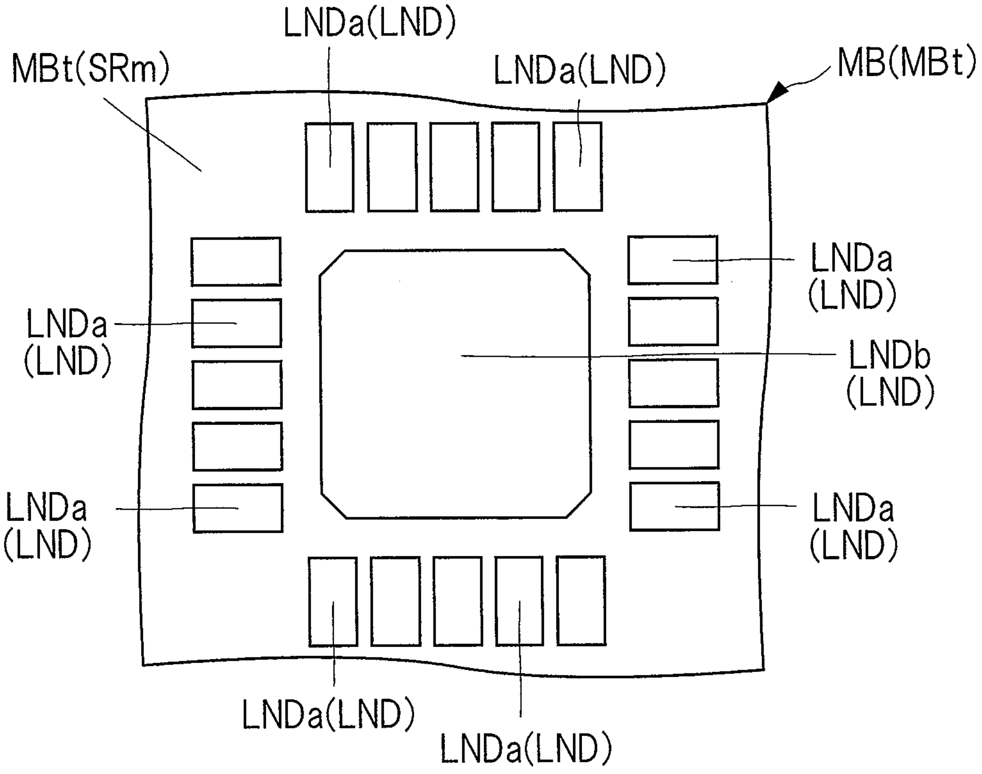
FIG. 8 is an enlarged plan view showing the mounting surface side of the mounting board shown in FIG. 7.
Figure 9:
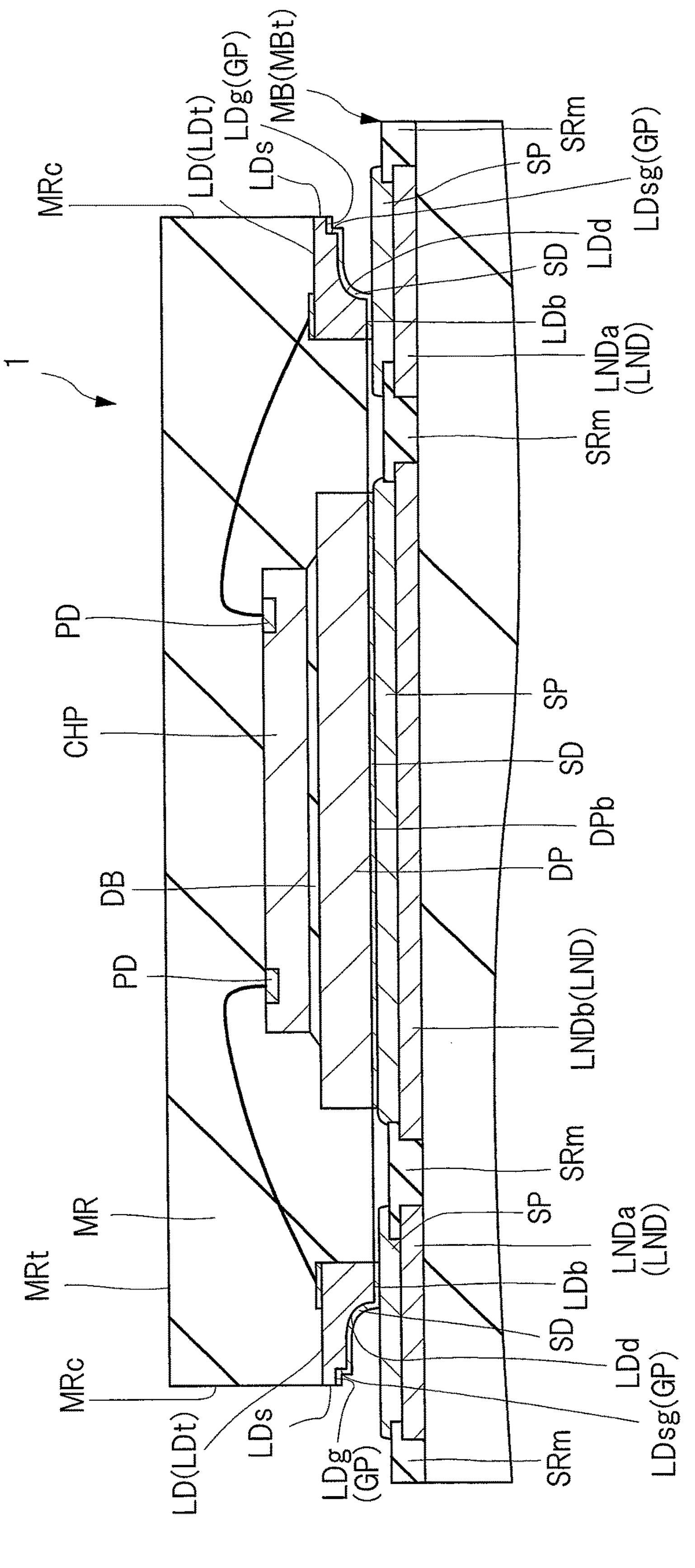
FIG. 9 is an enlarged cross-sectional view showing a state in which the semiconductor device shown in FIG. 5 is arranged on the mounting board shown in FIG. 7.
Figure 10:
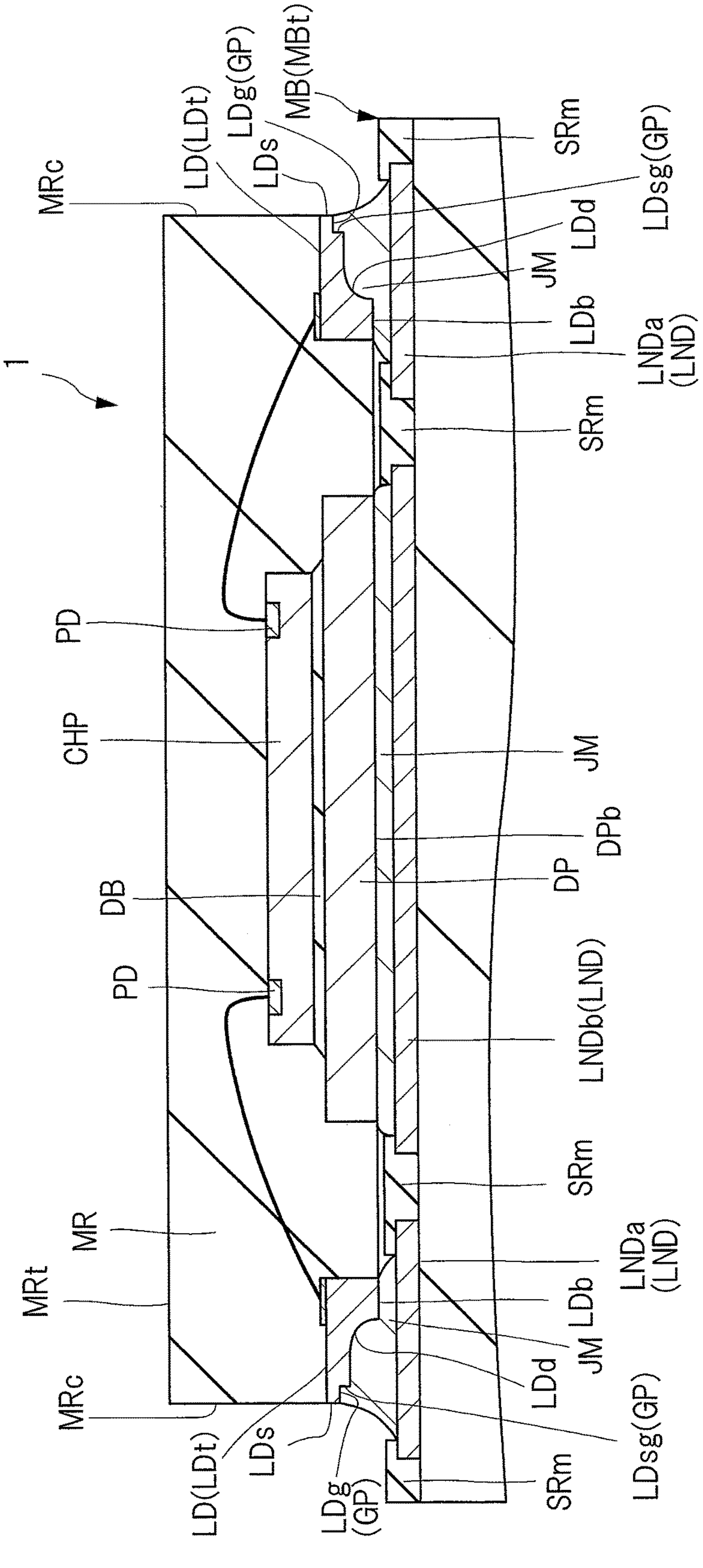
FIG. 10 is an enlarged cross-sectional view showing a state in which leads and lands are bonded to each other by heating the bonding material shown in FIG. 9.

Next, an example of a method of mounting the semiconductor device, which has been explained by using FIG. 1 to FIG. 5, on the mounting board will be explained. FIG. 7 is an enlarged cross-sectional view showing a state in which a bonding material is applied onto the mounting surface of the mounting board on which the semiconductor device shown in FIG. 5 is to be mounted. FIG. 8 is an enlarged plan view showing the mounting surface side of the mounting board shown in FIG. 7. FIG. 9 is an enlarged cross-sectional view showing a state in which the semiconductor device shown in FIG. 5 is arranged on the mounting board shown in FIG. 7, and FIG. 10 is an enlarged cross-sectional view showing a state in which leads and lands are bonded with each other by heating the bonding material shown in FIG. 9.

Note that FIG. 8 shows a state before the bonding material SP shown in FIG. 7 is applied in order to show the lands LNDa on the mounting board MB side.

In the method of mounting the semiconductor device explained in the present embodiment, first, the mounting board MB shown in FIG. 7 and FIG. 8 is provided (in a board providing process). The mounting board (mother board, wiring board) MB has a top surface (mounting surface) MBt which is an electronic-part mounting surface, and the semiconductor device 1 explained by using FIG. 1 to FIG. 5 is mounted on the top surface MBt. The plurality of lands (terminals) LND which are the terminals on the mounting board side are arranged on the top surface MBt. In the example shown in FIG. 8, the mounting board MB is provided with the plurality of lands (lead connecting terminals) LNDa and a land (die-pad connecting terminal) LNDb. While the top surface MBt is covered with an insulating film (solder resist film) SRm, the insulating film SRm has an opening formed at the position overlapped with the plurality of lands LND, and the plurality of lands LND are exposed from the insulating film SRm at the opening.

Next, as shown in FIG. 7, the bonding material SP is arranged (applied) onto each of the plurality of lands LND provided on the top surface MBt of the mounting board MB (in a bonding-material arranging process). In the example shown in FIG. 7, the bonding material SP is a solder material called solder cream (or solder paste). The solder cream contains a solder component serving as an electrically-conductive bonding material and a flux component which activates the surface of the bonding part, and is in a form of paste at an ordinary temperature. As a method of applying the bonding material, the bonding material can be applied by, for example, screen printing. In the present process, the bonding material SP is arranged on each of the plurality of lands LND. In the example shown in FIG. 2A, in the semiconductor device 1, each of the plurality of leads LD and the die pads DP is exposed from the bottom surface MRb of the sealing body MR, and they are connected to the lands LND of the mounting board MB. Therefore, in the present process, the bonding material SP shown in FIG. 7 is applied onto each of the plurality of lands LNDa and the lands LNDb shown in FIG. 8.

Next, as shown in FIG. 9, the semiconductor device 1 is arranged on the top surface MBt of the mounting board MB (in a package mounting process). In the present process, position alignment is performed so that the positions of the terminals of the semiconductor device 1 and the positions of the lands LND on the mounting board MB are overlapped with each other, and the semiconductor device 1 is arranged on the top surface MBt, which is the mounting surface of the mounting board MB. More specifically, in the present process, the die pad DP of the semiconductor device 1 is arranged on the land LNDb of the mounting board MB, and the plurality of leads LD are arranged on the plurality of lands LNDa, respectively.

Then, a heating process is performed in a state in which the semiconductor device 1 is arranged on the mounting board MB, and each of the plurality of leads LD and the plurality of lands LNDa is bonded via a bonding material JM as shown in FIG. 10 (in a reflow process). The bonding material JM shown in FIG. 10 is an electrically-conductive member (solder material) integrally formed of the solder component contained in the solder material SP shown in FIG. 9 and the solder component of the metal film SD. One surface of the bonding material JM is bonded with the bottom surface LDb of the lead LD, and the other surface of the bonding material JM is bonded with the exposed surface of the land LNDa. That is, in the present process, the plurality of leads LD and the plurality of lands LNDa are electrically connected to each other via the bonding material JM, respectively.

On the land LNDb which is the die-pad connecting terminal, one surface of the bonding material JM is bonded with the bottom surface DPb of the die pad DP, and the other surface of the bonding material JM is bonded with the exposed surface of the land LNDb. That is, in the present process, a heat-dissipation path connected from the die pad DP to the mounting board MB is formed. If the die pad DP is used as a terminal for, for example, supplying the reference potential, the die pad DP and the land LNDb are electrically connected to each other via the bonding material JM in the present process.

In the present process, when the bonding material SP shown in FIG. 9 is heated, the flux component contained in the bonding material SP flows out and activates the metal film SD and the exposed surface of the land LND. In this manner, the solder component contained in the bonding material SP, the metal film SD, and the lands LND become easily wettable. By further heating them, a temperature reaches the melting point of the solder component so as to melt the solder component.

At this point, the metal film SD and the lands LND are in the easily wettable state with the solder (a high solder wettable characteristic state), and therefore, the solder component wetly spreads on the exposed surfaces of the lands LND and the formation surface of the metal film SD. In this manner, as shown in FIG. 10, the bonding material JM wetly spreads over the entire exposed surfaces of the lands LND. Also, the bonding material JM wetly spreads over the entire bottom surface DPb, which is the exposed surface of the die pad DP. Further, the bonding material JM wetly spreads over the bottom surface LDb among the exposed surfaces of the leads LD and the step part GP.

On the other hand, as shown in FIG. 9, the metal film SD is not formed on the side surfaces LDs, and therefore, the bonding material JM shown in FIG. 10 is generally difficult to wetly spread on the side surfaces LDs.

Here, the mounting strength of the semiconductor device 1 will be explained. After the semiconductor device 1 is mounted on the mounting board MB, temperature cycle load is applied to the semiconductor device 1 under a usage environment. The temperature cycle load is the load which is generated when an environment temperature of a mounting structure having the semiconductor device 1 mounted on the mounting board MB is repeatedly changed. As the temperature cycle load, for example, the stress which is generated due to a difference in a linear expansion coefficient among the members of configuring the mounting structure is cited. This stress tends to concentrate on the peripheral part of the mounting surface of the semiconductor device 1. Therefore, in order to extend temperature cycle life (the number of times of temperature cycles taken until the connecting part is damaged by the temperature cycle load), it is preferred to improve the strength of the connecting parts between the leads LD and the lands LND arranged in the peripheral part of the mounting surface.

The semiconductor device 1 of the present embodiment is provided with the step part GP, which is continued to the side surfaces LDs, on the peripheral part side of the mounting surfaces of the leads LD. In this manner, the thickness of the bonding material JM can be increased immediately below each of the side surfaces LDs on which the concentration of the stress generated by the temperature cycle tends to be the largest. Therefore, the strength of the part on which the stress particularly tends to concentrate among the bonding parts between the leads LD and the lands LNDa can be improved, so that the connection reliability of the semiconductor device 1 can be improved.

As explained by using FIG. 3, each of the leads LD of the present embodiment has the concave part LDd, which is formed so that a part of the side surface LDsg of the step part GP is opened. In other words, in the lead LD, a plurality of surfaces intersecting with each other are bonded with the bonding material JM (see FIG. 10). In the example shown in FIG. 3, the bottom surface LDg, the side surface LDsg continued to the bottom surface LDg, the curved surface configuring the concave part LDd, and the bottom surface LDb of the lead LD are bonded with the bonding material JM shown in FIG. 10. Therefore, the bonding strength between the bonding material JM and the lead LD can be improved.

According to the present embodiment in comparison with a simple case of formation of only the step part GP, the contact area between the bonding material JM (see FIG. 10) and the lead LD can be increased. Therefore, as an effect accompanied with the increase of the contact area between the bonding material JM and the lead LD, the bonding strength between the lead LD and the bonding material JM can be improved.

More particularly, when the semiconductor device 1 is downsized, a dimension of each of the leads LD is decreased, and therefore, the area of the bottom surface LDb serving as the mounting surface is decreased. According to the present embodiment, even if the area of the bottom surface LDb of the lead LD is decreased by the downsizing, decrease in the mounting strength can be suppressed by providing the concave part LDd and the step part GP. In other words, since the area of the bottom surface LDb of the lead LD can be decreased by improving the mounting strength of the lead LD, the semiconductor device 1 can be downsized.

In the method of mounting the semiconductor device of the present embodiment, then, the connecting parts between the semiconductor device 1 which is mounted on the mounting board MB and the mounting board MB, in other words, the state of bonding by the bonding material JM is inspected (in an inspection process). In the present process, for example, the appearance of the connection state can be visually checked from the top surface side (the top surface MRt side of the sealing body MR shown in FIG. 10) of the semiconductor device 1. However, from a viewpoint of efficient checking, it is preferred to use an image processing for the inspection.

Figure 11:
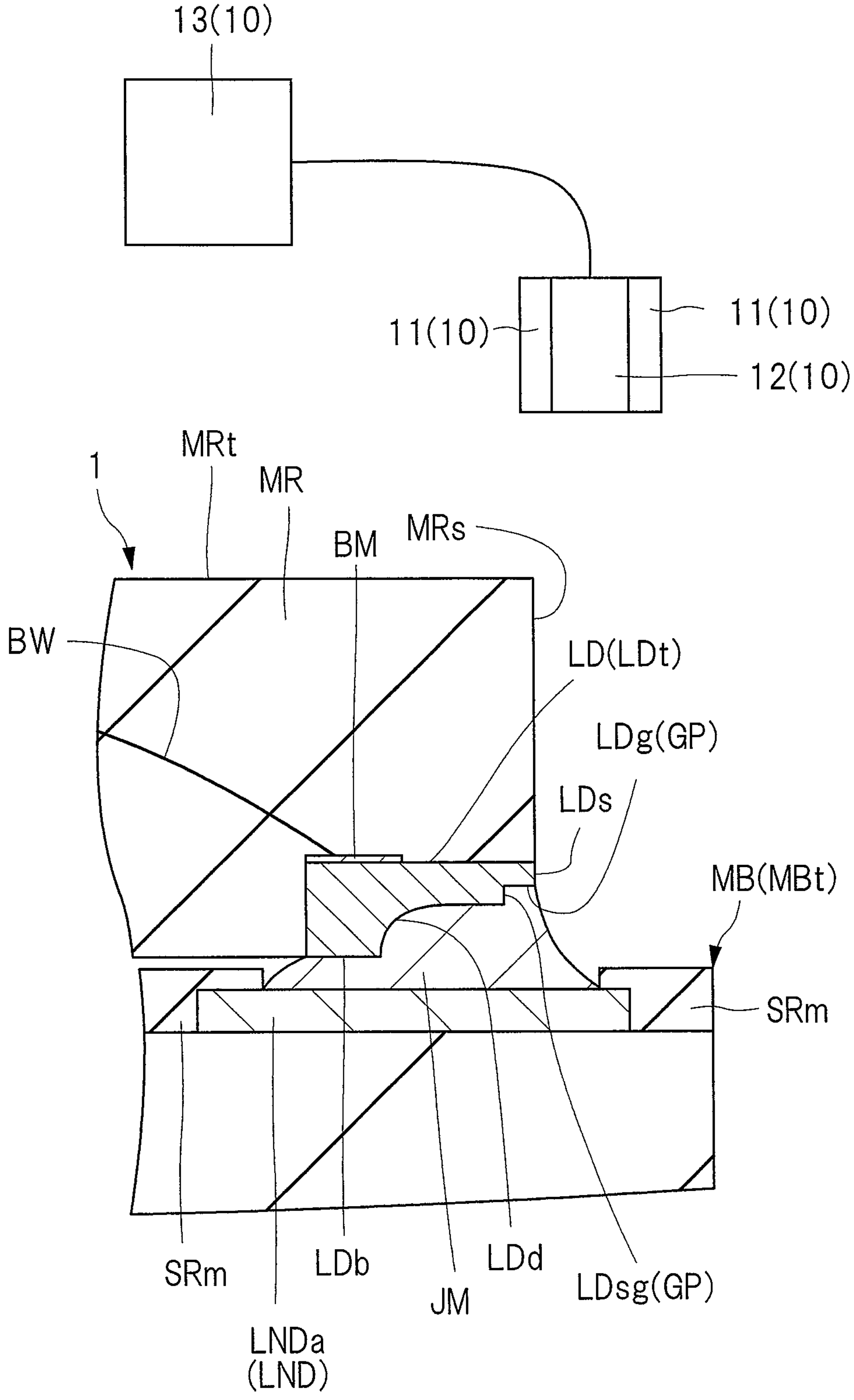
FIG. 11 is an explanatory diagram schematically showing a configuration of an appearance inspection process of a mounting structure shown in FIG. 10.

For example, the inspection can be performed by using an inspection apparatus (appearance inspection apparatus) 10 schematically shown in FIG. 11. FIG. 11 is an explanatory diagram schematically showing a configuration of the appearance inspection process of the mounting structure shown in FIG. 10.

The inspection apparatus 10 is provided with: a light irradiation unit 11 which irradiates an inspection target part with light; an imaging unit 12 which detects and images the light reflected on the inspection target part; and a control unit 13 which is electrically connected to the imaging unit 12. The control unit 13 includes, for example: an image processing unit which performs a processing (image processing) to the data obtained by the imaging unit 12; a determining unit which evaluates the data after the image processing and determines whether the data passes or not; and others. As described above, the bonding state by the bonding material JM is particularly inspected in the present process, and therefore, the light irradiation unit 11 is arranged on the top surface side (the top surface MRt side of the sealing body MR) of the semiconductor device 1, and light is radiated toward the bonding material JM. The imaging unit 12 is also arranged on the top surface side (the top surface MRt side of the sealing body MR) of the semiconductor device 1, and the light reflected on the bonding material JM is detected and imaged.

Here, if the step part GP and the concave part LDd are not formed at the lead LD, it is difficult to adjust the amount of the bonding material JM. Therefore, if the amount of the bonding material JM is increased from the viewpoint of improving the bonding strength between the lead LD and the land LNDa, a part of the bonding material JM tends to have such a shape as swelling upward in the outside of the lead LD. However, in this case, the following problem arises.

That is, as described above, the bonding material JM in the outside of the lead LD is imaged in the inspection process, and the obtained image data is used for determining whether the data passes or not. However, if the bonding material JM is swelled upward in the outside of the lead LD, the reflecting direction of the light becomes unstable depending on a shape of the swelled part. Therefore, the amount of the reflected light which reaches the imaging unit 12 is reduced, which causes erroneous determination.

On the other hand, in the case of the semiconductor device 1 of the present embodiment, as shown in FIG. 10, the step part GP and the concave part LDd are provided on the mounting surface side of the lead LD. Therefore, a space in which the bonding material JM is buried is generated between the step part GP and the land LNDa and between the concave part LDd and the land LNDa. And, by burying the bonding material JM into the space formed by the concave part LDd and the step part GP, the part of the bonding material JM is difficult to have such a shape as swelling upward, and, for example, the exposed surface tends to have a flat or slightly-hollowed fillet shape as shown in FIG. 10 and FIG. 11.

As shown in FIG. 11, if the exposed surface of the bonding material JM has the flat or slightly-hollowed fillet shape, the reflecting direction of the light radiated to the bonding material JM is stabilized. Therefore, the amount of the reflected light that reaches the imaging unit 12 is increased, so that an accurate determination process can be performed.

In this manner, according to the present embodiment, the temperature cycle life of the semiconductor device 1 can be extended by improving the bonding strength of the connection part by the bonding material JM. Thus, the reliability of the semiconductor device 1 can be improved. As shown in FIG. 11, according to the present embodiment, since the exposed surface of the bonding material JM has the flat or slightly-hollowed fillet shape, failure in the mounting can be easily detected. As a result, the mounting reliability of the semiconductor device 1 can be improved.

<Method of Manufacturing Semiconductor Device>

Figure 12:
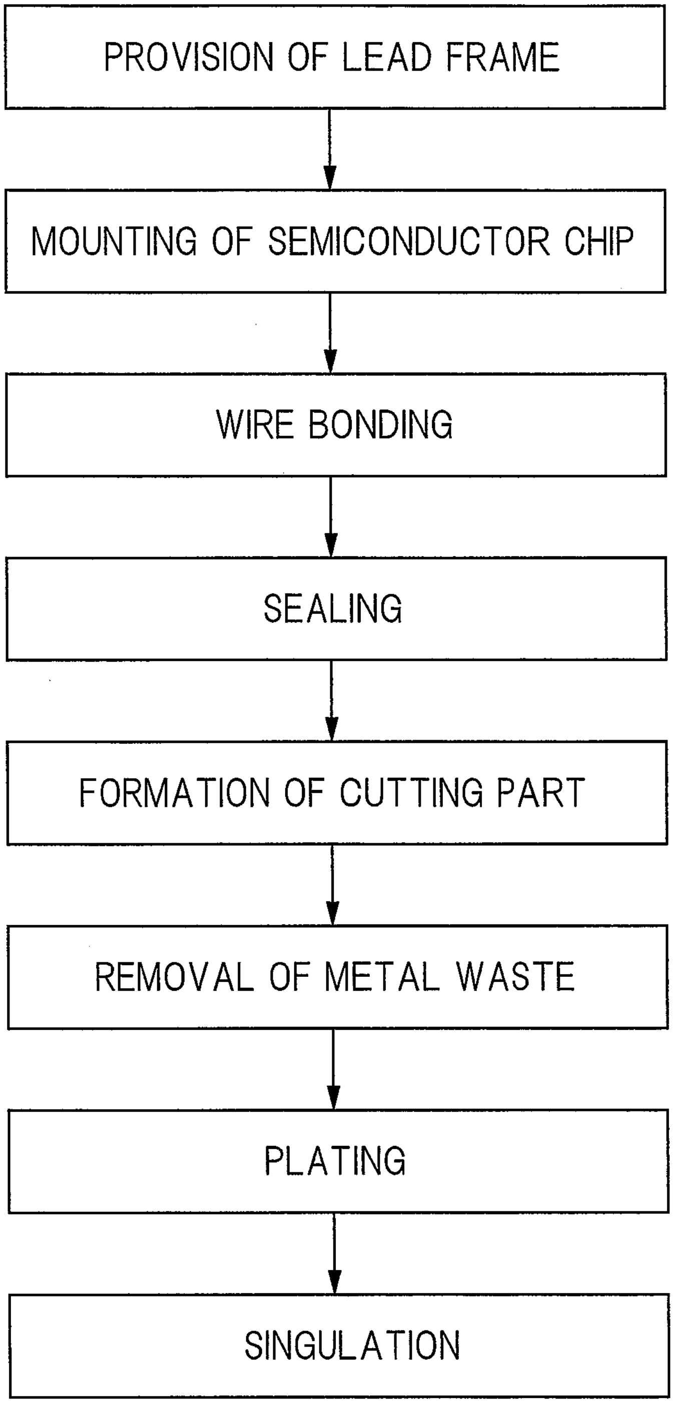
FIG. 12 is an explanatory diagram showing an assembly flow of the semiconductor device shown in FIG. 1.

Next, the method of manufacturing the semiconductor device 1 shown in FIG. 1 to FIG. 11 will be explained. The semiconductor device 1 of the present embodiment is manufactured along an assembly flow shown in FIG. 12. FIG. 12 is an explanatory diagram showing the assembly flow of the semiconductor device shown in FIG. 1.

Figure 13:
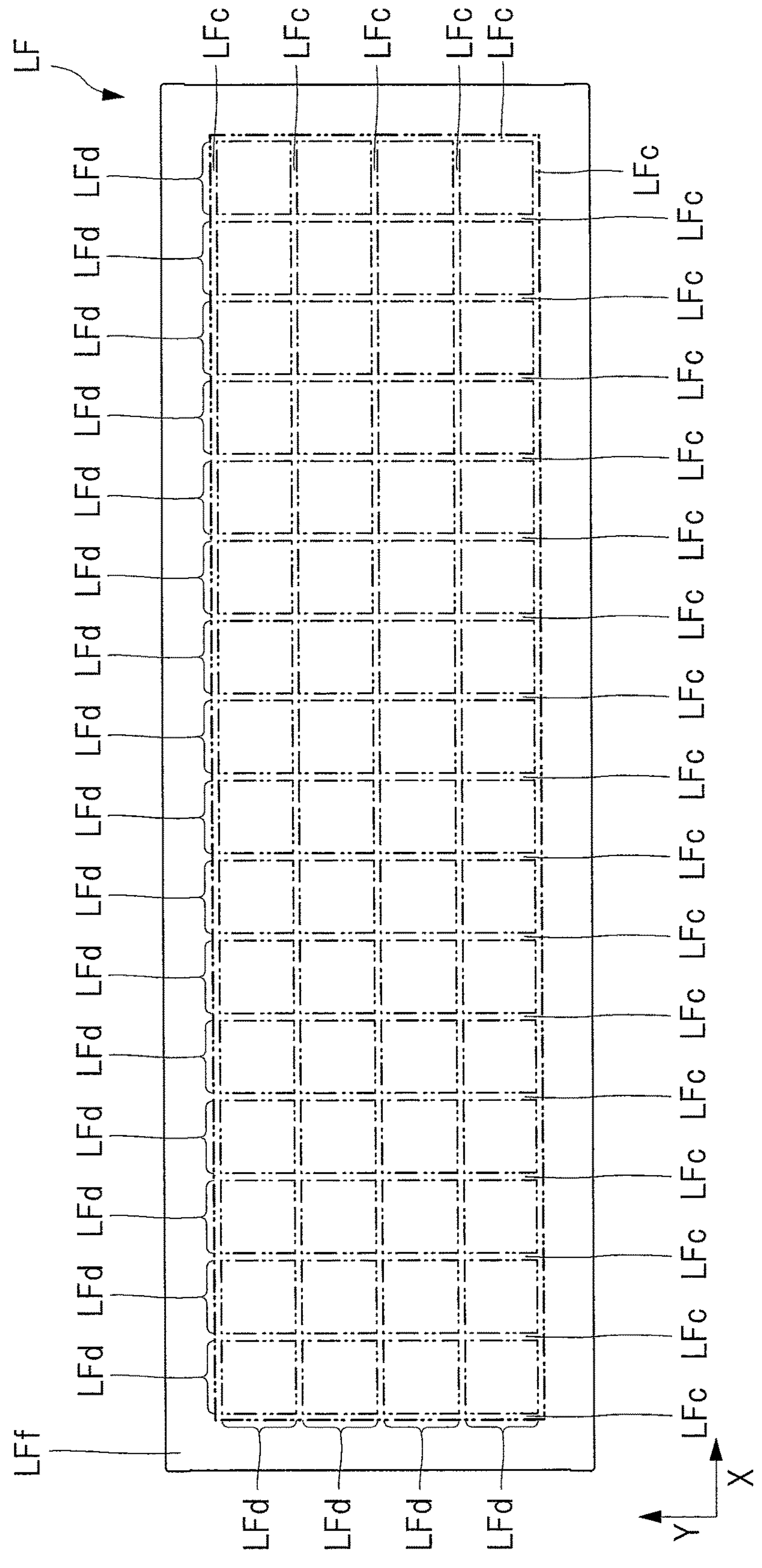
FIG. 13 is a plan view showing an entire structure of a lead frame provided in a lead-frame providing process of FIG. 12.
Figure 14:
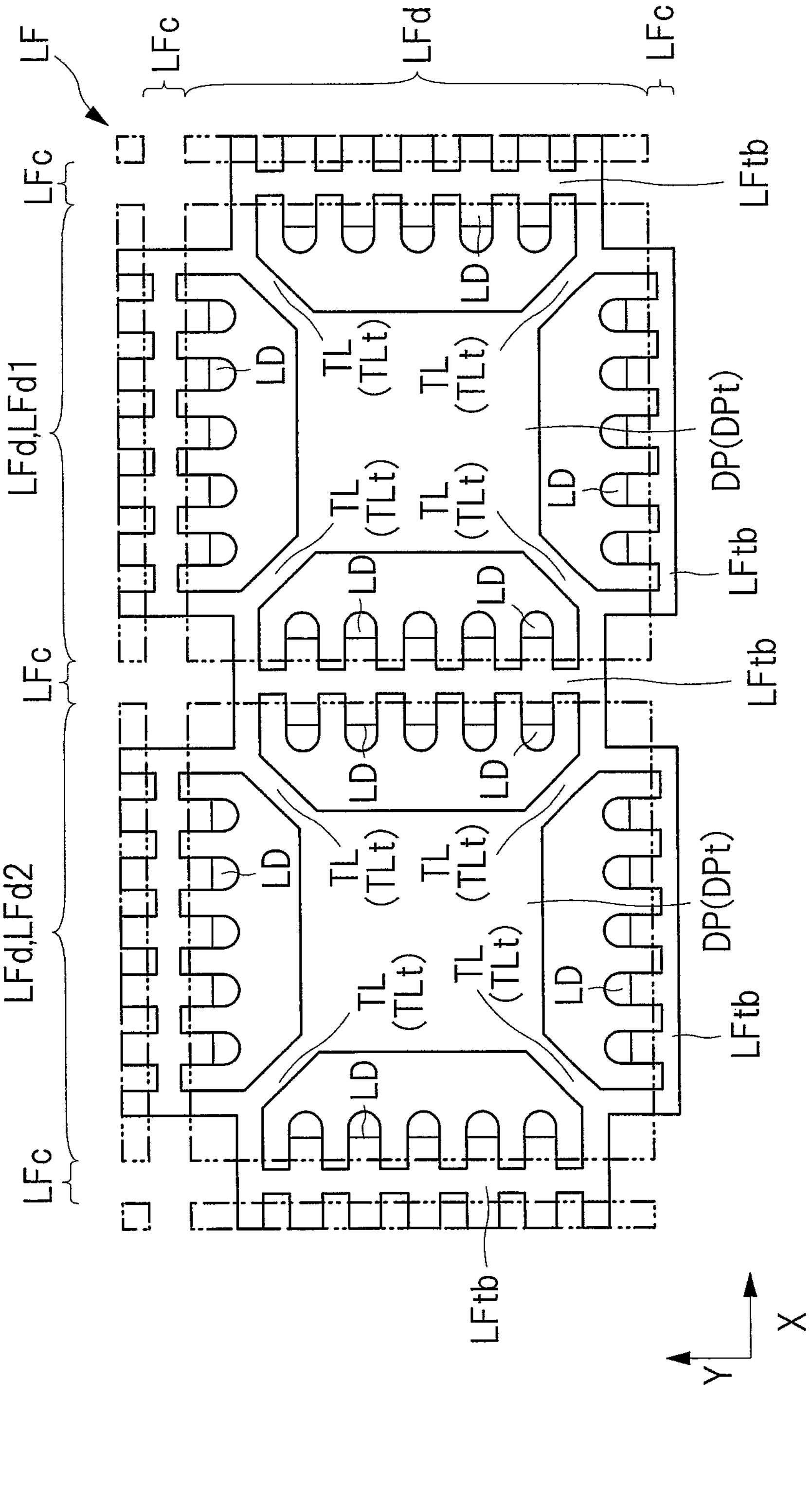
FIG. 14 is an enlarged plan view in periphery of two device regions among the plurality of device regions shown in FIG. 13.
Figure 15:
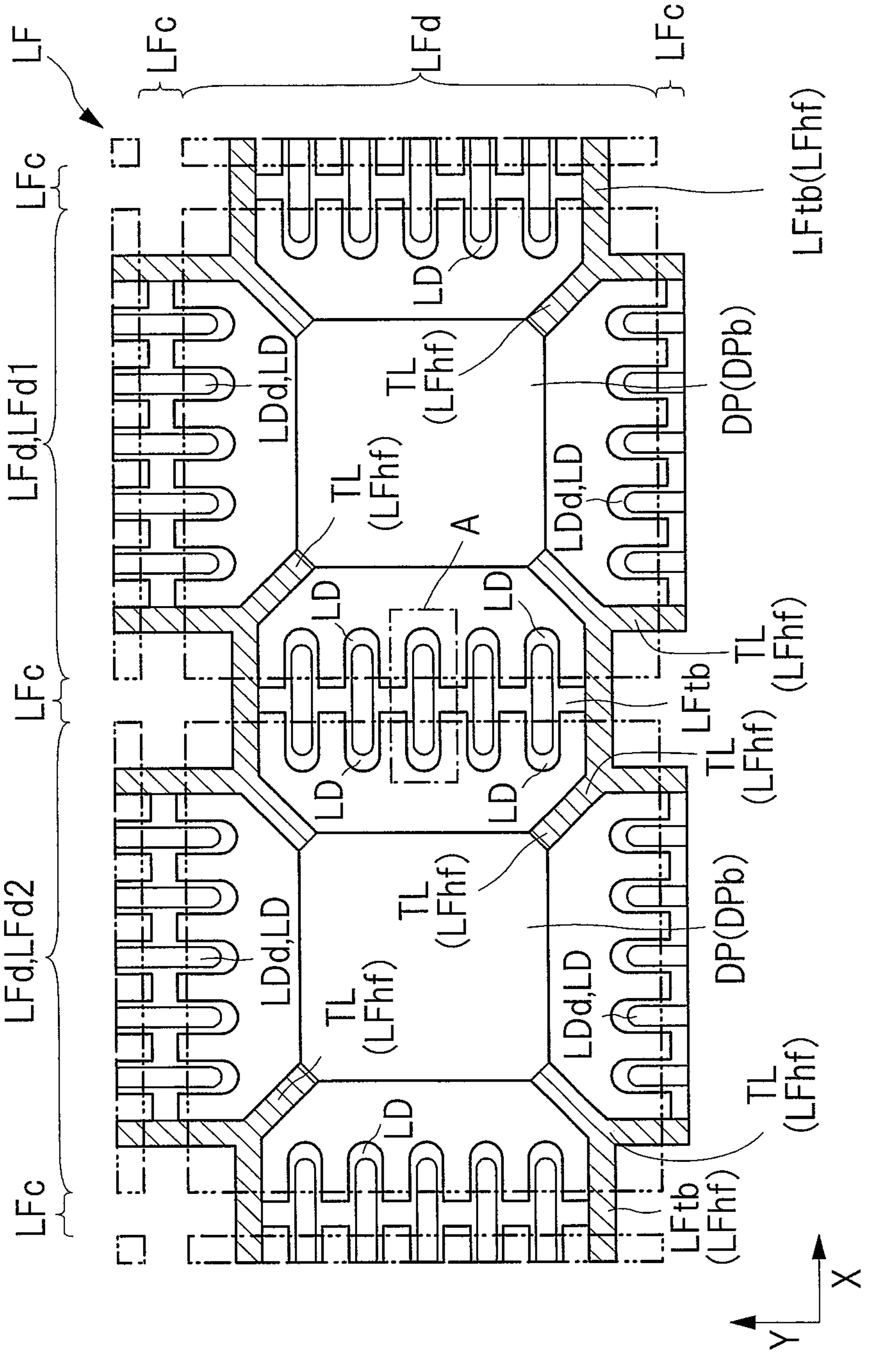
FIG. 15 is an enlarged plan view showing a mounting surface-side plane of the lead frame shown in FIG. 14.
Figure 16:
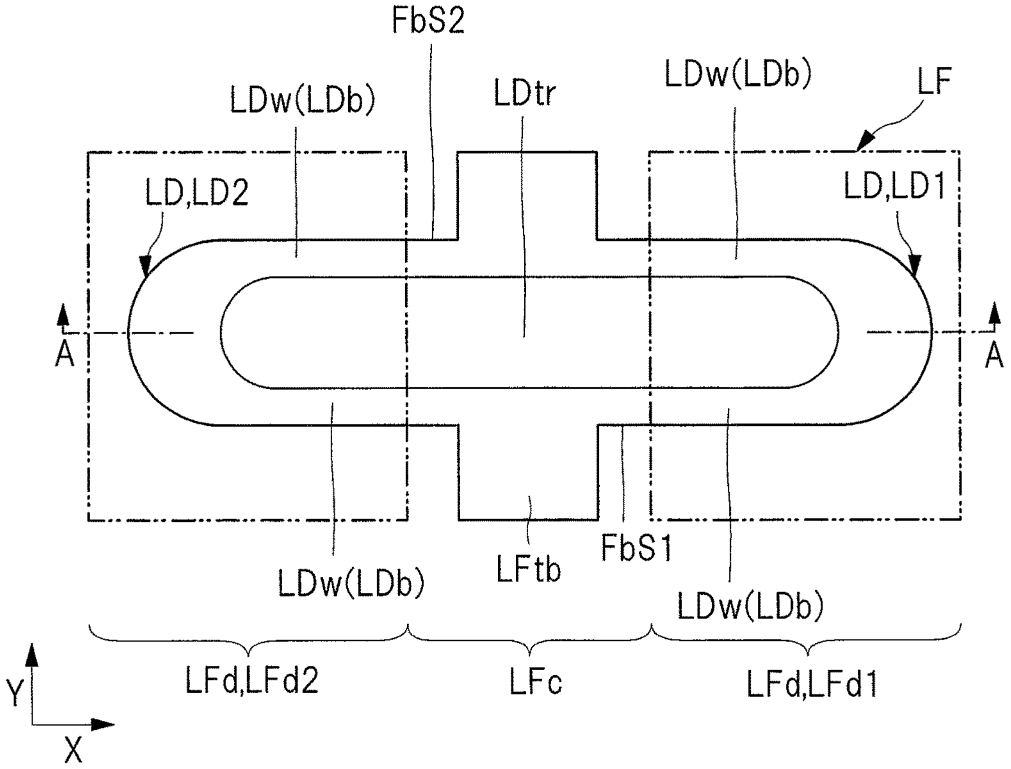
FIG. 16 is an enlarged plan view of a part "A" of FIG. 15.
Figure 17:
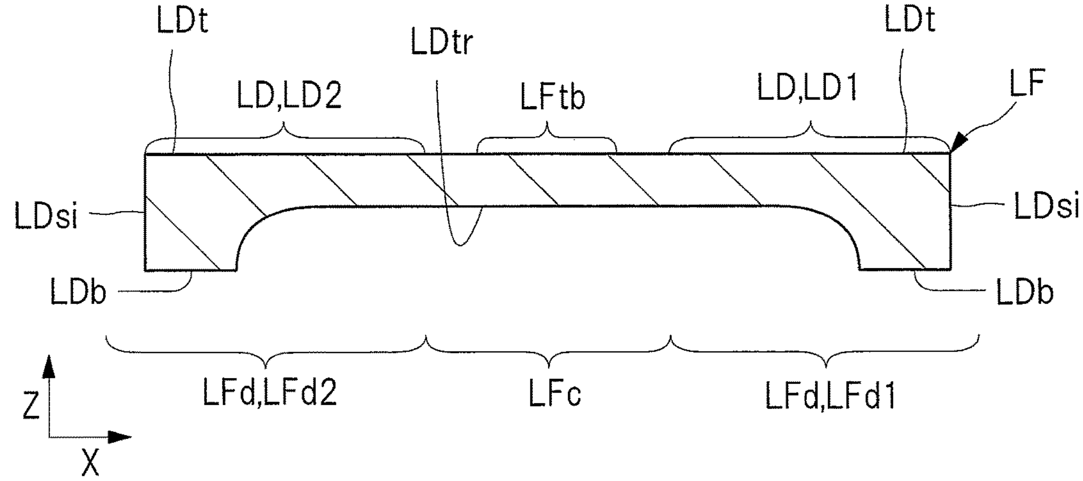
FIG. 17 is an enlarged cross-sectional view taken along a line A-A of FIG. 16.

1. Lead-Frame Providing Process;

First, as a lead-frame providing process shown in FIG. 12, a lead frame LF as shown in FIG. 13 is provided. FIG. 13 is a plan view showing the entire structure of the lead frame provided in the lead-frame providing process of FIG. 12, and FIG. 14 is an enlarged plan view in periphery of two device regions among a plurality of device regions shown in FIG. 13. FIG. 15 is an enlarged plan view showing a plane of the lead frame shown in FIG. 14 on the mounting surface side, and FIG. 16 is an enlarged plan view of a part "A" of FIG. 15. FIG. 17 is an enlarged cross-sectional view taken along a line A-A of FIG. 16.

The lead frame LF provided in the present process is provided with a plurality of device regions (product formation regions) LFd inside an outer frame LFf. In the example shown in FIG. 13, the lead frame LF has total 64 device regions LFd in which 16 device regions are arranged in a row direction and 4 device regions LFd are arranged in a column direction in a matrix form. The lead frame LF is made of a metal, and is made of, for example, copper (Cu) or a laminated metal film obtained by forming a metal film (illustration is omitted) made of, for example, nickel (Ni) on a surface of a base material made of copper (Cu) in the present embodiment.

Between the device regions LFd, a dicing region LFc surrounding the periphery of each of the device regions LFd is arranged. The dicing regions LFc are the regions to be cut in a singulation process described later (see FIG. 12). As shown in FIG. 14, the dicing regions LFc are formed so as to surround the peripheries of the plurality of leads LD. In the dicing regions LFc, tie bars (lead coupling parts) LFtb are arranged so as to surround the peripheries of the device regions LFd. The tie bar LFtd is integrally formed with the plurality of leads LD and the outer frame frame (frame body) LFf shown in FIG. 13.

As shown in FIG. 14, at a center part of each of the device regions LFd, the die pad DP which is shaped in a quadrangle when seen in a plan view is formed. The die pad DP is supported by the outer frame LFf shown in FIG. 13 via the plurality of suspension leads TL and the tie bars LFtb. More specifically, the suspension leads TL are connected to four corner parts of the die pad DP, respectively. Each of the suspension leads TL is extended toward the corner part of the device region LFd, is branched into two in the periphery of the corner part, and is connected to the tie bar LFtb. Each of the plurality of suspension leads TL of each device region LFd is coupled to the tie bar LFtb in the dicing region LFc. In the device region LFd provided in the outermost periphery, the outer frame LFf also functions as the tie bar LFtb shown in FIG. 14.

In the periphery of the die pad DP, the plurality of leads LD are formed between the plurality of suspension leads TL. Each of the plurality of leads LD is connected to the tie bar LFtb, which is arranged in the dicing region LFc which is outer with respect to the die pad DP than the plurality of leads LD.

In other words, the lead frame LF includes: the tie bar LFtb; the die pad DP arranged in the inner side of the tie bar LFtb when seen in a plan view; the plurality of suspension leads TL for coupling the die pad DP and the tie bar LFtb; and the plurality of leads LD arranged between the die pad DP and the tie bar LFtb.

In further other words, as shown in FIG. 14, the lead frame LF has the device regions LFd adjacent to each other, and the plurality of leads LD are provided in each of the device regions LFd. The tie bar LFtb is provided between one of the device regions LFd and the other device region LFd, and each of the plurality of leads LD is connected to the tie bar LFtb.

A partial region on the back side of the lead frame LF is previously subjected to a processing so that the plate thickness thereof is reduced. More specifically, as shown in FIG. 15 with hatching, the lead frame LF has thin parts (half etching parts) LFhf having a thinner plate thickness than those of the other regions. In the example shown in FIG. 15, the thin parts LFhf are formed by so-called half etching process which performs an etching process from the bottom surface side of the lead frame LF to an intermediate part in the thickness direction. The thicknesses of the suspension lead TL and the tie bar LFtb coupled to the suspension lead TL are thinner than the thicknesses of the other parts of the lead LD. For example, while the thickness of the die pad DP shown in FIG. 15 is about 0.2 mm, the thickness of the thin parts LFhf of the suspension lead TL and the tie bar LFtb is about 0.1 mm. As described above, by forming at least a part of the suspension lead TL so as to be thinner than the other parts (for example, the die pad DP), the bottom surface side of the suspension lead TL can be sealed in a sealing process shown in FIG. 12. Therefore, even if the die pad DP is exposed from the sealing body MR (see FIG. 1), falling out of the die pad DP from the sealing body MR can be suppressed.

As shown in FIG. 15, a trench part (dimple, concave part, hollow part) LDtr is formed on each of the plurality of leads LD formed in each device region LFd. More specifically, as shown in FIG. 16 and FIG. 17, the trench part LDtr is extended so as to bridge the two adjacent device regions LFd. In the example shown in FIG. 16 and FIG. 17, the trench part LDtr is formed so as to be extended along the X direction, which is the same as the extending directions of leads LD1 and LD2. In the present embodiment, in a cutting-part forming process shown in FIG. 12, the concave parts LDd explained by using FIG. 3 are formed on both sides of the trench part LDtr by dividing the trench part LDtr in the longitudinal direction (extending direction).

As shown in FIG. 16, the lead frame LF has a device region LFd1 and a device region LFd2, which are adjacent to each other via the dicing region LFc. The device region LFd1 has the lead LD1, and the device region LFd2 has the lead LD2. The lead LD1 and the lead LD2 are coupled to each other. In the example shown in FIG. 16, the lead LD1 and the lead LD2 are arranged at such positions as being opposed to each other via the tie bar LFtb, and are coupled to each other via the tie bar LFtb which is a lead coupling part. In the example shown in FIG. 16, the lead LD1 and the lead LD2 are linearly arranged along the X direction when seen in a plan view. The trench part LDtr is formed on the bottom surface LDb side of the lead LD1 and the lead LD2 so as to communicate the lead LD1 and the lead LD2 with each other. In the example shown in FIG. 16, the trench part LDtr is formed on the bottom surface LDb side of the lead LD1 and the LD2 so as to extend in the X direction across the tie bar LFtb.

When viewed from the bottom surface LDb side of the lead LD, the width of the trench part LDtr (in the example shown in FIG. 16, the opening length in the Y-direction in orthogonal to the X-direction in which each of the plurality of leads is extended) is narrower than the widths of the plurality of leads LD1 and lead LD2. The trench part LDtr is formed at a center part in the width direction of the lead LD.

In other words, when viewed from the bottom surface LDb side, the bottom surface LDb has the side FbS1 and the side FbS2, which are extended along the extending direction and are opposed to each other, and the trench part LDtr is formed between the side FbS1 and the side FbS2. Therefore, on both sides of the trench part LDtr in the width direction of the lead LD, the wall parts LDw having the inner side surfaces of the trench part LDtr are formed.

The trench part LDtr is formed at the center part in the longitudinal direction (extending direction) (the X direction in FIG. 16 and FIG. 17) of the lead LD1 and the lead LD2 coupled to each other. In other words, the longitudinal-direction (extending-direction) both ends of the trench part LDtr are terminated inside the bottom surfaces LDb of the leads LD1 and LD2.

Therefore, as shown in FIG. 17, on both sides of the trench part LDtr in the longitudinal direction (extending direction) of the lead LD, a thick part (part thicker than the trench part LDtr) having the top surface LDt and the bottom surface LDb of the lead LD is formed. In a wire bonding process shown in FIG. 12, the wires BW (see FIG. 5) are connected to the thick parts of the lead LD.

The position of the trench part LDtr when seen in a plan view can be expressed as follows. That is, as shown in FIG. 16, when seen in the plan view, the periphery of the trench part LDtr is continuously surrounded by the bottom surface LDb of the lead LD. In other words, the trench part LDtr is formed at a position that is not overlapped with the side surfaces of the lead LD.

The trench part LDtr shown in FIG. 16 can be formed by so-called half etching process which performs an etching process from the bottom surface side of the lead frame LF to an immediate part in the thickness direction. Thus, in manufacturing of the lead frame LF, the thin parts LFhf shown in FIG. 15 and the trench parts LDtr can be collectively formed by the half etching process.

Figure 18:
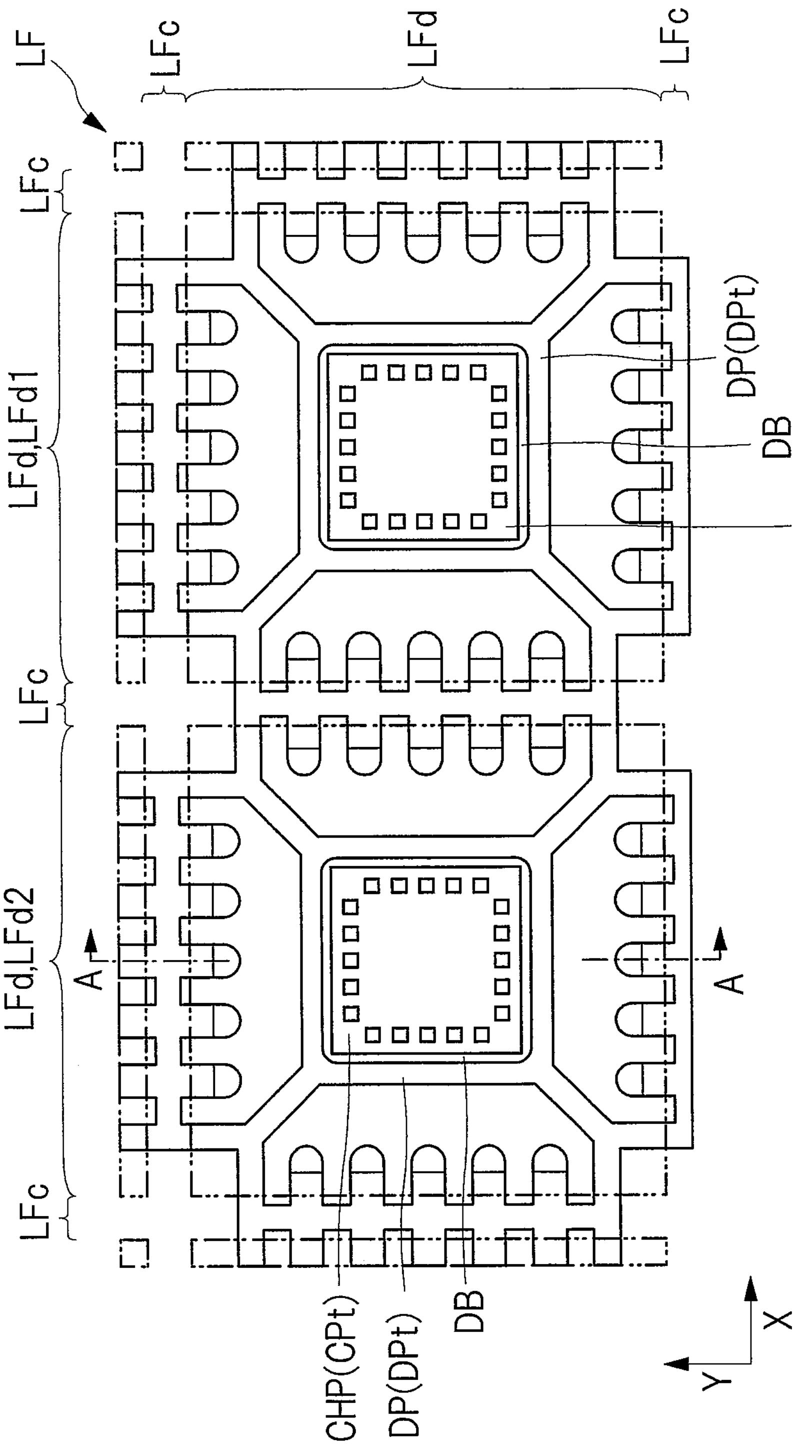
FIG. 18 is an enlarged plan view showing a state in which semiconductor chips are mounted on die pads shown in FIG. 14 via a bonding material.
Figure 19:
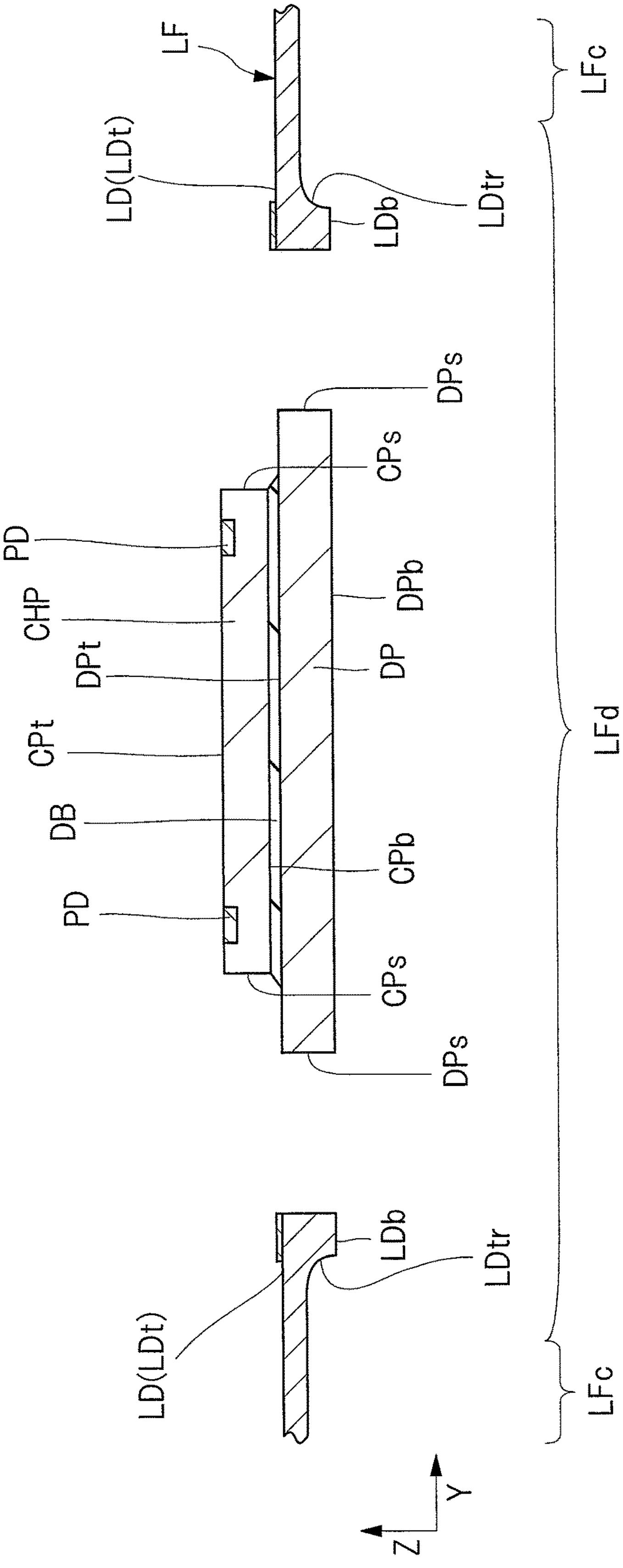
FIG. 19 is an enlarged cross-sectional view taken along a line A-A of FIG. 18.

2. Semiconductor-Chip Mounting Process;

Next, as a semiconductor-chip mounting process shown in FIG. 12, the semiconductor chip CHP is mounted on the die pad DP via the die-bond material DB as shown in FIG. 18 and FIG. 19. FIG. 18 is an enlarged plan view showing a state in which the semiconductor chip is mounted on the die pad shown in FIG. 14 via a bonding material, and FIG. 19 is an enlarged cross-sectional view taken along a line A-A of FIG. 18.

In the example shown in FIG. 19, the mounting is performed by a so-called face-up mounting method of performing the mounting in a state in which the back surface CPb (the surface on the opposite side of the top surface CPt the plurality of pads PD are formed) of the semiconductor chip CHP is opposed to the top surface DP of the die pad DP. As shown in FIG. 18, the semiconductor chip CHP is mounted on the center part of the die pad DP so that each side of the top surface CPt is arranged along each side of the die pad DP.

In the present process, the semiconductor chip CHP is mounted via, for example, the die-bond material DB which is an epoxy-based thermosetting resin, and the die-bond material DB is a paste material having fluidity before hardening (thermal hardening). When the paste material is used as the die-bond material DB as described above, first, the die-bond material DB is applied onto the die pad DP, and then, the back surface CPb of the semiconductor chip CHP is bonded to the top surface DPt of the die pad DP. Then, when the die-bond material DB is hardened (for example, heated up to a hardening temperature) after the bonding, the semiconductor chip CHP is fixed onto the die pad DP via the die-bond material DB as shown in FIG. 19.

In the present process, the semiconductor chip CHP is mounted on the die pad DP, which is provided in each of the plurality of device regions LFd, via the die-bond material DB. In the example shown in FIG. 18, the semiconductor chip CHP is mounted on the die pad DP provided in the device region LFd1, and a different semiconductor chip CHP is mounted on the die pad DP provided in the device region LFd2 adjacent to the device region LFd1.

In the present embodiment, note that the aspect of usage of the paste material made of the thermosetting resin as the die-bond material DB has been explained. However, various modification examples can be applied. For example, the semiconductor chip CHP can be mounted via not a resin but an electrically-conductive material such as solder.

Figure 20:
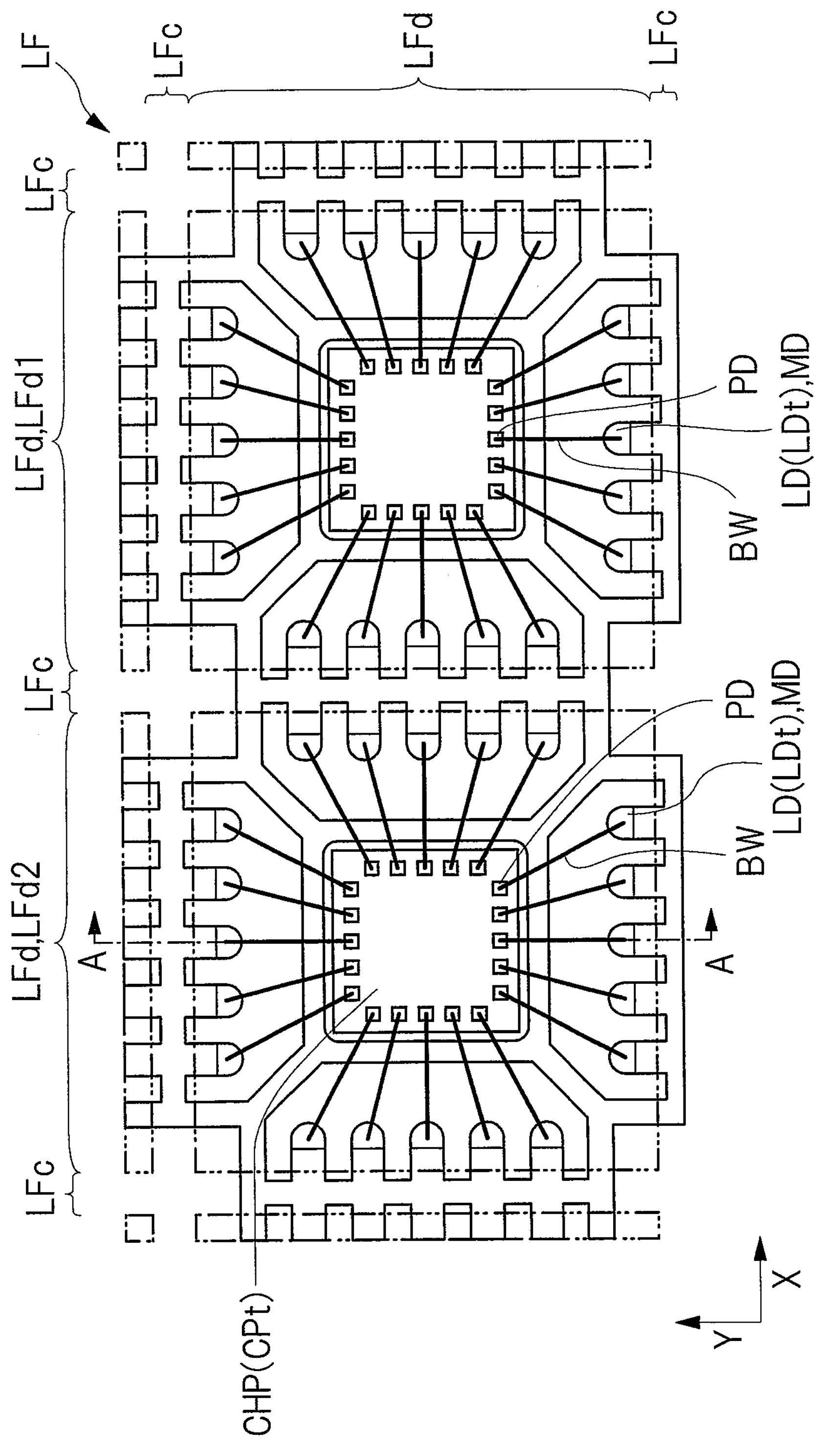
FIG. 20 is an enlarged plan view showing a state in which the semiconductor chips and the plurality of leads shown in FIG. 18 are electrically connected to each other via wires.
Figure 21:
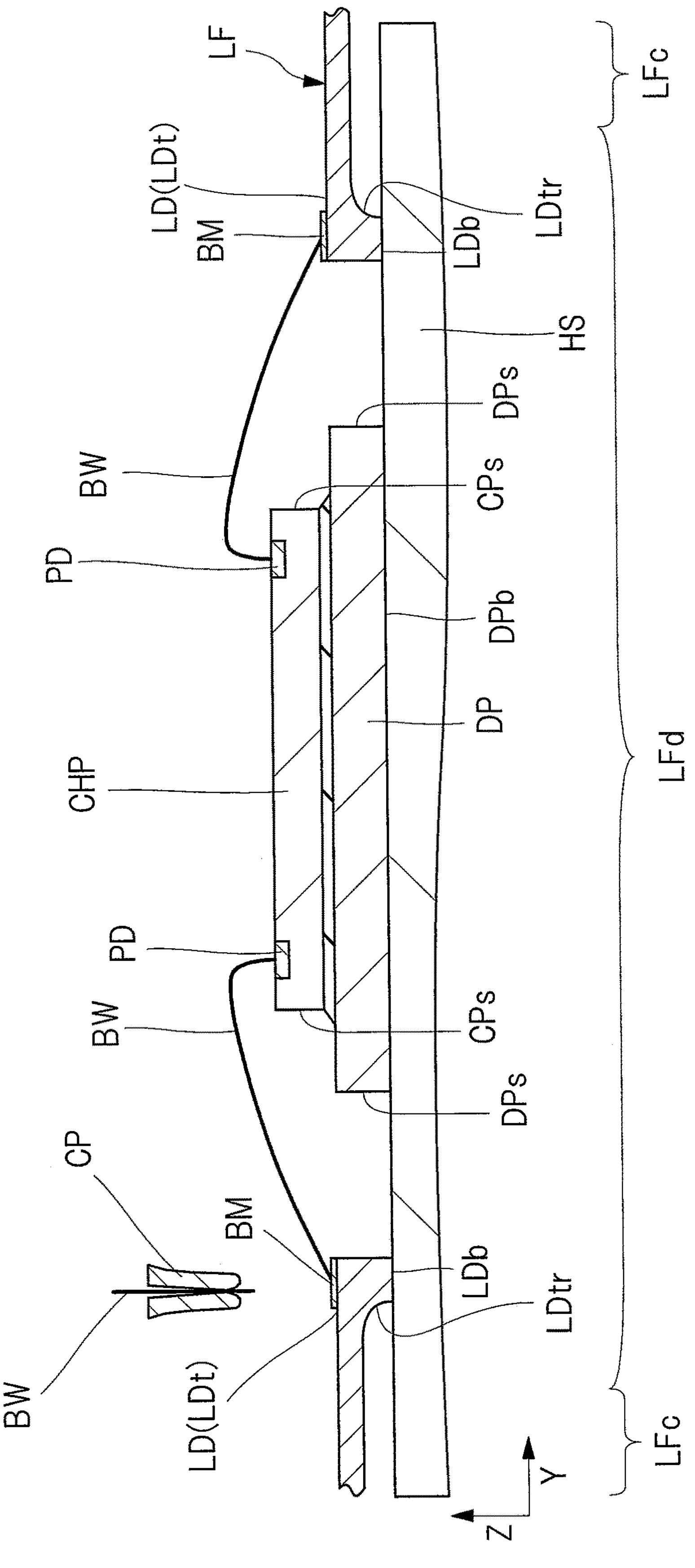
FIG. 21 is an enlarged cross-sectional view taken along a line A-A of FIG. 20.

3. Wire Bonding Process;

Then, as a wire-bonding process shown in FIG. 12, as shown in FIG. 20 and FIG. 21, the plurality of pads PD and the plurality of leads LD in the semiconductor chip CHP are electrically connected to each other via the plurality of wires (electrically-conductive members) BW, respectively. FIG. 20 is an enlarged plan view showing a state in which the semiconductor chips and the plurality of leads shown in FIG. 18 are electrically connected via the wires, and FIG. 21 is an enlarged cross-sectional view taken along a line A-A of FIG. 20.

In the present process, for example, the lead frame LF in which the semiconductor chip CHP is mounted on the die pad DP of each of the device regions LFd is fixed onto a heat stage (lead-frame heating base) HS as shown in FIG. 21. Then, the pads PD and the leads LD in the semiconductor chip CHP are electrically connected to each other via the wires BW. The wire bonding for connecting the wire BW to the pad PD and the lead LD is performed by using, for example, a capillary CP which is a wire bonding tool shown in FIG. 21.

More specifically, first, a ball part is formed by melting a distal end of the wire BW which protrudes from the capillary CP. Then, the ball part is pressed against and pressure-bonded with a first bonding side (for example, the pad PD). At this time, by applying ultrasonic waves to the ball part of the wire BW via the capillary CP, the temperature of the pressure-bonded part in the pressure bonding can be decreased.

Then, while feeding the wire BW from the capillary CP, the capillary CP is moved to form a wire loop shape. Then, the capillary CP is moved to a second bonding side (for example, onto the metal film BM formed in the bonding region of the lead LD), and the wire BW and the lead LD are connected to each other. The metal film BM made of, for example, silver (Ag) or gold (Au) is formed on a part of the lead LD (bonding region arranged in the distal end of the inner lead part). A part of the wire BW is electrically connected to the lead LD via the metal film BM. The wire BW is made of a metal, and is made of, for example, gold (Au) in the present embodiment.

The bonding region of the lead LD is positioned on the opposite side of the bottom surface LDb. That is, the wire BW is bonded with the part having the large plat thickness in the lead LD. In this manner, load sufficient in the bonding of the wire BW is bonded with the lead LD can be applied, and therefore, the bonding strength can be improved.

In the present process, the wires BW are bonded with the plurality of leads LD provided in the plurality of device regions LFd, respectively. In this manner, in each of the device regions LFd, the semiconductor chip CHP and the plurality of leads LD are electrically connected to each other via the plurality of wires BW.

Figure 22:
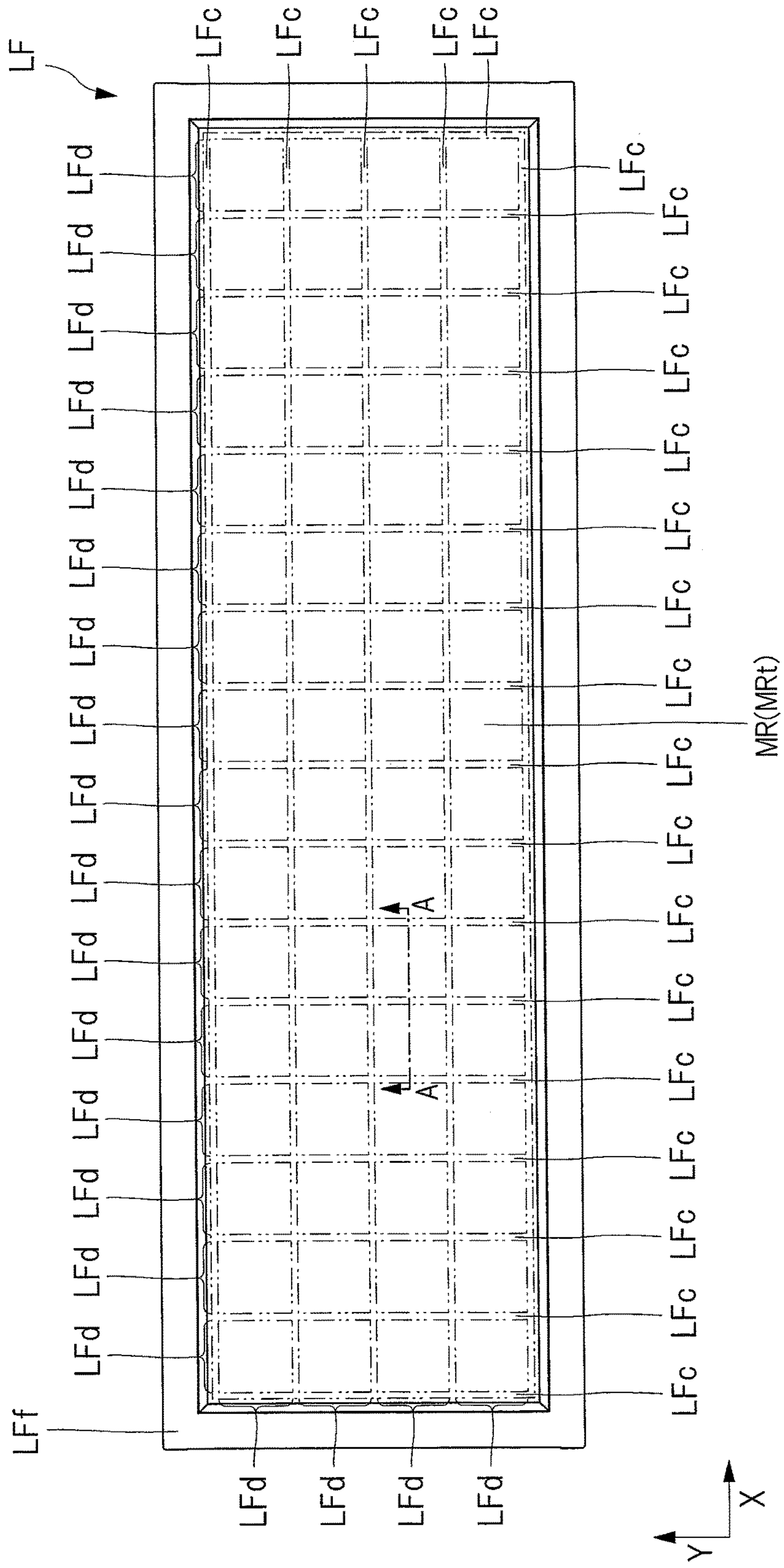
FIG. 22 is a plan view showing a state in which a sealing body is formed in the device regions of the lead frame shown in FIG. 20.
Figure 23:
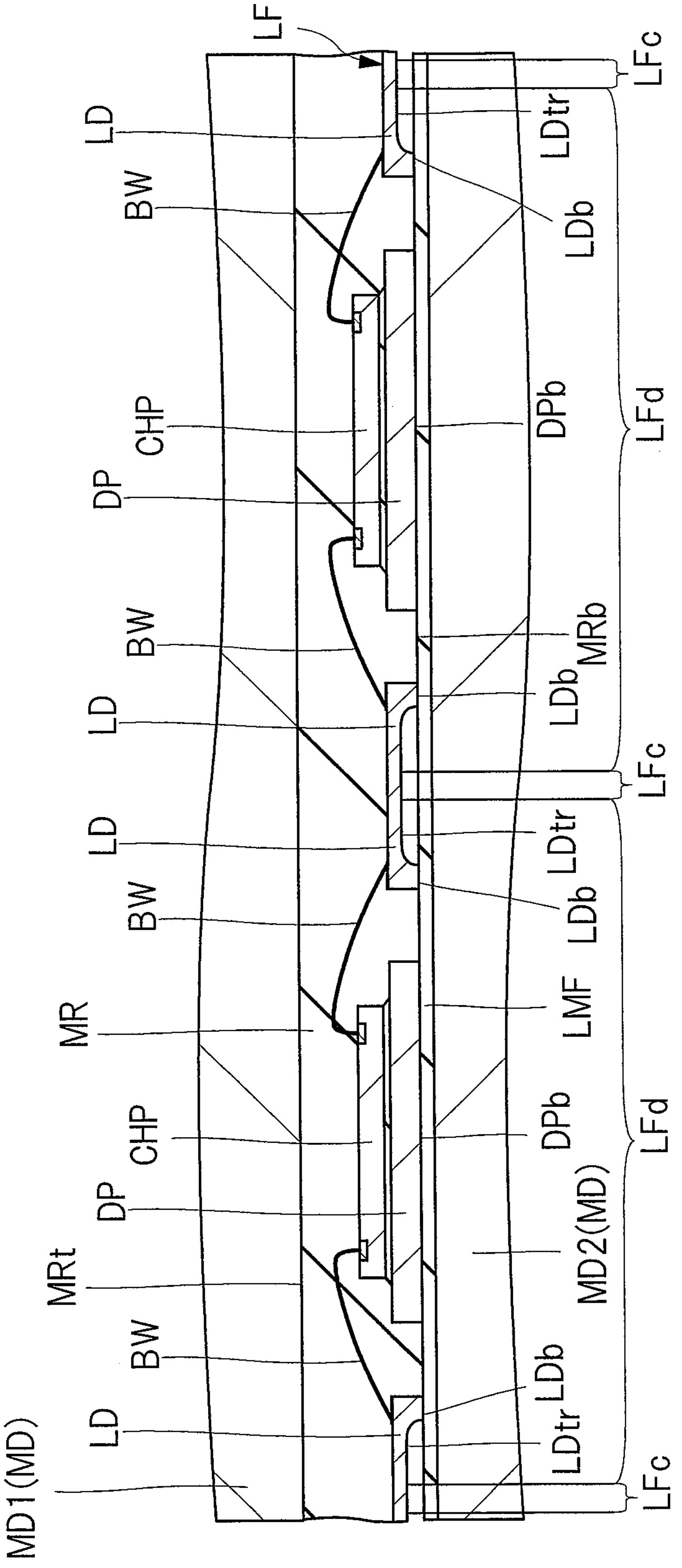
FIG. 23 is an enlarged cross-sectional view taken along a line A-A of FIG. 22.
Figure 24:
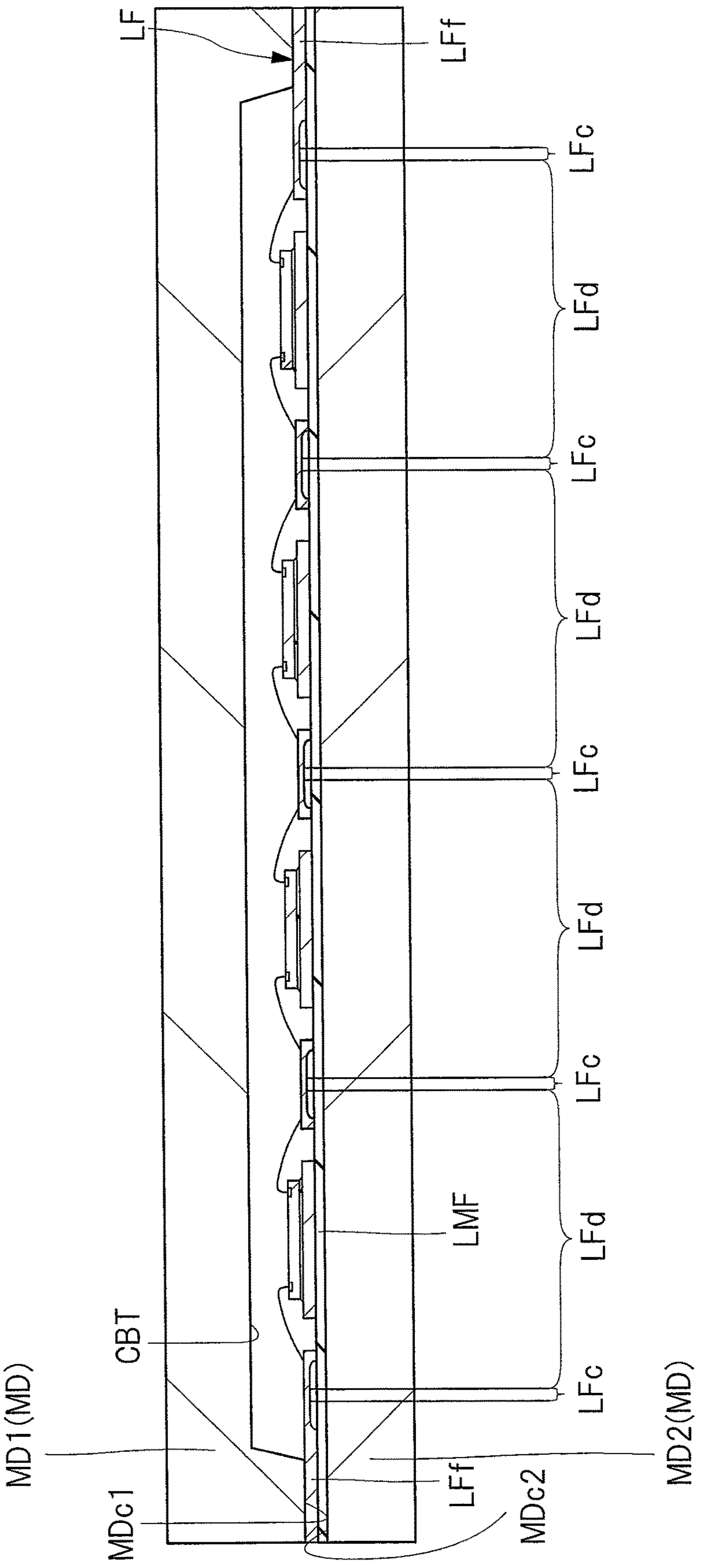
FIG. 24 is a cross-sectional view showing a state in which the lead frame is arranged in a forming mold in a sealing process.

4. Sealing Process;

Then, as the sealing process shown in FIG. 12, as shown in FIG. 22 and FIG. 23, the sealing body (sealing body) MR is formed, and the semiconductor chips CHP (see FIG. 23), the plurality of wires BW (see FIG. 23), and the plurality of leads LD (see FIG. 23) are partially sealed. FIG. 22 is a plan view showing a state in which the sealing body is formed in the device regions of the lead frame shown in FIG. 20, and FIG. 23 is an enlarged cross-sectional view taken along a line A-A of FIG. 22. FIG. 24 is a cross-sectional view showing a state in which the lead frame is arranged inside a forming mold in the sealing process. Note that FIG. 23 shows apart of the forming mold MD shown in FIG. 24.

In the present process, as shown in FIG. 23, the sealing body MR is formed so that the bottom surfaces LDb of the plurality of leads LD provided in each of the device regions LFd are exposed. In the present embodiment, as shown in FIG. 23, the sealing body MR is formed so that the bottom surfaces DPb of the die pads DP provided in each of the device regions LFd are exposed. In the present process, the sealing body MR shown in FIG. 22 is formed by, for example, so-called transfer mold method of pressing and fitting a softened resin into the forming mold MD, and then, hardening the resin in the state in which the lead frame LF is sandwiched by the forming mold MD shown in FIG. 24.

The forming mold MD is provided with an upper mold (first mold) MD1 which is arranged on an upper side of the lead frame LF, and a lower mold (second mold) MD2 which is arranged on a lower side of the lead frame LF. The upper mold MD1 is provided with a clamp surface (mold surface, pressing surface, surface) MDc1 which holds the lead frame LF, and a cavity (concave part) CBT which is formed inside the clamp surface MDc1. The lower mold MD2 is provided with a clamp surface (mold surface, pressing surface, surface) MDc2 which is arranged to be opposed to the clamp surface MDc1 and holds the lead frame LF. Note that the cavity is not formed inside the clamp surface MDc2 of the lower mold MD2.

In the sealing process, a sealing resin is press-fitted into the cavity CBT, and the semiconductor chip CHP (see FIG. 23), the plurality of wires BW (see FIG. 23), and the plurality of leads LD (see FIG. 23) are partially sealed. Then, the sealing body MR shown in FIG. 22 is formed by thermally hardening the resin supplied to the cavity CBT.

In the present embodiment, the sealing body MR is formed so as to collectively seal the plurality of device regions LFd. In other words, as shown in FIG. 24, in the sealing process, the lead frame LF is arranged inside the forming mold MD so that the plurality of device regions LFd of the lead frame LF are housed inside one cavity CBT.

In the example shown in FIG. 23 and FIG. 24, a resin film (film material) LMF is arranged between the lead frame LF and the lower mold MD2. The lead frame LF is arranged inside the forming mold MD in a state in which the resin film LMF is pasted on the bottom surface side thereof.

In the case of the transfer mold method, the lead frame LF is fixed by sandwiching the lead frame LF by the clamp surfaces MDc1 and MDc2 opposed to each other (see FIG. 24) in the forming mold. However, in the case of the collective sealing method, the areas of the clamp surfaces MDc1 and MDc2 are smaller than that in a singulation molding method in which the cavity CBT is provided for each device region LFd. Therefore, as shown in FIG. 23, in order to closely contact the bottom surface LDb of the lead LD with the resin film LMF, it is preferred to previously paste the resin film LMF on the bottom surface side of the lead frame.

In this manner, as shown in FIG. 23, the bottom surfaces LDb of the leads LD and the bottom surfaces DPb of the die pads DP can be closely contacted with the resin film LMF. By providing the closely-contacting state with the resin film LMF, spreading of the sealing resin behind the bottom surfaces LDb of the leads LD and the bottom surfaces DPb of the die pads DP can be suppressed. Thus, the bottom surfaces LDb of the leads LD and the bottom surfaces DPb of the die pads DP can be exposed.

In the present embodiment, the trench parts LDtr are formed on the bottom surface LDb side of the leads LD. As explained by using FIG. 16, the periphery of the trench part LDtr is continuously surrounded by the bottom surfaces LDb of the leads LD when seen in the plan view. Therefore, by closely contacting the bottom surfaces DPb of the bottom surfaces LDb of the leads LD with the resin film LMF, the entering of the resin into the trench parts LDtr can be prevented.

The thin parts LFhf such as the suspension leads TL shown in FIG. 15 have such a structure that the resin is spread behind in the present process as different from the trench parts LDtr (see FIG. 16). Therefore, when the resin is supplied into the cavity CB shown in FIG. 24, a part of the resin is spread between the suspension leads TL (see FIG. 15) and the resin film LMF, and the suspension leads TL are sealed with the resin.

Figure 25:
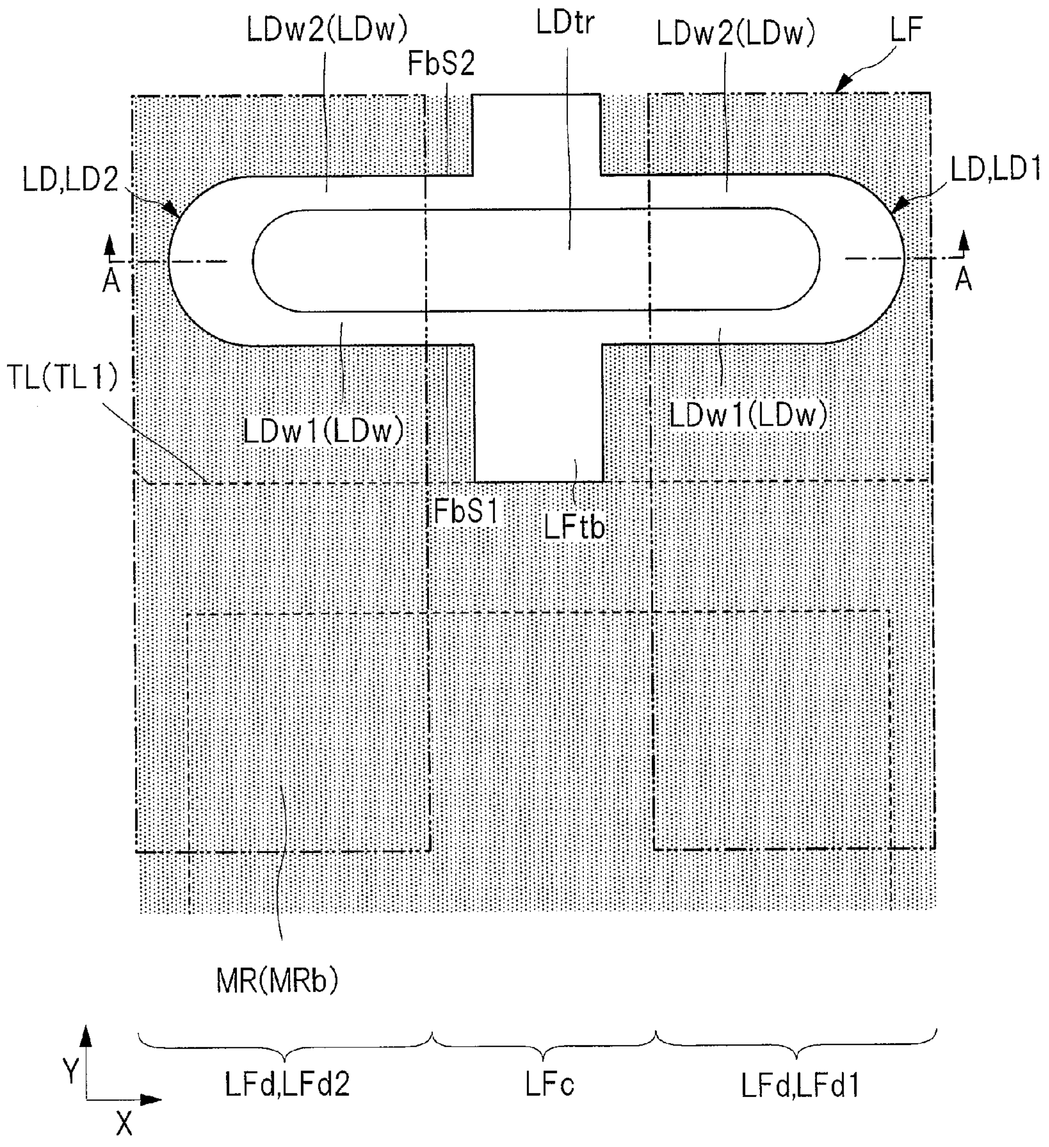
FIG. 25 is an enlarged plan view enlarging a peripheral part of the leads and a suspension lead on the mounting surface side of the lead frame shown in FIG. 22.
Figure 26:
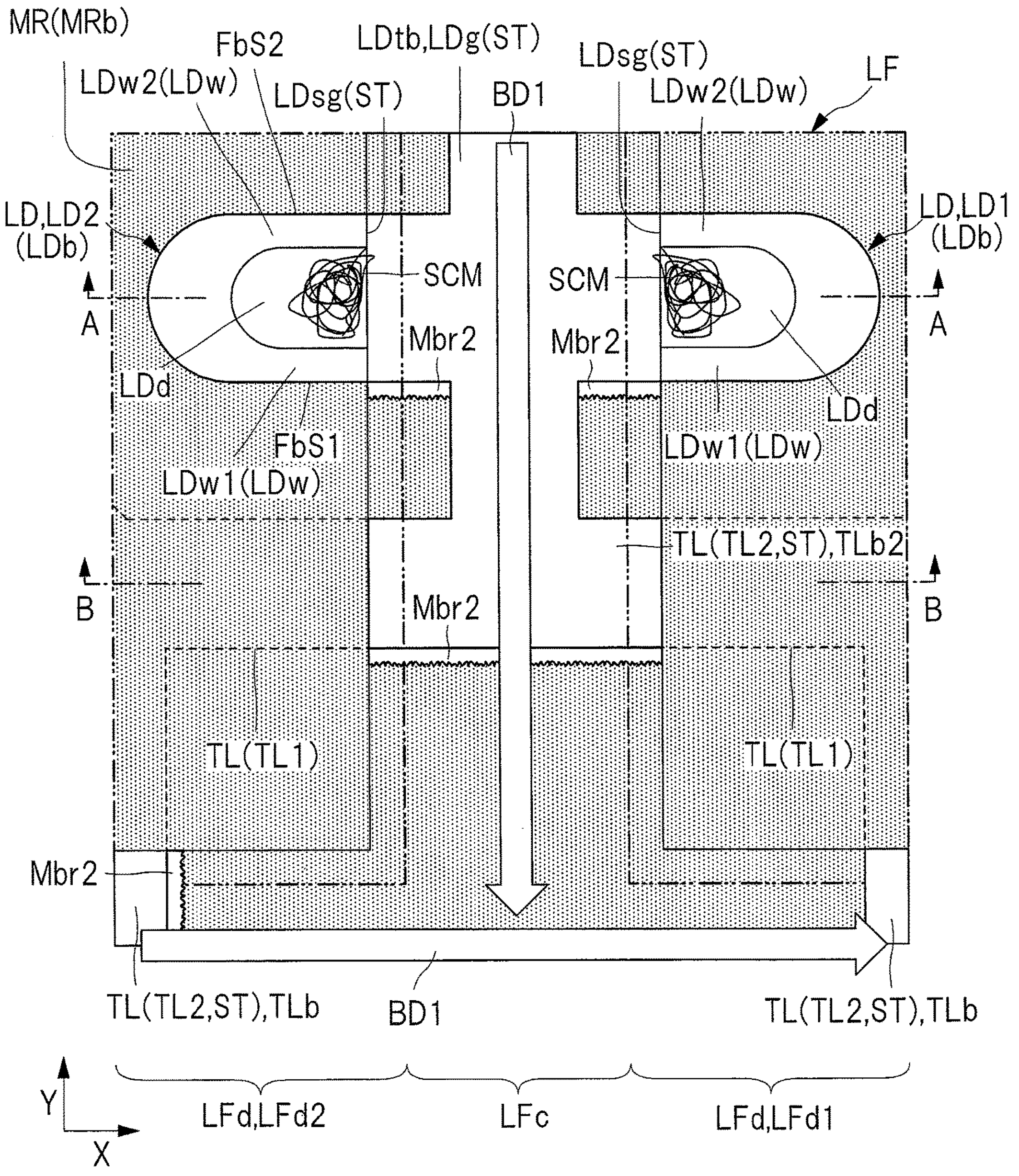
FIG. 26 is an enlarged plan view showing a state in which the lead frame shown in FIG. 25 is subjected to cutting and processing to form a cutting part.
Figure 27:
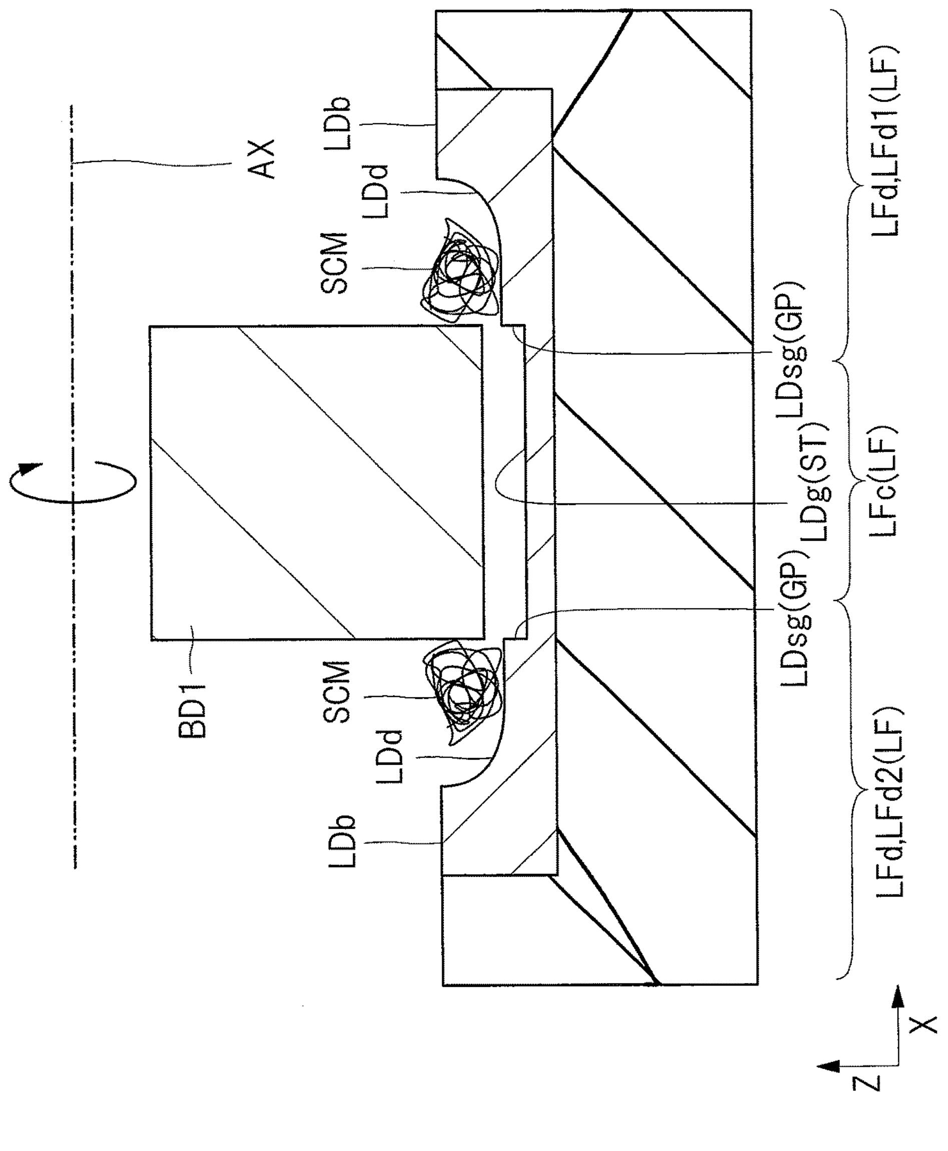
FIG. 27 is an enlarged cross-sectional view taken along a line A-A of FIG. 26.
Figure 28:
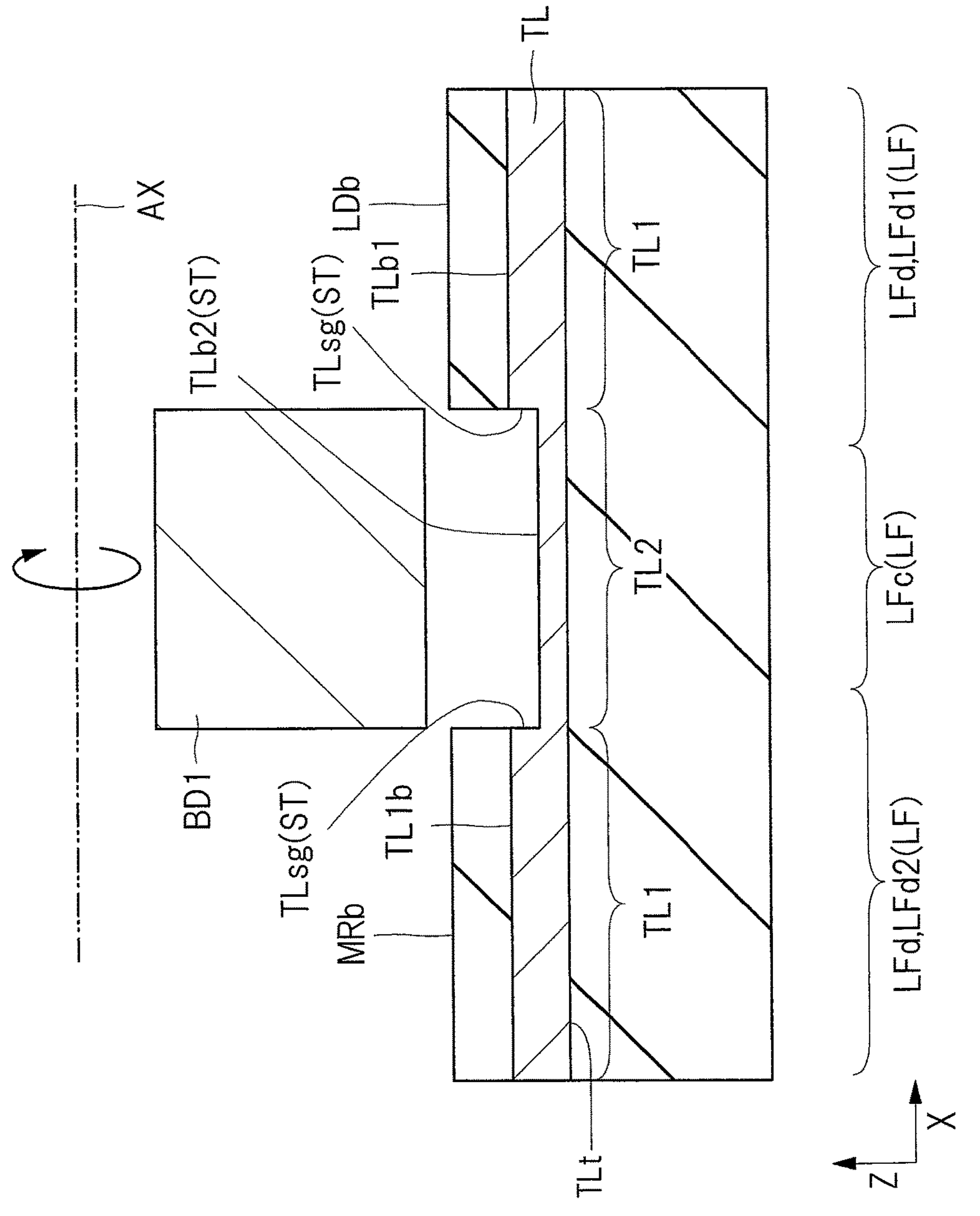
FIG. 28 is an enlarged cross-sectional view taken along a line B-B of FIG. 26.

5. Cutting-Part Forming Process (First Cutting Process);

Then, as the cutting-part forming process shown in FIG. 12, a cutting part (cutting trench, step part) ST is formed as shown in FIG. 26 and FIG. 27 by performing a cutting process by using a blade BD1 (see FIG. 27), which is a rotating blade, from the bottom surface LDb side of the lead LD shown in FIG. 25. FIG. 25 is an enlarged plan view enlarging the lead and the periphery of the lead on the mounting surface side of the lead frame shown in FIG. 22. FIG. 26 is an enlarged plan view showing a state in which the cutting part is formed by performing the cutting process to the lead frame shown in FIG. 25. FIG. 27 is an enlarged cross-sectional view taken along a line A-A of FIG. 26. FIG. 28 is an enlarged cross-sectional view taken along a line B-B of FIG. 26. In order to easily see the rotating direction and the moving direction of the blade BD1, note that FIG. 26 schematically shows the moving direction of the blade BD1 with an arrow and FIG. 27 and FIG. 28 schematically show the rotating direction of the blade BD1 with an arrow.

In the present process, a part of the coupling part between the lead LD1 and the lead LD2 on the bottom surface LDb side (the tie bar LFtb and the part connected to the tie bar LFtb of the leads LD1 and LD2) is cut from the bottom surface LDb side of the lead LD. The blade (rotating blade) BD1 used in the present process is an annular (ring-shaped) or disk-shaped cutting jig, and a plurality of abrasive grains are adhered to a cutting part arranged on a circular peripheral edge. A workpiece can be cut and removed by pressing the cutting part of the blade BD1 with the adhered plurality of abrasive grains against the workpiece.

In a case of the cutting process using the blade BD1, the blade BD1 is moved in the direction orthogonal to the rotating axis while rotating the blade BD1. For example, in the example shown in FIG. 26 and FIG. 27 as schematically showing FIG. 26 and FIG. 27 with the arrows, the blade BD1 is moved along the Y direction (see FIG. 26) orthogonal to the rotating axis AX while the blade BD1 is rotated about the rotating axis AX.

In the example shown in FIG. 26, when seen in a plan view, the blade BD1 is moved along the Y direction from the side FbS2 toward the side FbS1 of the bottom surfaces LDb of the leads LD1 and LD2. The blade BD1 is moved through the coupling part which couples the lead LD1 and the lead LD2, and through the position overlapped with the tie bar Ftb in the case of FIG. 26. In this manner, the cutting part ST which is a cut trench can be formed along the moving direction of the blade BD1. Thus, a trench-shaped cutting part ST is formed along the extending direction of the tie bar LFtb which is the coupling part between the lead LD1 and the lead LD2.

As shown in FIG. 26, in the present process, the side surfaces LDsg and the bottom surface LDg among the plurality of surfaces included in the lead LD explained by using FIG. 3 are formed. The width of the blade BD1 (the length in the direction along the rotating axis), in other words, the cutting width in the present process is larger than the cutting width in the later-described singulation process (see FIG. 12). In the example shown in FIG. 26, the width of the cutting part (X-direction length) is larger than the width of the dicing region LFc, and is, for example, 0.4 mm. Therefore, the width of the blade BD1 is at least larger than the width of the tie bar LDtb (for example, 0.20 mm in the example shown in FIG. 26). Note that the width of the dicing region LFc is, for example, 0.35 mm. Therefore, the side surfaces LDsg, which are inner surfaces of the cutting part, are formed inside the device region LFd1 and the device region LFd2 when seen in the plan view. As a result, as explained by using FIG. 3, a part of the side surfaces LDsg and the bottom surfaces LDg remains as the step parts GP of the semiconductor device 1.

As shown in FIG. 26, in the present process, a part of the metal which is cut in the moving direction of the blade BD1 is dragged and forms the metal burr Mbr2. While FIG. 26 shows the metal burrs Mbr2, the metal burrs Mbr1 shown in FIG. 3 are also formed in the present process. However, since the present process is performed before a plating process as shown in FIG. 12, the metal film SD, which is a plating film, is not formed on the metal burrs Mbr1 (see FIG. 3) and the metal burrs Mbr2 at the stage when the present process is finished.

When the lead LD1 and the lead LD2 coupled to each other are viewed from the bottom surface LDb side, the metal burrs Mbr1 and Mbr2 are formed at the sides intersecting with the moving direction of the blade BD1. However, in the moving direction of the blade BD1, although the metal burrs Mbr1 and Mbr2 are not formed on the sides which are on an upstream side, the metal burrs Mbr1 and Mbr2 are formed on the sides which are on a downstream side. Therefore, as explained by using FIG. 3, in the present process, while the metal burr Mbr1 extending along the X direction is formed on the side FS1 of the side surface LDsg, the metal burr Mbr1 is not formed on the side FS2. The metal burr Mbr2 extending along the X direction is formed on the side FS3 of the bottom surface LDg, and the metal burr Mbr2 is not formed on the side FS4.

In the present process, the cutting part ST is formed so as to divide the part between both ends in the extending direction of the trench part LDtr (see FIG. 25) formed to communicate the coupled lead LD1 and lead LD2 with each other. In this manner, the trench part LDtr which is formed across the lead LD1 and the lead LD2 is divided, so that the concave parts LDd included in the respective lead LD1 and lead LD2 are formed as shown in FIG. 26.

Here, in the present process, due to the cutting process by the blade BD1, metal wastes SCM as shown in FIG. 26 and FIG. 27 are generated. When the metal member is cut by using the rotating blade BD1, most of cutting wastes cut by the blade BD1 are scraped out by the rotating blade BD1, and discharged to outside. However, some of the cutting wastes remain without being separated from the metal member after cutting. The metal burrs Mbr2 and the metal wastes SCM shown in FIG. 26 are cutting wastes remaining without being separated from the leads LD after cutting.

Therefore, the metal burrs Mbr2 are formed so as to extend from the sides on the downstream side in the moving direction of the blade BD1. As shown in FIG. 25, the wall parts LDw are formed on both sides of the trench part LDtr in the moving direction of the blade BD1 (see FIG. 26). Some of the cutting wastes generated at the wall part LDw1 arranged on the downstream side in the moving direction of the blade BD1 among the wall parts remain as the metal burr Mbr1 explained by using FIG. 3. It has been found out that some of the cutting wastes generated at the wall part LDw2 arranged on the upstream side in the moving direction of the blade BD1 among the wall parts LDw on both sides of the trench part LDtr remain inside the concave part LDd as the metal waste SCM shown in FIG. 26.

If the plating process shown in FIG. 12 is performed while the metal wastes SCM remaining inside the concave parts LDd are not removed, it becomes difficult to form the metal film SD (see FIG. 5) so as to cover the concave parts LDd. If cutting is performed after the plating process so as to divide the trench part LDtr shown in FIG. 25 by the blade BD1, the metal wastes SCM containing a copper component and a solder component serving as a base material remain inside the concave part LDd. When the metal wastes SCM are removed, there is concern that apart of the metal film SD (see FIG. 5) formed so as to cover the concave part LDd is peeled off, and the copper serving as the base material is exposed.

Since a part of the metal waste SCM is connected to the wall part LDw2 of the lead LD, for example, a process of spraying of pressurized water or others is required in order to remove the metal waste from the concave part LDd. Therefore, it is difficult to carry out a metal-waste removing process shown in FIG. 12 after singulation of separating the device regions LFd is performed.

Therefore, in the present embodiment, as shown in FIG. 12, the plating process and the singulation process are performed after the cutting-part forming process and the metal-waste removing process are performed. Although details will be described later, in the present process, the cutting part ST, which is the cutting trench, is formed, and cutting is performed by using a blade having a width narrower than the trench width of the cutting part ST in the singulation process. In this manner, in the singulation process, the blade can be prevented from contacting the concave part LDd. Therefore, if the metal wastes SCM are removed before the singulation process and the plating film is formed on the concave part LDd from which the metal waste SCM has been removed, the metal film SD can be stably formed so as to cover the concave part LDd.

The trench depth of the cutting part ST formed in the present process (the length of the cutting part ST in the thickness direction of the lead LD), in other words, the thickness-direction length of the side surface LDs of the lead LD is preferably as follows. That is, from the viewpoint of preventing contact between the blade and the concave part LDd in the later-described singulation process, it is required to form the trench depth of the cutting part ST so as to be equal to or larger than the depth which is the same as the deepest position (base surface) of the concave part LDd (trench part LDtr). As explained by using FIG. 8 to FIG. 10, in consideration of the solder wettability in the mounting or the fillet shape, the trench depth of the cutting part ST is preferred to be ⅔ or larger of the thickness of thickest part of the lead LD.

In the present process, a part of the coupling part between the lead LD1 and the lead LD2, more specifically, apart of the bottom surface side (mounting surface side) is cut. In other words, the other part of the coupling part remains after the present process is completed. In the case of the collective sealing method as similar to the present embodiment, the sealing body MR is formed so as to be across the plurality of device regions LFd. Therefore, in the present process, as long as a part of the sealing body MR remains, singulation is not performed even if the coupling part of the leads LD is cut.

However, from the following reason, it is preferred to form the cutting part ST so that a part of the coupling part of the lead LD remains in the present process. More specifically, the coupling part of the leads LD is formed of the same metal material as that of the leads LD, and therefore, if a part of the coupling part is connected to the leads LD in the plating process shown in FIG. 12, a potential can be supplied to the leads LD via the coupling part. Therefore, the metal film SD (see FIG. 5) can be formed on the leads LD by an electrolytic plating method. The case of the electrolytic plating method is preferred in a point that a film property of the metal film SD can be easily controlled by controlling the current in the metal film formation.

In the present process, when the coupling part of the leads LD is cut, the plurality of device regions LFd are connected with each other by the sealing body MR. However, such a case as making difficult for handling of the lead frame LF only through the rigidity of the sealing body MR is considered. Therefore, from the viewpoint of improving the handling characteristics of the lead frame LF, it is preferred to form the cutting part ST so that a part of the coupling part of the leads LD remains in the present process.

In the present process, the cutting parts ST are formed in a grid shape, and therefore, the cutting process is performed to not only the plurality of leads LD but also the sealing body MR and the suspension leads TL. Therefore, as shown in FIG. 26, in the present process, the bottom surfaces TLb2 of a part (exposed part TL2) of the suspension leads TL are exposed from the sealing body MR.

More specifically, since the suspension leads TL have been subjected to the half etching process from the bottom surface side as described above, the entire suspension leads TL are sealed with the sealing body MR in the sealing process. Therefore, as shown in FIG. 25, before the cutting process, the suspension leads TL are not exposed. However, by performing the cutting process by using the blade BD1 in the present process, the bottom surfaces TLb2 of the part arranged in the cutting regions of the suspension leads TL are exposed as shown in FIG. 26.

As described above, in the present embodiment, the trench depth of the cutting part ST (the length of the cutting part ST in the thickness direction of the lead LD) is equal to or larger than the depth which is the same as the deepest position (base surface) of the concave part LDd (trench part LDtr). When the trench part LDtr shown in FIG. 25 is formed by etching, formation of the trench part together with the half etching for the suspension leads TL is more preferable in a point of improving the manufacturing efficiency. Therefore, the depth of the concave part LDd is about ½ of the thickness of the thickest part of the lead LD, and the deepest position of the concave part LDd (trench part LDtr) is at the same height as the bottom surface TLb1 of the sealing part TL1 of the suspension lead TL after the half etching process. Therefore, in the present process, when the cutting part ST is formed, side surfaces (suspension-lead side surfaces) TLsg of the suspension lead TL configuring the cutting part ST and the bottom surface TLb2 are exposed as shown in FIG. 28.

As shown in FIG. 26, when the present process is completed, the metal burrs Mbr2 generated due to cutting using the blade BD1 are formed on the bottom surface TLb2 of the suspension lead TL. Although illustration is omitted, the metal burr Mbr1 as explained by using FIG. 3 is formed on the side surface TLsg shown in FIG. 28. While the metal burr Mbr1 and the metal burr Mbr2 are formed on the side on the downstream side in the moving direction of the blade BD1, they are not formed on the sides on the upstream side.

Figure 29:
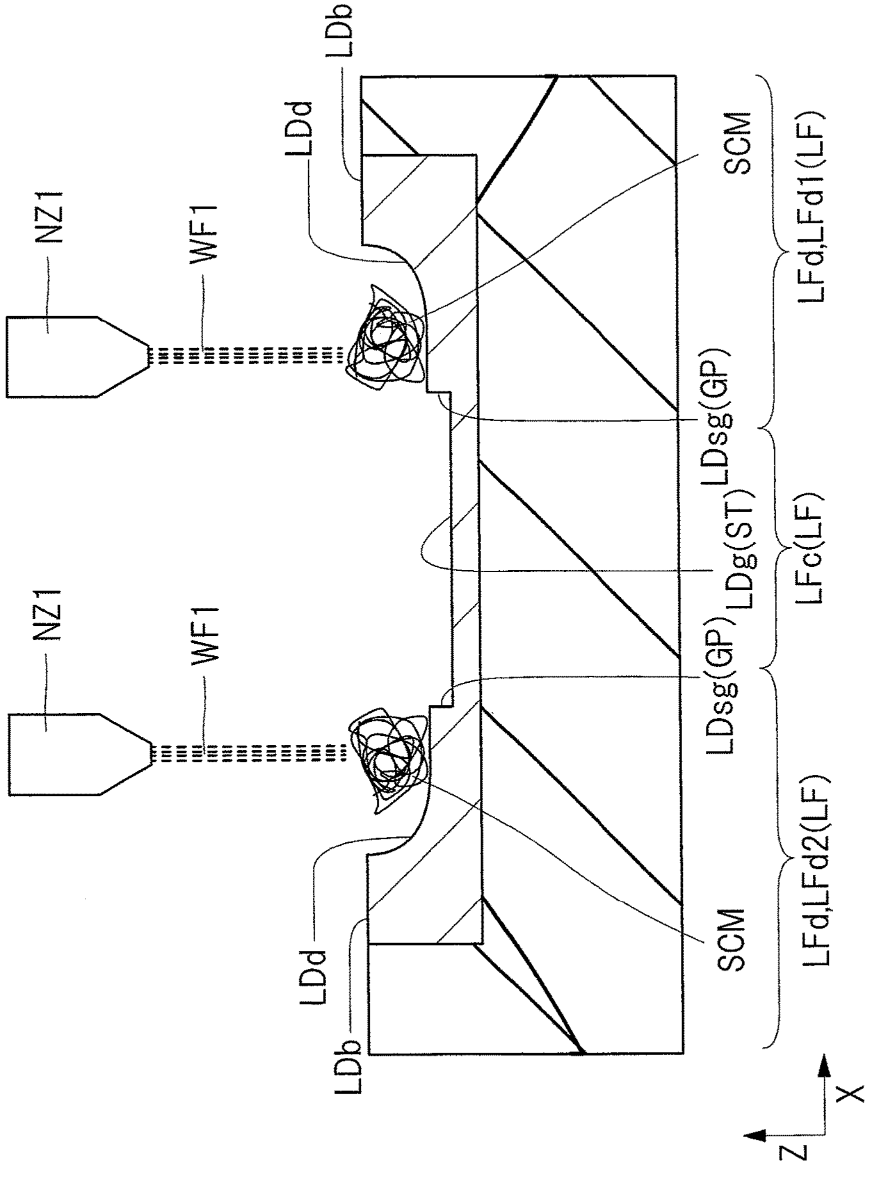
FIG. 29 is an enlarged cross-sectional view showing a state in which pressurized wash fluid is sprayed to metal wastes shown in FIG. 27.
Figure 30:
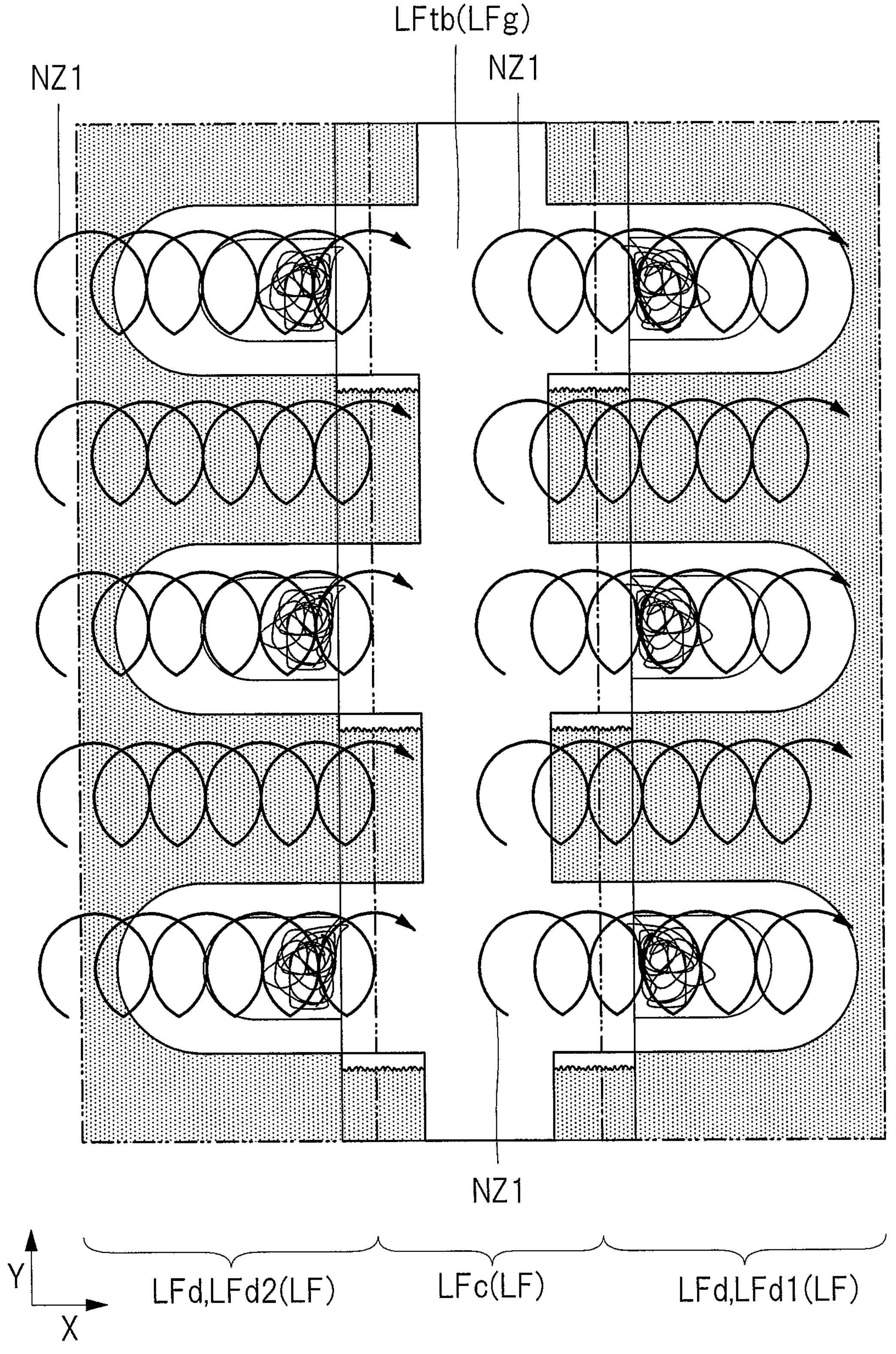
FIG. 30 is an enlarged plan view schematically showing the moving directions of nozzles shown in FIG. 29 when seen in a plan view.

6. Metal-Waste Removing Process;

Then, as the metal-waste removing process shown in FIG. 12, the metal wastes SCM shown in FIG. 26 and FIG. 27 are removed. FIG. 29 is an enlarged cross-sectional view showing a state in which pressurized wash fluid is sprayed to the metal wastes shown in FIG. 27. FIG. 30 is an enlarged plan view schematically showing the moving directions of nozzles, which are shown in FIG. 29, when seen in a plan view.

As long as the metal wastes SCM shown in FIG. 27 can be reliably removed, the present process includes various modification examples other than the method explained below. However, in the present embodiment, a particularly preferred aspect is exemplified from the viewpoint of efficiently removing the metal waste SCM formed on each of a large number of concave parts LDd.

In the present embodiment, in the metal-waste removing process, as shown in FIG. 29, the metal wastes SCM are removed by spraying wash fluid WF1, pressurized at a higher pressure than an atmospheric pressure, to the metal wastes SCM. The metal wastes SCM are cutting wastes generated in the cutting process, and are partially connected to the wall parts LDw2 of the lead LS as shown in FIG. 26. Therefore, in order to reliably remove the metal wastes SCM, a method is effective, the method peeling off the connected part between the metal waste SCM and the wall part LDw2 of the lead LD by causing the pressurized wash fluid WF1 to collide with the metal waste SCM. In the present embodiment, the wash fluid WF1 is, for example, water, and the pressure (water pressure) thereof is about 50 MPa±5 MPa.

From the viewpoint of improving the efficiency of removing the metal wastes SCM, it is preferred that the plurality of nozzles NZ1 are provided and that the wash fluid WF1 is sprayed from each of the plurality of nozzles NZ1 as shown in FIG. 29.

In order to peel off the connected part between the metal waste SCM and the wall part LDw2 of the lead LD shown in FIG. 26, it is more preferred that force is applied in the extending directions of the lead LD1 and the lead LD2 (the X direction in the example shown in FIG. 29) than that the wash fluid WF1 is simply sprayed from above the metal waste SCM. Therefore, it is preferred that the wash fluid WF1 is sprayed while moving a relative position between the nozzle NZ1 and the concave part LDd when seen in the plan view. For example, in the present embodiment, as schematically shown in FIG. 30 regarding a trail of the nozzle NZ1, the wash fluid WF1 shown in FIG. 29 is sprayed while spirally rotating each distal end of the plurality of nozzles NZ1.

In this manner, the wash fluid WF1 hits and pushes out the metal wastes SCM along the base surfaces of the concave parts LDd shown in FIG. 29. For example, the wash fluid WF1 sprayed to the base surfaces of the concave parts LDd is moved toward the metal wastes SCM along the base surfaces of the concave parts LDd, and pushes out the metal wastes SCM in the direction of the cutting parts ST. Therefore, according to the present embodiment, the connected parts between the metal wastes SCM shown in FIG. 26 and the wall parts LDw2 of the leads LD can be easily peeled off.

Figure 31:
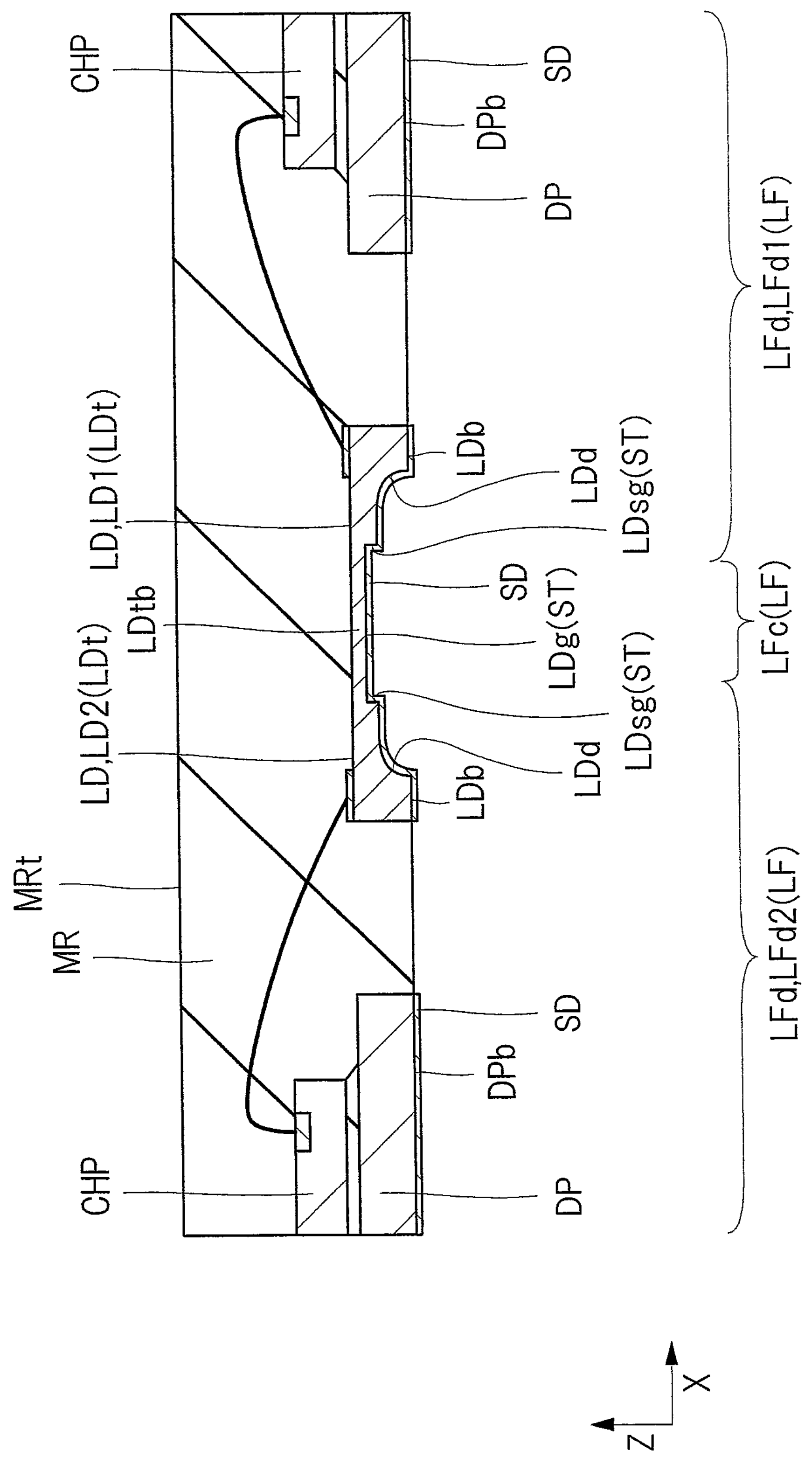
FIG. 31 is an enlarged cross-sectional view showing a state in which a metal film is formed on exposed surfaces of the leads and die pads shown in FIG. 26.

7. Plating Process;

Then, as the plating process shown in FIG. 12, as shown in FIG. 31, the metal film SD is formed on the exposed surfaces of the plurality of leads LD and the die pads DP. FIG. 31 is an enlarged cross-sectional view showing a state in which the metal film is formed on the exposed surfaces of the leads and the die pads shown in FIG. 26, and FIG. 32 is an explanatory diagram showing an outline of the plating process by the electrolytic plating method.

Figure 32:
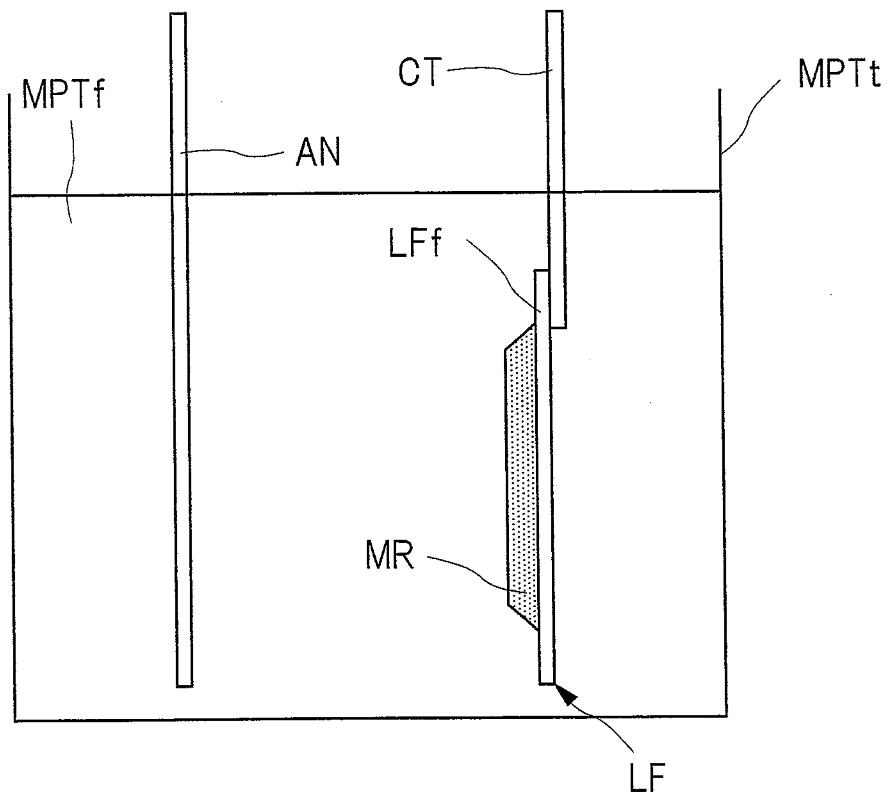
FIG. 32 is an explanatory diagram showing an outline of a plating process by an electrolytic plating method.

First, as shown in FIG. 32, in the present process, as shown in FIG. 32, the lead frame LF which is a workpiece to be plated is arranged inside a plating tank MPTt containing a plating solution MPTf. At this time, the workpiece is connected to a cathode CT inside the plating tank MPTt. For example, in the example shown in FIG. 32, the outer frame LFf of the lead frame LF is electrically connected to the cathode CT. Then, by applying, for example, a direct-current voltage between the cathode CT and an anode AN which is also arranged in the plating tank MPTt, the metal film SD (see FIG. 31) is formed on the exposed surface of the metal member connected to the outer frame LFf of the lead frame LF. Thus, in the present embodiment, the metal film SD is formed by so-called electrolytic plating method.

As described above, the metal film SD of the present embodiment is made of so-called lead-free solder which does not practically contain lead (Pb), such as only tin (Sn), tin-bismuth (Sn—Bi), or tin-copper-silver (Sn—Cu—Ag). Therefore, the plating solution MPTf used in the present plating process is, for example, an electrolytic plating solution containing a metal salt such as $Sn^{2+}$ or $Bi^{3+}$. Note that the following explanation will be made for alloyed metal plating of Sn—Bi as an example of the lead-free solder plating. However, Bi can be replaced by a metal such as Cu or Ag.

In the present embodiment, as described above, the plating process is performed in the state in which the plurality of leads LD are electrically connected to the outer frame LFf via the tie bars LFtb, which are coupling parts. The die pads DP are electrically connected to the outer frame LFf via the tie bars LFtb and the suspension leads TL (see FIG. 15). Therefore, when the voltage is applied between the anode AN and the cathode CT shown in FIG. 32 in the state in which the lead frame LF is soaked in the plating solution MPTf, energization between both of the electrodes (between the anode AN and the cathode CT) is generated. As described above, the outer frame LFf of the lead frame LF is electrically connected to the cathode CT, and therefore, $Sn^{2+}$ and $Bi^{3+}$ in the plating solution MPTf are deposited at a predetermined rate on the exposed surfaces of the leads LD and the die pads DP shown in FIG. 31, so that the metal film SD is formed.

As shown in FIG. 12, in the present embodiment, the cutting-part forming process is performed before the plating process so as to form the cutting part ST between the coupled leads LD as shown in FIG. 31. The cutting part ST is exposed from the sealing body MR. Therefore, in the present plating process, the metal film SD is formed on the exposed surface of the cutting part ST. The film thickness of the metal film SD can be changed depending on a product specification. For example, the film of about 10 μm to 20 μm is formed.

Incidentally, as a method of forming the metal film by a plating method, not only the electrolytic plating method but also a non-electrolytic plating method are cited. However, the electrolytic plating method is preferred in a point that the film property of the metal film SD can be easily controlled by controlling the current in the metal film formation. The electrolytic plating method is also preferred in a point that the formation time of the metal film SD can be shorter than that of the non-electrolytic plating method.

In the present process, before the metal film SD is formed by the plating process, the surfaces of the leads LD and the die pads DP exposed from the sealing body MR are subjected to pretreatment. This pretreatment is the treatment performed for improving the adhesiveness between the metal film SD which is the plating film and the exposed surfaces of the base material by removing an oxidized metal film formed on the exposed surfaces. The pretreatment includes a process of removing the oxidized metal film by washing the exposed surfaces with an acidic or alkaline solution, and then, removing the solution. In some cases, the pretreatment also includes a process of removing a resin burr or others by spraying the wash fluid onto the exposed surfaces.

Here, if the metal wastes SCM (see FIG. 27) formed in the cutting-part forming process shown in FIG. 12 can be reliably removed by the pretreatment of the plating process, elimination of the above-described metal-waste removing process can be also considered. However, if the metal wastes SCM are removed after the pretreatment is completed, there is concern that a non-treated metal surface is exposed from the part from which the metal wastes SCM have been peeled off. Therefore, as similar to the present embodiment, it is preferred to perform the metal-waste removing process before the pretreatment of the plating process so as to be separated from the pretreatment of the plating process, and then, the pretreatment of the plating process is performed in the state in which the metal wastes SCM are reliably removed.

If the metal burr Mbr2 shown in FIG. 26 and the metal burr Mbr1 shown in FIG. 3 are formed in the above-described cutting-part forming process and remain even after the metal-waste removing process, the metal film SD is deposited on each of the exposed surfaces of the metal burr Mbr1 and the metal burr Mbr2 in the present process. More specifically, each of the metal burr Mbr1 and the metal burr Mbr2 is subjected to the plating process, and the metal film SD which is the plating film is formed thereon.

Figure 33:
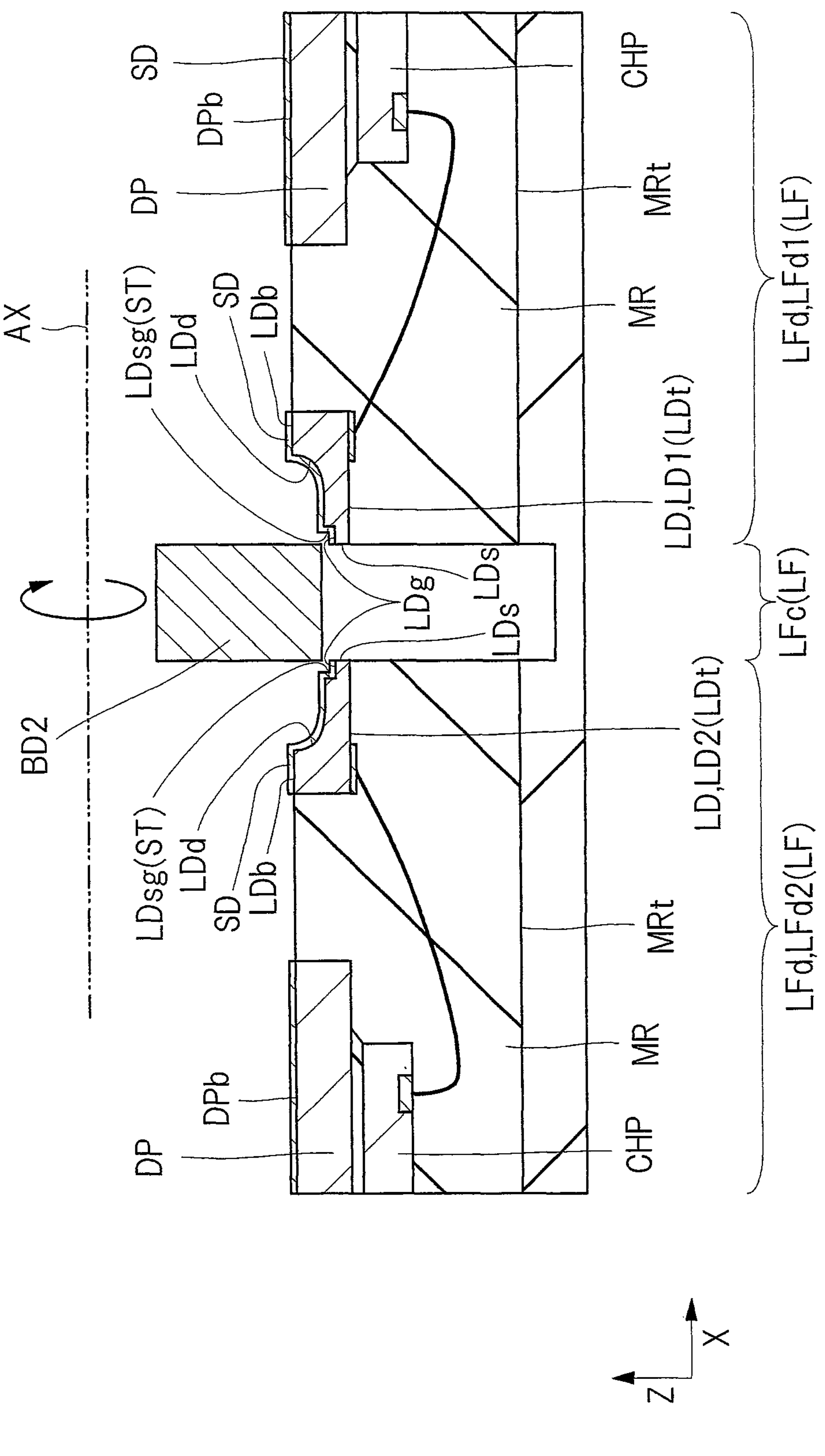
FIG. 33 is an enlarged cross-sectional view showing a state in which the lead frame shown in FIG. 29 is subjected to a singulation process for each device region.

8. Singulation Process (Second Cutting Process);

Then, as the singulation process shown in FIG. 12, as shown in FIG. 33, the device region LFd1 and the device region LFd2 are separated from each other by cutting the remaining part of the coupling part between the lead LD1 and LD2 and the sealing body MR by using the blade from the bottom surface LDb side of the lead LD.

Figure 34:
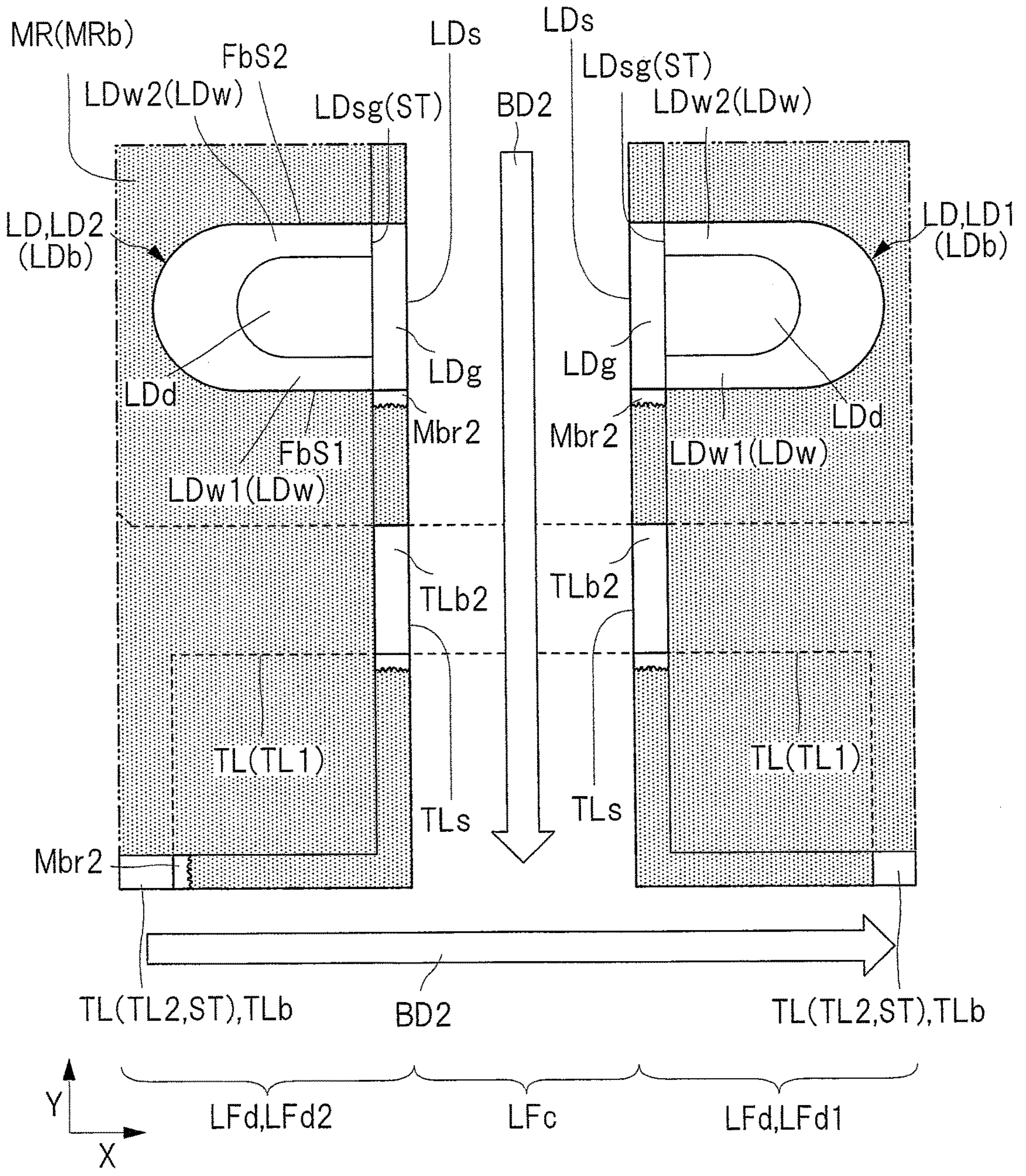
FIG. 34 is an enlarged plan view enlarging a state in which the leads and the suspension lead are cut in a singulation process shown in FIG. 12.

FIG. 33 is an enlarged cross-sectional view showing a state in which the lead frame shown in FIG. 29 is subjected to singulation into the device regions. FIG. 34 is an enlarged plan view enlarging a state in which the leads and the suspension leads are cut in the singulation process shown in FIG. 12. In order to easily see the rotating direction and the moving direction of a blade BD2, note that FIG. 34 schematically shows the moving direction of the blade BD2 with an arrow, and FIG. 34 schematically shows the rotating direction of the blade BD1 with an arrow.

In the present process, first, the lead frame LF in which the sealing body MR is formed is fixed to a not-shown frame (ring frame) via a tape (dicing tape) DT. At this time, the cutting is performed from the bottom surface side (back surface side, mounting surface side) of the lead frame LF, and therefore, as shown in FIG. 33, the top surface MRt of the sealing body MR is adhered to the tape DT, and is fixed so that the bottom surface side (back surface side, mounting surface side) of the lead frame LF is directed upward.

Then, the blade (rotating blade) BD2 shown in FIG. 33 is moved along the dicing region LFc of the lead frame LF while rotating the blade. The blade BD2 is similar to the blade BD1 shown in FIG. 27 except for the cutting width. More specifically, the blade BD2 is a cutting jig having an annular (ring) or disk side-surface shape, and a plurality of abrasive grains are adhered and fixed to a cutting part arranged in a circular peripheral edge. Then, the workpiece can be cut and removed by pressing the cutting part of the blade BD2 to which the plurality of abrasive grains are adhered and fixed against the workpiece.

In the present process, the rotating blade (rotating blade) BD2 is inserted into the cutting part ST, which is a cut trench formed by the cutting-part forming process, and the blade BD2 is moved along the dicing region LFc of the lead frame LF. In this manner, the tie bar LFtb shown in FIG. 31 and a part of the metal film SD (the part overlapped with the tie bar LFtb) formed immediately above the tie bar LFtb are removed (cut), and the device regions LFd adjacent to each other are separated from each other.

As shown in FIG. 34, the width of the blade BD2, in other words, the cutting width in the present singulation process is thicker (larger) than the width of the tie bar LFtb and is narrower (smaller) than the width of the blade BD1 shown in FIG. 27. In other words, the width of the blade BD2 is thicker (larger) than the width of the tie bar LFtb and is narrower (smaller) than the trench width of the trench (cutting trench ST) formed in the above-described cutting-part forming process. As an example of specific dimensions, the width of the tie bar LFtb is, for example, 0.20 mm, the width of the blade BD1 is, for example, 0.40 mm, and the width of the blade BD2 is, for example, 0.35 mm.

In this manner, in the present process, by forming the width of the blade BD2 to be narrower than the width of the blade BD1, the blade BD2 can be prevented from contacting the side surface LDsg of the lead LD. Therefore, the metal wastes SCM (see FIG. 26) explained in the above-described cutting-part forming process are not generated in the present process.

Incidentally, the above-described example of the cutting width and the width of the tie bar LFtb is one example, and various modification examples can be applied. For example, if the width of the blade BD2 is further narrowed, the margin of the cutting position accuracy can be increased, and therefore, the risk of the contact of the cutting part ST with the side surface LDsg can be reduced. For example, it is preferred to narrow the processing width of the blade BD2 within such a range that the strength necessary for cutting the sealing body MR in the thickness direction can be obtained. In the case of the above-described example, if the width of the blade BD2 is 0.35 mm or larger, the strength can be ensured regardless of the thickness of the sealing body MR. Therefore, this is preferred in a point of improving the versatility of a cutting apparatus.

In the present process, by cutting the remaining part of the coupling part of the leads LD, the side surfaces LDs of the leads LD are exposed. The side surfaces LDs are the surfaces continued in the direction orthogonal to the bottom surfaces LDg on which the metal film SD is formed. Since the side surfaces LDs are cut surfaces formed in the present process, the metal film SD is not formed on the side surfaces LDs, and copper, which is the base material, is exposed therefrom. As explained by using FIG. 3, while the metal burr Mbr3 extending along the X direction is formed on the side FS5 of the side surface LDs, the metal burr Mbr3 is not formed on the side FS6. In other words, in the present process, while the metal burr Mbr3 shown in FIG. 3 is formed on the side which is on the downstream side in the moving direction of the blade BD2 shown in FIG. 34, the metal burr Mbr3 is not formed on the side on the upstream side in the moving direction.

In the present process, by cutting the part arranged in the dicing region LFc in the suspension lead TL, the side surfaces TLs shown in FIG. 34 are exposed. The side surfaces TLs are the surfaces continued in the direction orthogonal to the bottom surfaces TLb2 on which the metal film SD is formed. Since the side surfaces TLs are the cut surfaces formed in the present process, the metal film SD is not formed on the side surfaces TLs, and copper, which is the base material, is exposed therefrom. Although illustration is omitted, on the side surface TLs, while the metal burr Mbr3 (see FIG. 3) is formed on the side on the downstream side in the moving direction of the blade BD2, the metal burr Mbr3 is not formed on the side on the upstream side in the moving direction.

Through the present process, a part of the bottom surfaces LDg is cut at the cutting part ST, and, as explained by using FIG. 3, the step part GP having the side surface MRsg of the sealing body MR, the bottom surface MRg of the sealing body MR, the side surface LDsg of the lead LD, and the bottom surface LDg of the lead LD is formed.

After the present process, necessary inspections and tests such as an appearance inspection and an electrical test are performed, and the device which passes the inspections and tests becomes the semiconductor device 1 as the completed product shown in FIG. 1. Then, the semiconductor device 1 is shipped or mounted on the mounting board MB as explained by using FIG. 7 to FIG. 11.

Modification Example

In the foregoing, the invention made by the inventor of the present invention has been concretely described based on the embodiments. However, it is needless to say that the present invention is not limited to the foregoing embodiments and various modifications and alterations can be made within the scope of the present invention.

Figure 35:
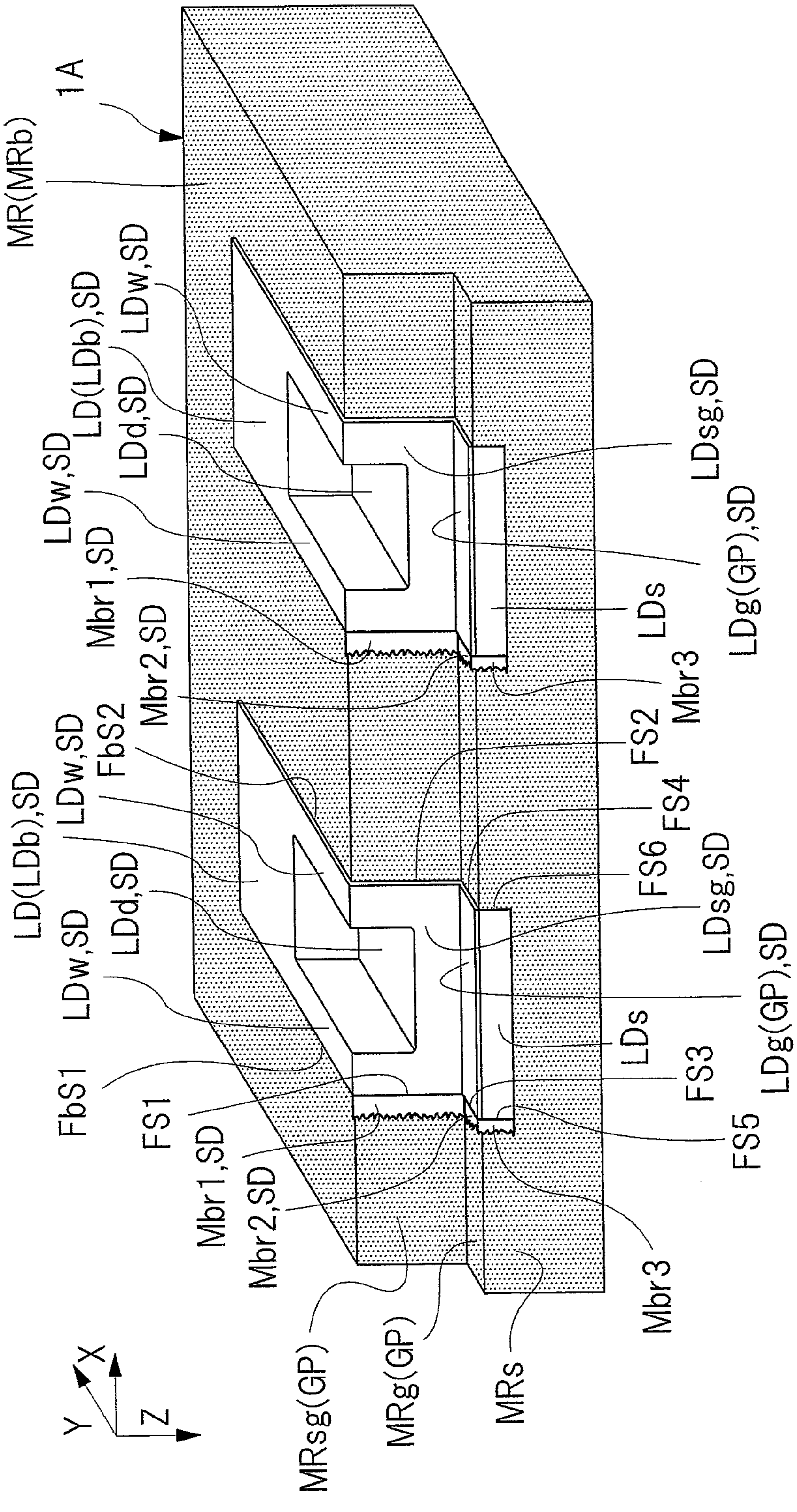
FIG. 35 is an enlarged perspective view showing a modification example of FIG. 3.

For example, in the above-described embodiment, the explanation has been made for the aspect in which the outer shapes of the leads LD and the trench parts LDtr are formed by the etching process utilizing chemical reactions. In the case of the etching process utilizing the chemical reactions, an end of the treated part is rounded. Therefore, depending on the selection for the dimension of the lead LD, the etching solution, etc., the end of the lead LD is formed to be rounded as shown in FIG. 3. The inner surface of the concave part LDd becomes a curved surface. However, as a modification example of FIG. 3, as similar to a semiconductor device 1A shown in FIG. 35, corners can be formed at the ends of the bottom surface LDb of the lead LD. Also, as similar to the semiconductor device 1A, the inner surface of the concave part LDd can be formed by a plurality of surfaces which intersect with each other. FIG. 35 is an enlarged perspective view showing a modification example of FIG. 3.

If the ends of the bottom surface LDb of the lead LD are formed to be rounded as similar to the semiconductor device 1 shown in FIG. 3, the risk of contact between the solder connected to the leads LD adjacent to each other in the mounting is smaller than that of the semiconductor device 1A shown in FIG. 35. If the inner surface of the concave part LDd is a curved surface, the solder is easily wet and spread inside the concave part LDd.

On the other hand, if the corners are formed at the ends of the bottom surface LDb of the lead LD as similar to the semiconductor device 1A shown in FIG. 35, the area of the bottom surface LDb of the lead LD can be larger than that of the semiconductor device 1. If the inner surface of the concave part LDb is formed by a plurality of surfaces which intersect with each other, the contact area between the solder and the concave part LDd becomes large, and therefore, the mounting strength can be improved.

Figure 36:
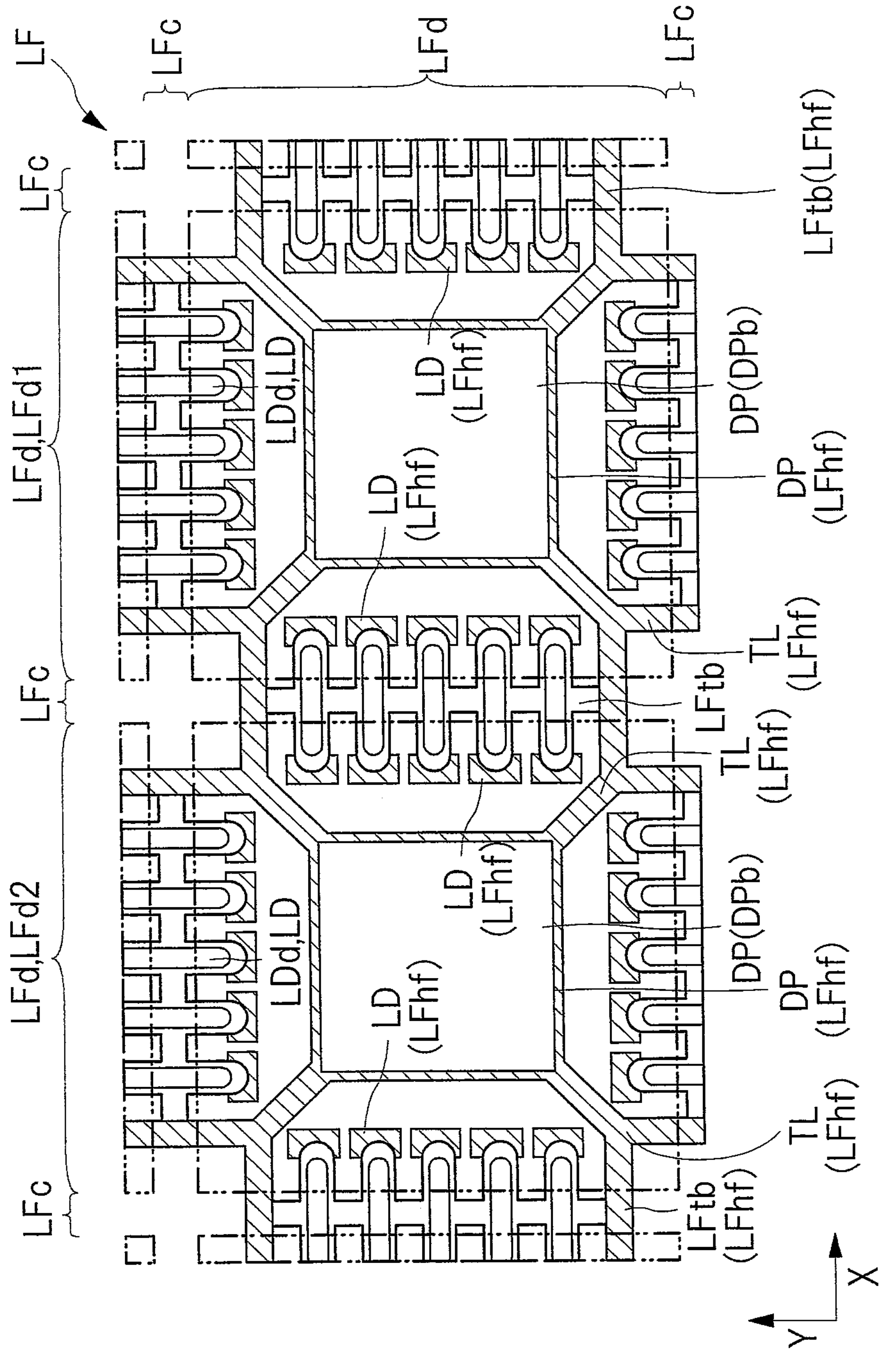
FIG. 36 is an enlarged plan view showing a mounting surface side of a lead frame as a modification example of FIG. 15.
Figure 37:
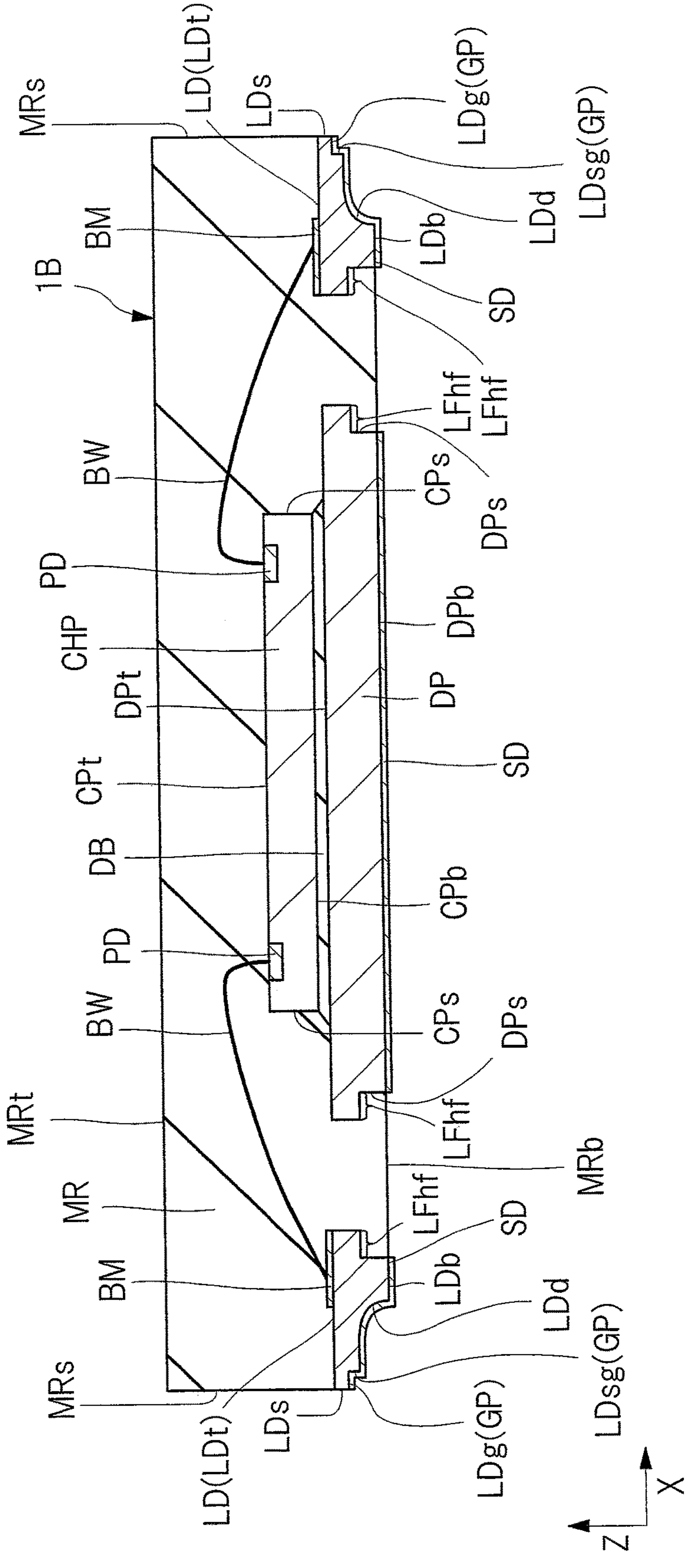
FIG. 37 is a cross-sectional view of a semiconductor device manufactured by using the lead frame shown in FIG. 36.

For example, in the above-described embodiment, the configuration has been described, the configuration which makes a difficult for the die pads DP to fall from the sealing body MR by performing the half etching process to the suspension leads TL to seal a part of the suspension leads TL. As a modification example of the half etching process, the half etching process can be performed to not only the suspension leads TL but also the die pads DP and a part of the leads LD. FIG. 36 is an enlarged plan view showing the mounting surface side of a lead frame, which is a modification example of FIG. 15. FIG. 37 is a cross-sectional view of a semiconductor device manufactured by using the lead frame shown in FIG. 36 and is a modification example of FIG. 5.

The lead frame LF1 shown in FIG. 36 is different from the lead frame LF shown in FIG. 15 in a point that the half etching process is performed to the peripheries of the bottom surfaces DPb of the die pads DP and the ends of the leads LD on the die pad DP side to form thin parts LFhf. The read frame has the same structure as the lead frame LF shown in FIG. 15 in other points than the above-described point. When the thin parts LFhf are formed so as to surround the peripheries of the bottom surfaces DPb of the die pads DP as similar to the lead frame LF1, the peripheral parts of the die pads DP are sealed with the sealing body MR as shown in FIG. 37. In this manner, fall of the die pads DP from the sealing body MR can be further reliably suppressed.

When the thin part LFf is formed at each of the ends of the plurality of leads LD on the die pad DP side as similar to the lead frame LF1, the thin part LFhf of the lead LD is sealed with the sealing body MR as similar to the semiconductor device 1B shown in FIG. 37. In this manner, fall of the lead LD from the sealing body MR can be suppressed.

Also, for example, the above-described various modification examples can be combined.

In addition to that, a part of the contents described in the above-described embodiment is described below.

[Note 1]

A semiconductor device having: a semiconductor chip; a chip mounting part having a top surface with the semiconductor chip mounted thereon and a bottom surface which is a surface on an opposite side of the top surface; a plurality of leads each of which is arranged in vicinity of the chip mounting part and is electrically connected to the semiconductor chip; and a sealing body having a first sealing-body top surface, a first sealing-body bottom surface which is a surface on an opposite side of the first sealing-body top surface, and a plurality of side surfaces positioned between the first sealing-body top surface and the first sealing-body bottom surface in a thickness direction of the sealing body, the sealing body sealing the semiconductor chip and a part of each of the plurality of leads. Each of the plurality of leads has: a first lead top surface; a first lead bottom surface which is a surface on an opposite side of the first lead top surface; a second lead bottom surface positioned between the first lead top surface and the first lead bottom surface in a thickness direction; a first lead side surface positioned between the first lead bottom surface and the second lead bottom surface in a thickness direction, and continued to the first lead bottom surface and the second lead bottom surface; and a second lead side surface positioned between the second lead bottom surface and the first lead top surface in a thickness direction, continued to the second lead bottom surface and the first lead top surface, and positioned in an outer side of the first lead side surface. The first lead top surface is covered with the sealing body, the first lead bottom surface is exposed from the first sealing-body bottom surface of the sealing body, the first lead side surface is exposed from the first sealing-body side surface continued to the first sealing-body bottom surface among the plurality of side surfaces of the sealing body and is the same plane with the first sealing-body side surface, and the second lead side surface is exposed from a second sealing-body side surface continued to the first sealing-body top surface among the plurality of side surfaces of the sealing body and positioned in an outer side of the first sealing-body side surface and is the same plane with the second sealing-body side surface. A concave part having a narrower width in a second direction orthogonal to a first direction of extension of each of the plurality of leads than a width of each of the plurality of leads is formed on the first lead bottom surface when viewed from the first lead bottom surface side, and a first end of the concave part reaches the first lead side surface and a second end of the concave part positioned on an opposite side of the first end is terminated inside the first lead bottom surface when viewed from the first lead bottom surface side.

[Note 2]

In the semiconductor device described in the Note 1, a length of the first lead bottom surface in the first direction is longer than a width of the second lead bottom surface in the second direction when viewed from the first lead bottom surface side, and a length of the concave part in the first direction is longer than the width of the concave part in the second direction when viewed from the first lead bottom surface side.

[Note 3]

In the semiconductor device described in the Note 1, the bottom surface of the chip mounting part is exposed from the first sealing-body bottom surface of the sealing body.

[Note 4]

In the semiconductor device described in the Note 1, the sealing body has a second sealing-body bottom surface continued to the first sealing-body side surface and the second sealing-body side surface, the second lead bottom surface of each of the plurality of leads is exposed from the second sealing-body bottom surface of the sealing body and is the same plane with the second sealing-body bottom surface, the semiconductor further has a suspension lead having a first suspension-lead top surface and a first suspension-lead bottom surface which is a surface on an opposite side of the first suspension-lead top surface, the suspension lead coupled to the chip mounting part, a thickness from the first suspension-lead top surface of the suspension lead to the first suspension-lead bottom surface is thinner than a thickness from the first lead top surface of each of the plurality of leads to the first lead bottom surface, the suspension lead is not exposed from the first sealing-body bottom surface of the sealing body and a part of the first suspension-lead bottom surface of the suspension lead is exposed from the second sealing-body bottom surface of the sealing body when viewed from the first sealing-body bottom surface side of the sealing body.

[Note 5]

In the semiconductor device described in the Note 4, in a thickness direction of the chip mounting part, a height of the top surface of the chip mounting part and a height of the first suspension-lead top surface of the suspension lead are the same as each other.

[Note 6]

In the semiconductor device described in the Note 1, a plurality of electrode pads are formed on a surface of the semiconductor chip, and the plurality of electrode pads and the first lead top surfaces of the plurality of leads are electrically connected to each other via a plurality of metal wires, respectively.

[Note 7]

In the semiconductor device described in the Note 6, a second metal film is formed on a part of the first lead top surface of each of the plurality of leads to which the metal wire is connected.

[Note 8]

In the semiconductor device described in the Note 7, the second metal film is made of a metal containing silver as a main component.

SYMBOL EXPLANATION

1, 1A, 1B SEMICONDUCTOR DEVICE
10 INSPECTION APPARATUS (APPEARANCE INSPECTION APPARATUS)
11 LIGHT IRRADIATION UNIT
12 IMAGING UNIT
13 CONTROL UNIT
AN ANODE
AX ROTATING AXIS
BD1, BD2 BLADE (ROTATING BLADE)
BM METAL FILM (PLATING, PLATING FILM)
BW WIRE (ELECTRICALLY-CONDUCTIVE MEMBER)
CBT CAVITY (CONCAVE PART)
CHP SEMICONDUCTOR CHIP
CP CAPILLARY
CPb BACK SURFACE (MAIN SURFACE, BOTTOM SURFACE)
CPs SIDE SURFACE
CPt FRONT SURFACE (MAIN SURFACE, TOP SURFACE)
CT CATHODE
DB DIE-BOND MATERIAL (ADHESIVE MATERIAL)
DL EXTENDING DIRECTION
DP DIE PAD (CHIP MOUNTING PART, TAB)
DPb BOTTOM SURFACE (MOUNTING SURFACE)
DPt TOP SURFACE (CHIP MOUNTING SURFACE)
DT TAPE (DICING TAPE)
DW WIDTH DIRECTION
FbS1, FbS2, FS1, FS2, FS3, FS4, FS5, FS6 SIDE
GP STEP PART
HS HEAT STAGE (LEAD-FRAME HEATING BASE)
JM BONDING MATERIAL
LD, LD1, LD2 LEAD (TERMINAL, EXTERNAL TERMINAL)
LDb BOTTOM SURFACE (MOUNTING SURFACE, LEAD BOTTOM SURFACE)
LDd CONCAVE PART (RECESS, DIMPLE, HOLLOW PART)
LDg BOTTOM SURFACE (STEP SURFACE, INTERMEDIATE SURFACE, LEAD BOTTOM SURFACE)
LDs SIDE SURFACE (LEAD SIDE SURFACE)
LDsg SIDE SURFACE (LEAD SIDE SURFACE, INNER SIDE SURFACE)
LDt TOP SURFACE (WIRE BONDING SURFACE, LEAD TOP SURFACE)
LDtr TRENCH PART (DIMPLE, CONCAVE PART, HOLLOW PART)
LDw, LDw1, LDw2 WALL PART
LF, LF1 LEAD FRAME
LFc DICING REGION (DICING LINE)
LFd, LFd1, LFd2 DEVICE REGION (PRODUCT FORMATION REGION)
LFf OUTER FRAME (FRAME BODY)
LFhF THIN PART (HALF ETCHING PART)
LFtb TIE BAR (COUPLING PART, LEAD COUPLING PART)
LMF RESIN FILM (FILM MATERIAL)
LND LAND (TERMINAL)
LNDa LAND (LEAD CONNECTING TERMINAL)
LNDb LAND (DIE-PAD CONNECTING TERMINAL)
MB MOUNTING SUBSTRATE (MOTHER BOARD, WIRING BOARD)
Mbr1, Mbr2, Mbr3 METAL BURR
MBt TOP SURFACE (MOUNTING SURFACE, ELECTRONIC-DEVICE MOUNTING SURFACE)
MD FORMING MOLD
MD1 UPPER MOLD (MOLD)
MD2 LOWER MOLD (MOLD)
MDc1, MDc2 CLAMP SURFACE (MOLD SURFACE, PRESSURING SURFACE, SURFACE)
MPTf PLATING SOLUTION
MPTt PLATING TANK
MR SEALING BODY (RESIN BODY)
MRb BOTTOM SURFACE (BACK SURFACE, MOUNTING SURFACE, SEALING-BODY BOTTOM SURFACE)

MRg BOTTOM SURFACE (STEP SURFACE, INTERMEDIATE SURFACE)

MRk CORNER PART

MRs SIDE SURFACE (SEALING-BODY SIDE SURFACE)

MRsg SIDE SURFACE (SEALING-BODY SIDE SURFACE)

MRt TOP SURFACE (SEALING-BODY TOP SURFACE)

NZ1 NOZZLE

PD PAD (ELECTRODE, BONDING PAD)

SCM METAL WASTE

SD METAL FILM (PLATING LAYER, SOLDER MATERIAL, SOLDER FILM, PLATING SOLDER FILM)

SP BONDING MATERIAL

SRm INSULATING FILM (SOLDER RESIST FILM)

ST CUTTING PART (CUT TRENCH, STEP PART)

TL A PLURALITY OF SUSPENSION LEADS

TL SUSPENSION LEAD

TL1 SEALED PART

TL2 EXPOSED PART

TLb1, TLb2 BOTTOM SURFACE (SUSPENSION-LEAD BOTTOM SURFACE)

TLs SIDE SURFACE (SUSPENSION-LEAD SIDE SURFACE)

TLsg SIDE SURFACE (SUSPENSION-LEAD SIDE SURFACE)

TLt TOP SURFACE (SUSPENSION-LEAD TOP SURFACE)

WF1 WASH FLUID

The invention claimed is:

1. A method of manufacturing a semiconductor device comprising the steps of:

(a) providing a lead frame including: a first device region having a first chip mounting part having a top surface with a first semiconductor chip mounted thereon and a plurality of leads including a first lead arranged in vicinity of the first chip mounting part; a second device region having a second chip mounting part having a top surface with a second semiconductor chip mounted thereon and a plurality of leads including a second lead arranged in vicinity of the second chip mounting part and coupled to the first lead, the second device region being arranged adjacent to the first device region; and a sealing body collectively sealing the first device region and the second device region, the lead frame having a trench part formed thereon as extending in a first direction so as to communicate with a first lead bottom surface of each of the first lead and the second lead extending in the first direction and having a narrower width in a second direction orthogonal to the first direction than a width of the first lead bottom surface of each of the first lead and the second lead;

(b) forming a cutting part in a coupling part between the first lead and the second lead by cutting a part of the coupling part between the first lead and the second lead from the first lead bottom surface side by using a first blade moving in the second direction;

(c) after the step of (b), removing a metal waste formed inside the trench part;

(d) after the step of (c), forming a first metal film by performing a plating method to an exposed part of the first lead and the second lead including the cutting part from the sealing body; and (e) after the step of (d), separating the first device region and the second device region from each other by cutting a remaining part of the coupling part between the first lead and the second lead from the first lead bottom surface side by using a second blade moving in the second direction and having a narrower width than a width of the first blade, wherein, in the step of (e), the remaining part is cut so that the second blade does not contact a first lead side surface forming the cutting part so as to be continued to the first lead bottom surface of each of the first lead and the second lead.

2. The method of manufacturing the semiconductor device according to claim 1, wherein, in the step of (c), the metal waste is removed by spraying liquid having a higher pressure than an atmospheric pressure from the first lead bottom surface side to the metal waste.

3. The method of manufacturing the semiconductor device according to claim 2, wherein, in the step of (c), the liquid is sprayed from each of a plurality of nozzles while the plurality of nozzles are rotated so that each of distal ends of the plurality of nozzles spirals in a plane parallel to the first lead bottom surface.

4. The method of manufacturing the semiconductor device according to claim 1, wherein the first lead and the second lead are coupled to each other via a lead coupling part extending in the second direction, and the width of the first blade is wider than a width of the lead coupling part in the first direction.

5. The method of manufacturing the semiconductor device according to claim 1, wherein, after the step of (e), each of the first lead and the second lead has a second lead side surface positioned in an outer side of the first lead side surface, and the first metal film is formed on the first lead side surface while the first metal film is not formed on the second lead side surface.

6. The method of manufacturing the semiconductor device according to claim 5, wherein the first lead side surface has a first side and a second side opposed to the first side in the second direction, and, in the step of (b), a first metal burr extending along the second direction is formed on the first side while the first metal burr is not formed on the second side.

7. The method of manufacturing the semiconductor device according to claim 6, wherein the second lead side surface has a third side and a fourth side opposed to the third side in the second direction, in the step of (e), a second metal burr extending along the second direction is formed on the third side while the second metal burr is not formed on the fourth side, and, in the step of (d), a plating process is performed onto the first lead bottom surface, onto the first lead side surface, and to the first metal burr while the plating process is not performed onto the second lead side surface and to the second metal burr.

8. The method of manufacturing the semiconductor device according to claim 1, wherein, in the step of (d), the first metal film is formed by an electrolytic plating method, and the first metal film is made of a metal containing tin as a main component.

9. A semiconductor device comprising:
a semiconductor chip;
a chip mounting part having a top surface with the semiconductor chip mounted thereon and a bottom surface which is a surface on an opposite side of the top surface;
a plurality of leads each of which is arranged in vicinity of the chip mounting part and is electrically connected to the semiconductor chip; and
a sealing body having a first sealing-body top surface, a first sealing-body bottom surface which is a surface on an opposite side of the first sealing-body top surface, and a plurality of side surfaces positioned between the first sealing-body top surface and the first sealing-body bottom surface in a thickness direction, the sealing body sealing the semiconductor chip and a part of each of the plurality of leads,
each of the plurality of leads including:
a first lead top surface;
a first lead bottom surface which is a surface on an opposite side of the first lead top surface;
a second lead bottom surface positioned between the first lead top surface and the first lead bottom surface in a thickness direction;
a first lead side surface positioned between the first lead bottom surface and the second lead bottom surface in a thickness direction, and continued to the first lead bottom surface and the second lead bottom surface; and
a second lead side surface positioned between the second lead bottom surface and the first lead top surface in a thickness direction, continued to the second lead bottom surface and the first lead top surface, and positioned in an outer side of the first lead side surface,
wherein the first lead top surface is covered with the sealing body,
the first lead bottom surface is exposed from a first sealing-body bottom surface of the sealing body,
the first lead side surface is exposed from a first sealing-body side surface continued to the first sealing-body bottom surface among the plurality of side surfaces of the sealing body and is in a same plane with the first sealing-body side surface,
the second lead side surface is exposed from a second sealing-body side surface continued to the first sealing-body top surface among the plurality of side surfaces of the sealing body and positioned in an outer side of the first sealing-body side surface and is in a same plane with the second sealing-body side surface,
when viewed from the first lead bottom surface, a concave part having a narrower width in a second direction orthogonal to a first direction of extension of each of the plurality of leads than a width of each of the plurality of leads is formed on the first lead bottom surface,
when viewed from the first lead bottom surface, a first end of the concave part reaches the first lead side surface and a second end of the concave part positioned on an opposite side of the first end is terminated inside the first lead bottom surface, and
the concave part is not formed on the second lead bottom surface and the second lead side surface.

10. The semiconductor device according to claim 9,
wherein each of the plurality of leads is arranged so as to be next to each other along the second direction,
the first lead side surface of each of the plurality of leads has a first side and a second side opposed to the first side in the second direction, and
a first metal burr extending along the second direction is formed on the first side while the first metal burr is not formed on the second side.

11. The semiconductor device according to claim 10,
wherein the second lead side surface of each of the plurality of leads has a third side and a fourth side opposed to the third side in the second direction,
a second metal burr extending along the second direction is formed on the third side while the second metal burr is not formed on the fourth side, and
a first metal film is formed onto the first lead bottom surface, onto the first lead side surface, onto the second lead bottom surface, and onto the first metal burr while a plating layer is not formed onto the second lead side surface and onto the second metal burr.

12. The semiconductor device according to claim 11,
wherein each of the plurality of leads is made of a metal containing copper as a main component, and
the first metal film is made of a metal mainly containing tin as a main component.

13. The semiconductor device according to claim 9,
wherein, when viewed from the first lead bottom surface side, a length of the second lead bottom surface in the first direction is shorter than a length of the first lead bottom surface in the first direction.

14. The semiconductor device according to claim 13,
wherein, when viewed from the first lead bottom surface side, a length of the concave part in the first direction is longer than a length of a part of the first lead bottom surface in the first direction in which the concave part is not formed.

15. The semiconductor device according to claim 13,
wherein a thickness of a thickest part of the first lead side surface in a thickness direction of each of the plurality of leads is larger than a thickness of the second lead side surface.

16. The semiconductor device according to claim 9,
wherein, when the first lead bottom surface is assumed to be a reference surface, a distance therefrom to a deepest part of the concave part is smaller than a distance therefrom to the second lead bottom surface.

17. The semiconductor device according to claim 9,
wherein each of the plurality of leads is arranged so as to be next to each other along the second direction,
the first lead side surface of each of the plurality of leads has a first side and a second side opposed to the first side in the second direction,
a first metal burr extending along the second direction is formed on the first side while the first metal burr is not formed on the second side,
the second lead bottom surface has a fifth side and a sixth side opposed to the fifth side in the second direction,
the first metal burr extending along the second direction is formed on the fifth side while the first metal burr is not formed on the sixth side, and
the first metal burr formed on the first side of the first lead side surface and the first metal burr formed on the fifth side of the second lead bottom surface are the same as each other in an extending direction.

18. The semiconductor device according to claim 9,
wherein a planar area of the first sealing-body bottom surface of the sealing body is smaller than a planar area of the first sealing-body top surface.

19. The semiconductor device according to claim 9, wherein the sealing body has a second sealing-body bottom surface continued to the first sealing-body side surface and the second sealing-body side surface, and the second lead bottom surface of each of the plurality of leads is exposed from the second sealing-body bottom surface of the sealing body and is in a same plane with the second sealing-body bottom surface.

20. The semiconductor device according to claim 19, wherein a total of a planar area of the first sealing-body bottom surface of the sealing body, a planar area of the second sealing-body bottom surface, and a planar area of the second lead bottom surface of each of the plurality of leads is the same as a planar area of the first sealing-body top surface.

* * * * *